US011554950B2

(12) United States Patent
Schenk et al.

(10) Patent No.: US 11,554,950 B2
(45) Date of Patent: *Jan. 17, 2023

(54) MEMS TRANSDUCER FOR INTERACTING WITH A VOLUME FLOW OF A FLUID, AND METHOD OF PRODUCING SAME

(71) Applicant: Fraunhofer-Gesellschaft zur Förderung der angewandten Forschung e.V., Munich (DE)

(72) Inventors: Harald Schenk, Dresden (DE); Holger Conrad, Dresden (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 456 days.

This patent is subject to a terminal disclaimer.

(21) Appl. No.: 16/658,461

(22) Filed: Oct. 21, 2019

(65) Prior Publication Data

US 2020/0087138 A1 Mar. 19, 2020

Related U.S. Application Data

(63) Continuation of application No. PCT/EP2018/060222, filed on Apr. 20, 2018.

(30) Foreign Application Priority Data

Apr. 21, 2017 (DE) .......................... 102017206766.7

(51) Int. Cl.
*H04R 1/24* (2006.01)
*B81B 3/00* (2006.01)
(Continued)

(52) U.S. Cl.
CPC .......... *B81B 3/0021* (2013.01); *B81B 3/0027* (2013.01); *H04R 1/24* (2013.01);
(Continued)

(58) Field of Classification Search
USPC ........................................... 257/416
See application file for complete search history.

(56) References Cited

U.S. PATENT DOCUMENTS 7,803,281 B2    9/2010  Davies
10,457,544 B2 * 10/2019 Schenk ................... H04R 9/02
(Continued)

FOREIGN PATENT DOCUMENTS

DE    19927970 A1     6/2000
DE    102004063740 A1  7/2005
(Continued)

OTHER PUBLICATIONS

Thorsten S. Albach, Magnetostriktive Mikroaktoren und deren Anwendung als Mikrolautsprecher, Als Dissertation genehmigt von der Technischen Fakultät der Universität Erlangen-Nürnberg., Nov. 27, 2012, pp. 1-164.
(Continued)

*Primary Examiner* — Hrayr A Sayadian
(74) *Attorney, Agent, or Firm* — Novick, Kim & Lee PLLC; Jae Youn Kim

(57) ABSTRACT

A MEMS transducer for interacting with a volume flow of a fluid includes a substrate which includes a layer stack having a plurality of layers which form a plurality of substrate planes, and which includes a cavity within the layer stack. The MEMS transducer includes an electromechanical transducer connected to the substrate within the cavity and including an element which is deformable within at least one plane of movement of the plurality of substrate planes, deformation of the deformable element within the
(Continued)

plane of movement and the volume flow of the fluid being causally correlated. The MEMS transducer includes an electronic circuit arranged within a layer of the layer stack, the electronic circuit being connected to the electromechanical transducer and being configured to provide a conversion between a deformation of the deformable element and an electric signal.

46 Claims, 38 Drawing Sheets

(51) Int. Cl.
*H04R 5/033* (2006.01)
*H04R 7/06* (2006.01)
*H04R 19/00* (2006.01)
*H04R 19/02* (2006.01)

(52) U.S. Cl.
CPC .............. *H04R 5/033* (2013.01); *H04R 7/06* (2013.01); *H04R 19/005* (2013.01); *H04R 19/02* (2013.01); *B81B 2201/0257* (2013.01); *B81B 2201/032* (2013.01); *B81B 2201/036* (2013.01); *B81B 2203/0127* (2013.01); *B81B 2203/0315* (2013.01); *B81B 2207/012* (2013.01); *B81B 2207/07* (2013.01); *H04R 2201/003* (2013.01); *H04R 2420/07* (2013.01)

(56) References Cited

U.S. PATENT DOCUMENTS

| | | | |
|---|---|---|---|
| 2007/0187719 A1 | 8/2007 | Eriksson et al. | |
| 2007/0267723 A1 | 11/2007 | Bernstein et al. | |
| 2010/0087024 A1* | 4/2010 | Hawat | B81B 7/0077 257/E21.705 |
| 2012/0018244 A1 | 1/2012 | Philippe | |
| 2013/0334626 A1 | 12/2013 | Weber | |
| 2014/0169594 A1 | 6/2014 | Ehrenpfordt et al. | |
| 2014/0225275 A1 | 8/2014 | Wataru | |
| 2015/0069537 A1 | 3/2015 | Job et al. | |
| 2015/0311178 A1 | 10/2015 | Shin et al. | |
| 2016/0204050 A1 | 7/2016 | Liu et al. | |
| 2016/0362293 A1 | 12/2016 | Lim et al. | |

FOREIGN PATENT DOCUMENTS

| | | |
|---|---|---|
| DE | 102009039106 A1 | 5/2010 |
| DE | 102010029936 A1 | 12/2011 |
| DE | 102012210052 A1 | 12/2013 |
| DE | 102012223605 A1 | 6/2014 |
| DE | 102015116155 A1 | 4/2016 |
| DE | 102016101863 A1 | 8/2016 |
| DE | 102015210919 A1 | 12/2016 |
| JP | 2012-029290 A | 2/2012 |
| JP | 2014-154800 A | 8/2014 |
| WO | 84/03410 A1 | 8/1984 |
| WO | 2007/042336 A2 | 4/2007 |
| WO | 2013/115270 A1 | 8/2013 |
| WO | 2016/202790 A2 | 12/2016 |

OTHER PUBLICATIONS

Ming-Cheng Cheng et al., A Silicon microspeaker for hearing instruments, Journal of Micromechanics and Microengineering, May 13, 2004, p. 859-866.
Hanseup Kim et al., Bi-directional Electrostatic Microspeaker with Two Large-Deflection Flexible Membranes Actuated by Single/Dual Electrodes, IEEE, 2005, p. 89-92.
Vijay Kumar et al., Design and Validation of Silicon-on-Insulator Based U Shaped Thermal Microactuator, International Journal of Materials, Mechanics and Manufacturing, Feb. 1, 2014, p. 86-91, vol. 2.
Lerch R. et al., Technische Akustik, Springer, 2009, p. 400-403.
F. Neri et al . . . , A Novel Micromachined Loudspeaker Topology, IEEE, 2011, p. 1221-1227.
J.J. Neumann et al., CMOS-MEMS Acoustic Devices, Subito, Feb. 17, 2017, p. 193-224.
Jorg Rehder et al., Magnetic flux generator for balanced membrane loudspeaker, Elsevier.
Robert C. Roberts et al., Electrostatically Driven Touch-Mode Poly-SiC Microspeaker, IEEE, 2007, p. 284-287.
Michel A. Rosa et al., A novel external electrode configuration for the electrostatic actuation of MEMS based devices, Journal of Micromechanics and Microengineering, Jan. 9, 2004, p. 446-451.
Harald Schenk et al., A resonantly excited 2D-micro-scanning-mirror with large deflection, Elsevier, 2004, p. 104-111.
Mamiya Yoshikata, "Office Action for JP Application No. 2019-556966", dated Dec. 23, 2020, JPO, Japan.
Yoo Seok Shim, "Office Action for KR Application No. 10-2019-7034488", dated Oct. 28, 2020, KIPO, Korea.

* cited by examiner

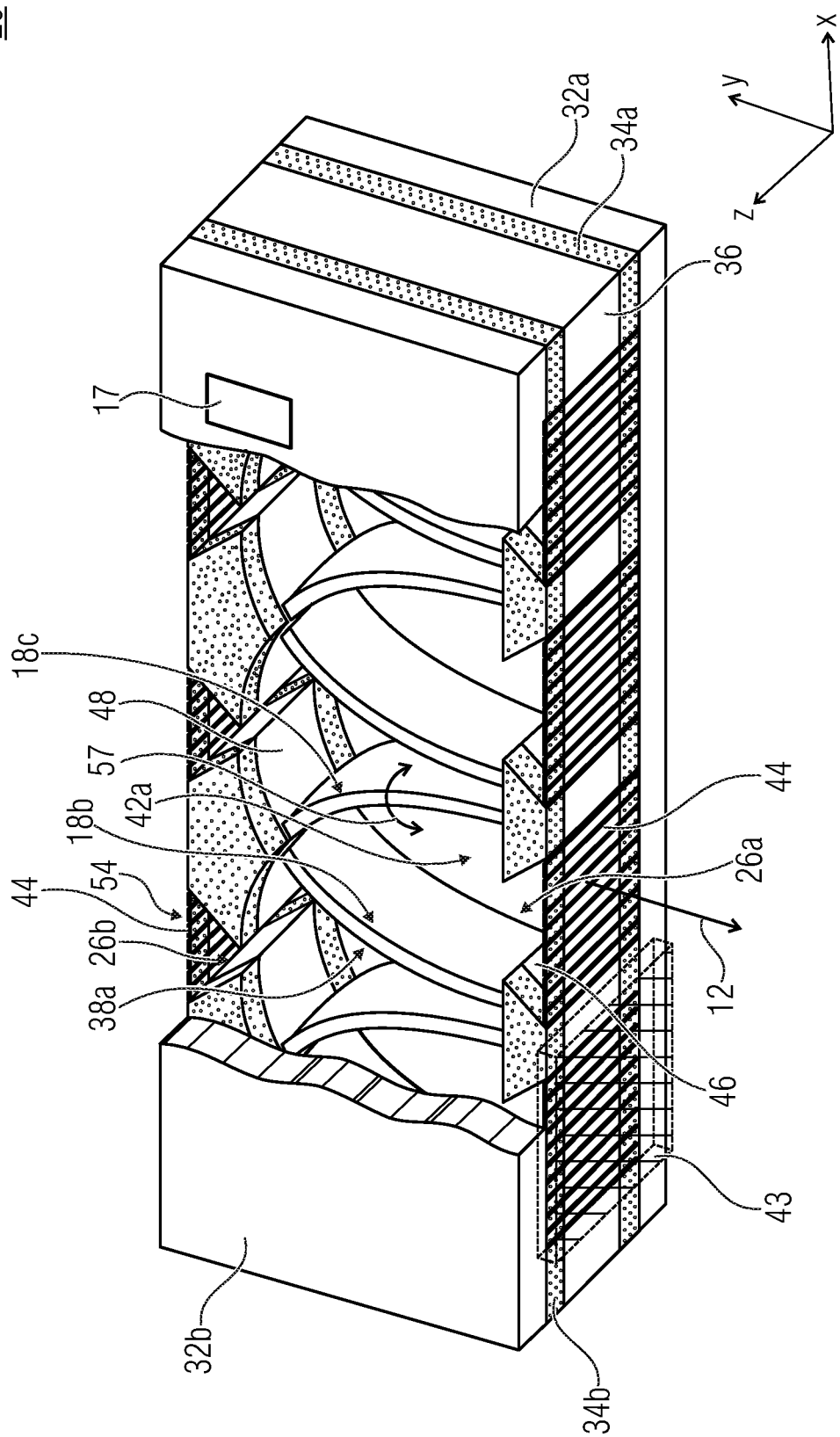

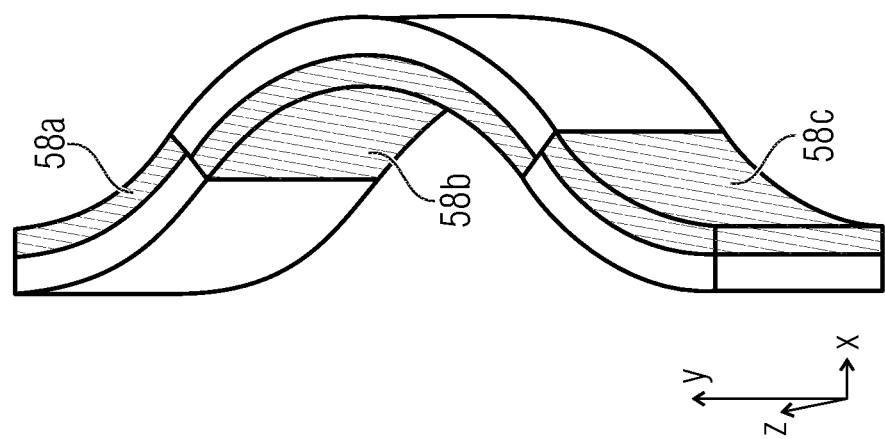
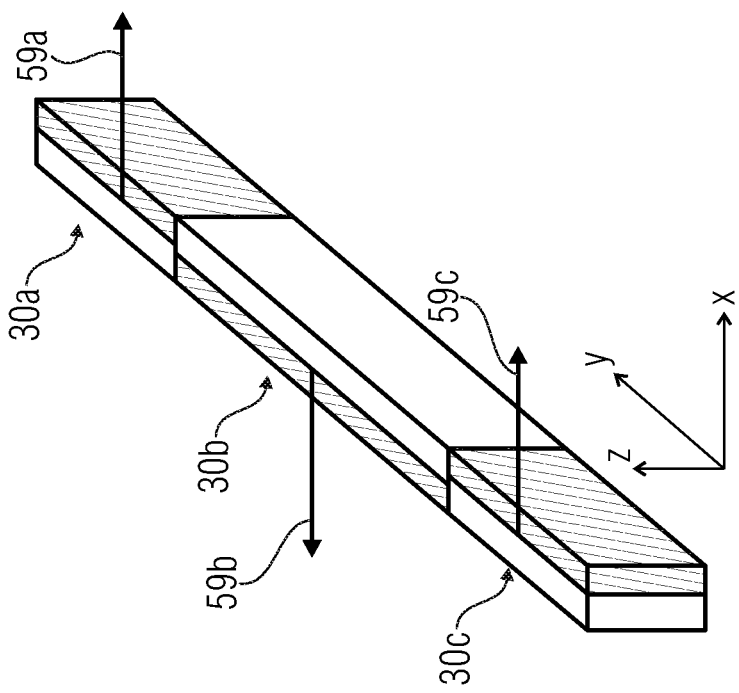
Fig. 4b
Fig. 4a

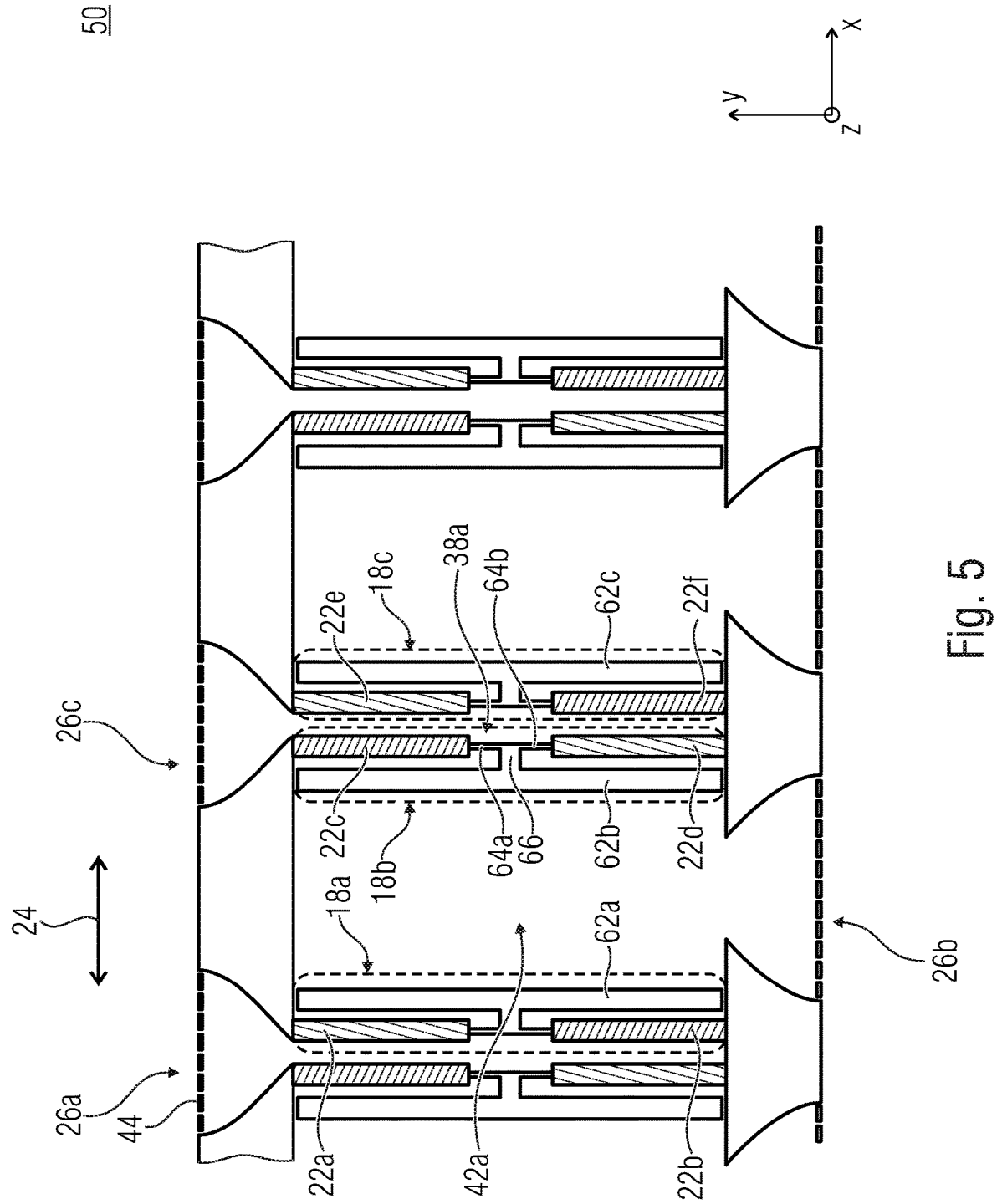

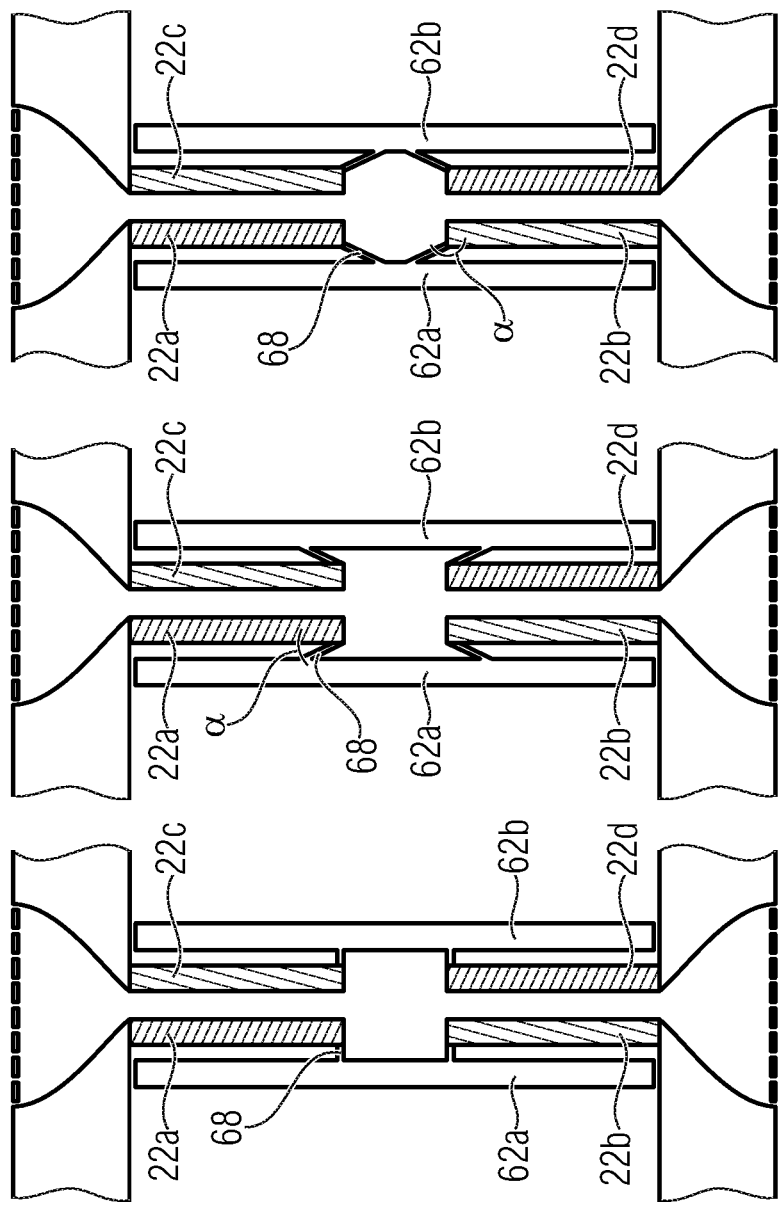

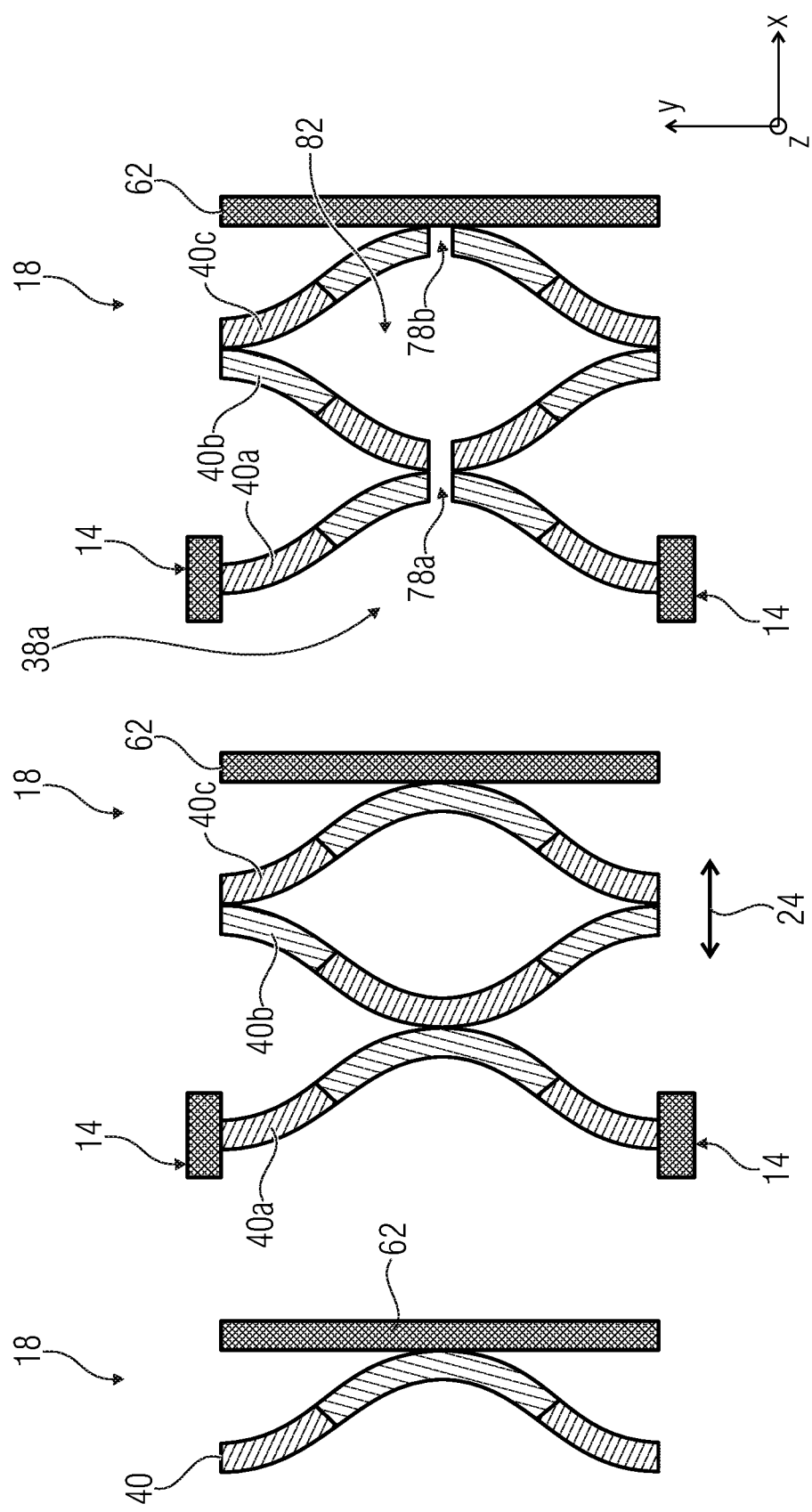

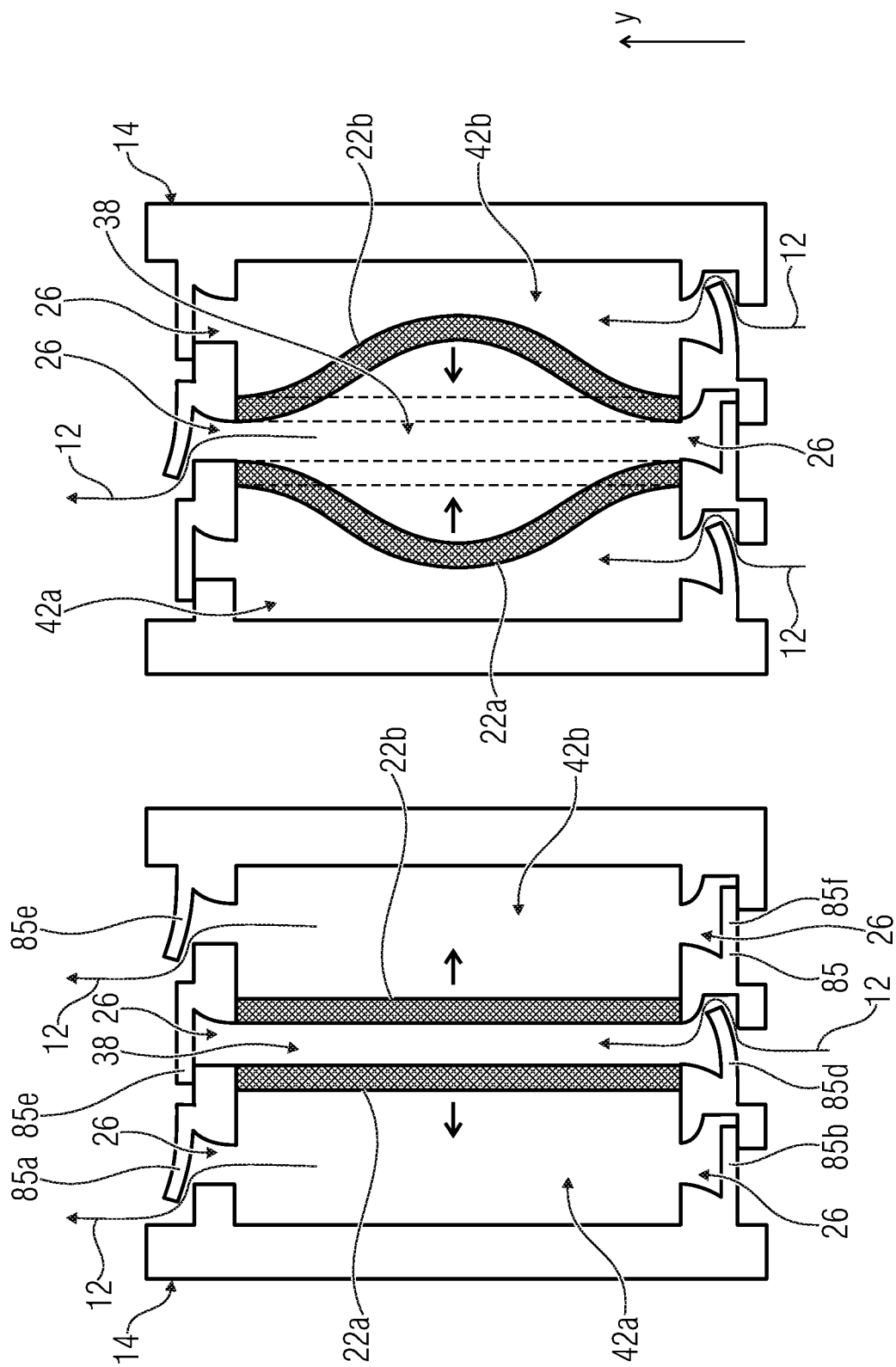

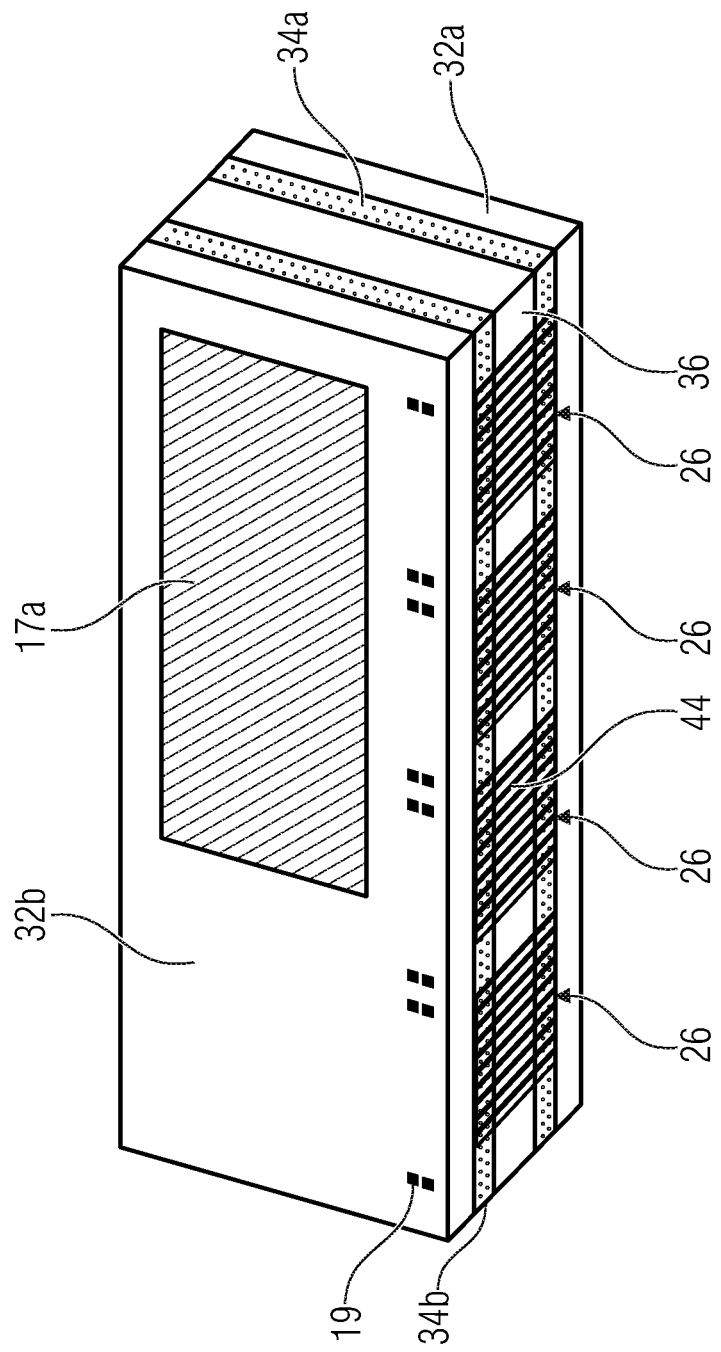

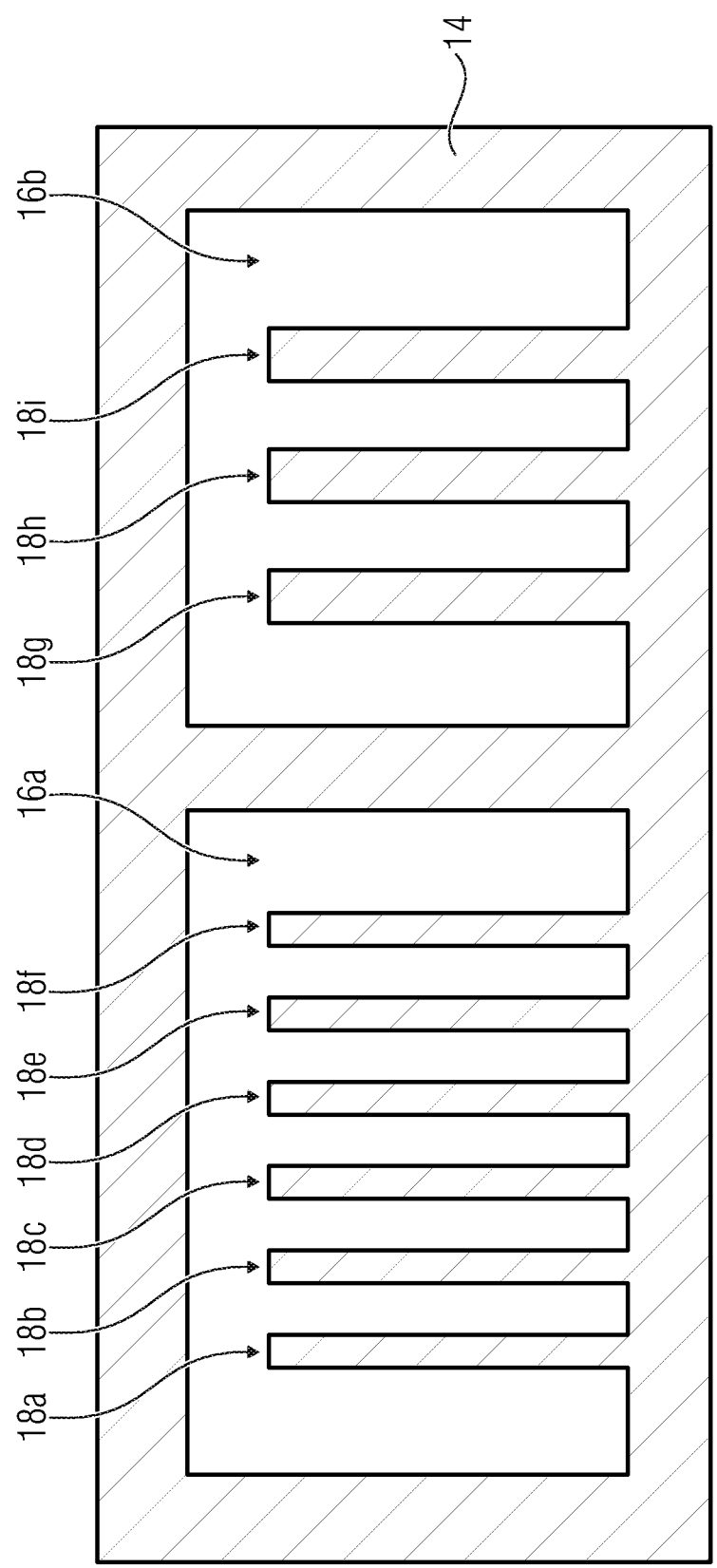

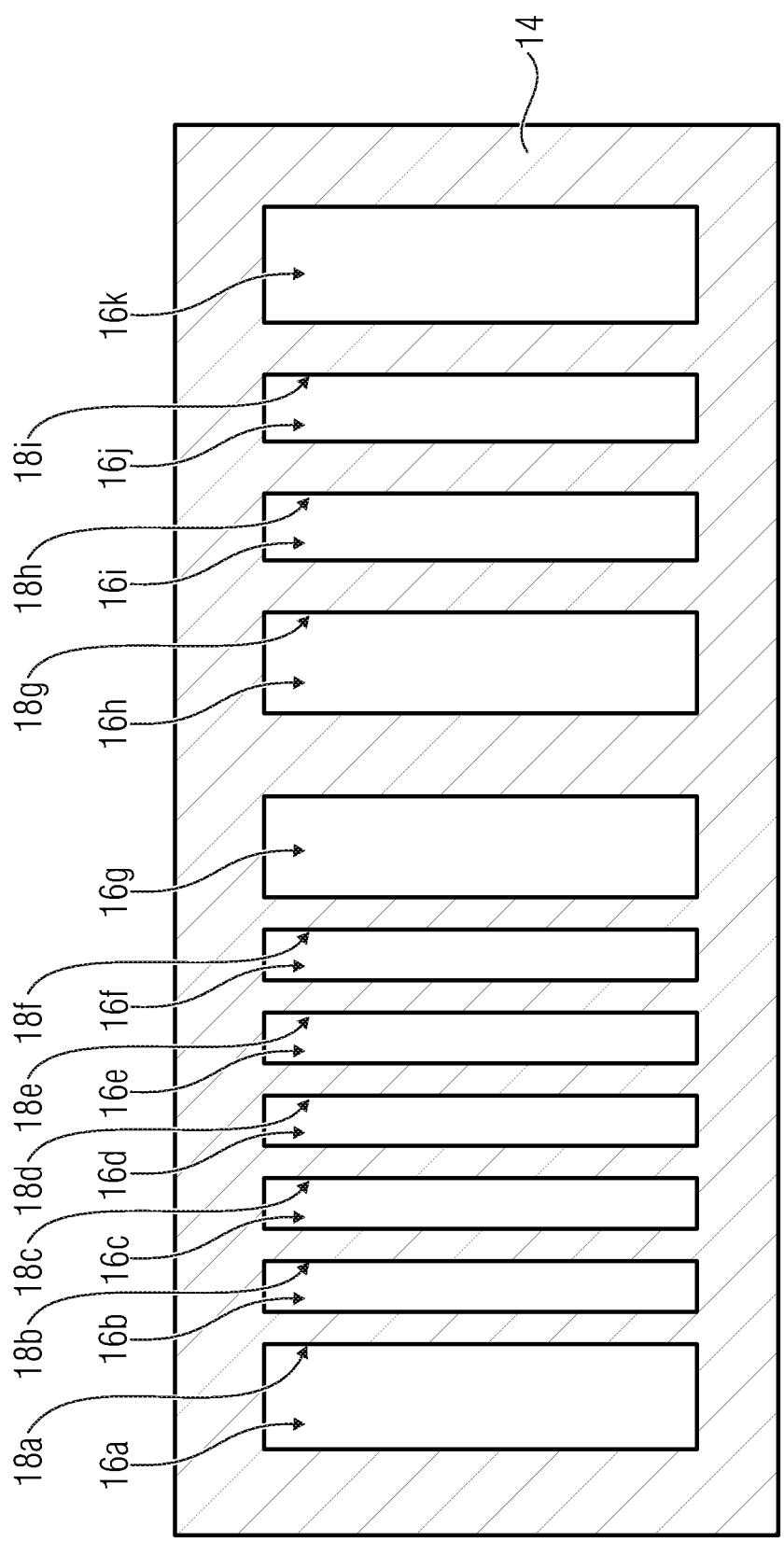

MEMS TRANSDUCER FOR INTERACTING WITH A VOLUME FLOW OF A FLUID, AND METHOD OF PRODUCING SAME

CROSS-REFERENCE TO RELATED APPLICATIONS

This application is a continuation of copending International Application No. PCT/EP2018/060222, filed Apr. 20, 2018, which is incorporated herein by reference in its entirety, and additionally claims priority from German Application No. 102017206766.7, filed Apr. 21, 2017, which is also incorporated herein by reference in its entirety.

The present invention relates to a MEMS transducer for interacting with a volume flow of a fluid, such as a MEMS loudspeaker, a MEMS microphone or a MEMS pump, and, in particular, a MEMS transducer comprising an integrated electronic circuit. The present invention further relates to a device comprising such a MEMS transducer and to a method of producing a MEMS transducer. In addition, the present invention relates to MEMS-CMOS (complementary metal-oxide semiconductor) loudspeaker systems on a chip.

BACKGROUND OF THE INVENTION

In addition to the ability to be miniaturized, one focus of MEMS (microelectromechanical system) technology lies, in particular, in the potential of low-cost producibility of the components with medium and high numbers of pieces. Electroacoustic MEMS loudspeakers currently have been commercialized to an insignificant extent. With few exceptions, MEMS loudspeakers each consist of a membrane which is deflected in a quasi-static or resonant manner by a selected physical principle of action. In a linear or non-linear manner, deflection here depends on the applied electric signal (current or voltage). The signal comprises a temporal variation which is transferred to a temporal variation of the membrane deflection. The reciprocating motion of the membrane is transferred to the surrounding fluid in the form of sound, which fluid may be assumed to be air in the following for the purpose of simplification rather than of restriction.

In some cases, the membrane is actuated in one direction only. The restoring force is then made available by the mechanical spring action upon membrane deflection. In other cases, actuation is effected in both directions, so that the membrane may exhibit a very low level of stiffness.

For actuating the membrane, utilization of electrostatic, piezoelectric, electromagnetic, electrodynamic or magnetostrictive principles of action is described. An overview of MEMS sound transducers based on said principles is found in [1], for example.

Electrostatically operated transducers are based on the force which results between two planar electrodes which have different electric potentials applied thereto. In the simplest case, the arrangement corresponds to a plate capacitor, wherein one of both plates is movably suspended.

For practical implementation, the movable electrode is configured as a membrane so as to avoid an acoustic short circuit. When applying a voltage, the membrane will warp toward the counterelectrode. In a specific embodiment, the membrane is operated in a so-called touch mode. Here, the membrane touches the lower electrode, which has applied a thin insulator layer applied thereto in order to avoid a short circuit, as described in [2], for example. The area of contact is determined by the magnitude of the electric voltage applied and, thus, exhibits a temporal variation that depends on the temporal progress of said voltage. The oscillation which may thus be generated serves to produce sound. In principle, with a classical electrostatic setup, the membrane may be attracted in the direction of the electrode only. The restoring force may be at least partly determined by the stiffness of the membrane and needs to be sufficiently large so as to be able to transmit also the higher frequencies within the audible sound range.

On the other hand, with a given electric voltage, the deflection of the membrane may decrease as the level of stiffness increases. To avoid this problem, an approach has been developed which involves a very soft membrane which may then be controlled by an upper electrode and a lower electrode and thus be deflected in both directions, as described in [3]. This said loudspeaker uses two such membranes in total, which are suspended within a cavity which comprises an inlet and an outlet, as with a micropump, and is otherwise closed.

Piezoelectrically operated transducers make use of the inverse piezoelectric effect. An electric voltage applied results in mechanical stress within a solid. In MEMS technology, materials such as PZT (lead zirconium titanate), AlN (aluminum nitride), or ZnO (zinc oxide) are typically used. Said materials are typically applied onto a membrane as a functional layer and patterned such that the membrane may be deflected and/or caused to vibrate as a function of the electric voltage applied to the functional layer. What is disadvantageous about piezoelectric functional layers is the fact that operation cannot be effected in a manner that is free from hysteresis. In addition, integration of the ceramic functional layers is complex and, due to the lack of CMOS (complementary metal-oxide semiconductor) compatibility in case of PZT and ZnO, is possible only under strict contamination control or even in a separate clean-room environment.

Electromagnetically operated transducers are based on the action of force experienced by a soft-magnetic material in a non-stationary magnetic field (gradient). For putting the principle into practice, what is needed in addition to the soft-magnetic material is a permanent magnet and a coil by means of which the positional gradient of the magnetic field may be time-controlled via flow of current. The soft-magnetic material is integrated into the membrane, for example. All other components are made available in the assembly, as described in [4], for example. The setup is bulky, complex, and does not seem to be reasonably scalable for large numbers of pieces.

Electrodynamically operated transducers use Lorentz force. Said method, which is widely spread with macroscopic loudspeakers, has also been employed with some MEMS loudspeakers. The magnetic field is generated by a permanent magnet. A coil through which current flows is placed within the magnetic field. Typically, the coil is integrated into the membrane by depositing and patterning of a metal layer, and the permanent magnet is added as an external component in the assembly. The complexity and the restrictions regarding integration of all components in MEMS technology represent a similarly large disadvantage as with electromagnetically operated transducers.

Magnetostrictively operated transducers are based on contraction or expansion of a functional layer with a magnetic field being applied. For example, vanadium permadur is positively magnetostrictive, i.e. exhibits expansion with a magnetic field applied. Said contraction may be used, with a suitable setup, for generating membrane vibration. In [1], vanadium permendur ($Fe_{49}Co_{49}V_2$), which was deposited onto $SiO_2$ (silicon dioxide) via a chromium adhesive layer, was used as the magnetostrictive functional layer. The external magnetic field is made available via a micro pancake coil which was implemented by means of electrodeposited copper. In terms of complexity and restrictions in integration, the disadvantages found are similar to those of the two above-mentioned principles of action.

The above-described classical and most widespread variants, which share the feature of using a membrane which may be caused to vibrate, will be supplemented below by specific modifications which have been examined because of specific disadvantages of the classical membrane principle.

Flexible membranes may also comprise higher modes within the audible sound range and may thus result in parasitic vibrations, which will reduce acoustic quality (harmonic distortion), cf. [1]. To avoid or reduce said effect, plates are therefore used which have a clearly higher level of stiffness. Such a plate is connected to the chip via a very soft suspension which is also to avoid acoustic short circuit, see [5].

A further modification is constituted by a segmented membrane which has been employed with the above-described magnetostrictive transducers. This corresponds to a specific topographic solution to the problem consisting in that the functional layer contracts or expands in two directions. Specifically, the setup consists of several deflectable bending beams. In accordance with [1], the arrangement may be regarded as being acoustically closed for distances of the beams of less than or equal to 3 µm. By dimensioning the individual beams accordingly in terms of resonant frequency and distances between the beams, a comparatively high acoustic bandwidth may be achieved, and the progress of the sound level as a function of the vibration frequency may be adapted, or optimized.

In [6], Neumann et al. follow the approach of using a multitude of small partial membranes instead of one single large membrane. Each partial membrane has a resonant frequency high enough so that quasi-static deflection may occur within the audible sound range. Thus, in particular, digital operation of the loudspeaker is enabled.

In summary, one may conclude that in terms of integration, known electrostatically operated membrane loudspeakers comprise comparatively small deflections, provided that drive voltages are moderate. For example, the electrostatic membrane loudspeaker by Kim et al. in accordance with [3] may serve as a reference. Each of the two membranes has an area of 2×2 mm². The upper and lower electrodes, respectively, are mounted at a distance of 7.5 µm in each case. Depending on the geometry of the membrane and the increase in the stiffness of the membrane as the deflection increases, the deflection is typically limited to ⅓ to ½ of the electrode distance due to the so-called pull-in effect. If the higher value of ½ is assumed, what results for the deflection is 7.5 µm/2, namely both in one direction and in the other direction. The displaced volume may be estimated by assuming that it will correspond to the volume of a deflected stiff plate having a deflection of half the maximum deflection of the membrane. For example, what results is:

$$\Delta V = (2 \times 2 \text{ mm}^2) \times 50\% \ast (2 \times 7.5 \text{ µm})/2 = 15 \times 10^{-3} \text{ mm}^3 \quad \text{(eq. 1)}$$

and/or $$\Delta V/\text{active area} = \Delta V/A = \Delta V/4 \text{ mm}^2 = 3.75 \times 10^{-3} \text{ mm} \quad \text{(eq. 2)}$$

A general problem in producing miniaturized membrane loudspeakers consists in achieving a flat progress of the sound pressure as a function of the frequency. The achievable sound pressure is proportional to the radiation impedance and the speed of the membrane. From a macroscopic point of view, the membrane diameter is comparable to the acoustic wavelength. What is true here is that the radiation impedance is proportional to the frequency, cf. [6]. High-quality loudspeakers are frequently designed such that the resonance $f_0$ is below the audible sound range (for multipath loudspeakers, the respective resonant frequency is below the lower edge frequency of the corresponding electric filter). For $f \gg f_0$, the speed of the membrane thus is proportional to $1/f$. In total, what results for the frequency dependence of the sound pressure p is the expression $p \propto 1$. Therefore, with said (simplified) consideration, a completely flat progress of the sound pressure results.

As soon as the diameter of the sound source/membrane is much smaller than the sound wavelength to be generated, one may assume that the radiation impedance exhibits a quadratic dependence on the frequency, as described in [7]. This is given for MEMS loudspeakers having membranes of the order of magnitude of millimeters. If $f \gg f_0$ is assumed as above, the dependence $p \propto f$ will result for the progress of the sound pressure. Low frequencies are reproduced with too low a sound pressure in relation to the high frequencies. In quasi-static operation, the membrane speed is proportional to f. What then results for the progress of the sound pressure is the dependence $p\ f^3$, which is even less favorable for low frequencies.

Miniaturized multifunctional systems for the interaction between human and computer, or human and machine, are available at different integration levels.

Level 1: Hybrid Integration of Printed Circuit Boards

Sensors, actuators and electronic circuits produced on different substrates are combined on a shared wiring support (here: printed circuit board).

Level 2: System-in-a-Package

At least two chips are combined, within a specific housing, to form a system. Sometimes, chip-on-chip bondings are also used for this purpose. One often uses also silicon-based wiring supports (so-called "interposer technologies").

Level 3: Wafer-Level Hybrid Integration and Monolithic Integration

Sensors, actuators and electronic circuits which were partly produced on different wafers are connected to one another at the wafer level. The individual chips of the bonded wafer stack are removed from the stack by means of corresponding dicing processes. With monolithic integration, sensors, actuators and electronic circuits are implemented on a wafer. In both cases, electric connection of the elements is implemented by means of integrated conductor lines or chip through-connections ("through-silicon vias", TSV for short).

One example of a highly advanced hybrid-integrated sensor/actuator system (level 1) are so-called hearables. The following components are already accommodated today in the form of an in-ear headphone: loudspeakers (produced by means of precision mechanical work), rechargeable battery, memory chip, CPU, red and infrared sensors, temperature sensors, optical touch sensor, microphones, 3-axes acceleration sensor, 3-axes magnetic field sensor and 3-axes position sensor. Such a "system-in-a-package" approach is nowadays employed for hearables by companies such as Bragi ("The Dash"), Samsung, Motorola and Sony, for example.

An example of a highly advanced system-in-a-package sensor system (level 2) are so-called 9-axes sensors. Here, e.g., a 3-axes acceleration sensor and a 3-axes position sensor are implemented on one silicon chip, a 3-axes magnetic field sensor is implemented on a second silicon chip, and an electronic circuit is implemented on a third chip, and said chips are accommodated within a shared package. A supplier of such a system is InvenSense (MPU-9150), for example.

Examples of monolithically integrated sensor systems are one- or multi-axes gyroscopes, or acceleration sensors, pressure sensors, and magnetic field sensors, wherein the sensor elements and electronic functions are implemented in a single chip, respectively.

In terms of structural size, monolithic integration offers major advantages. While in the event of hybrid integration of printed circuit boards, a separate housing is needed for each structural element, and while with system-in-a-package a comparatively large housing is needed, especially when several individual chips are combined, said additional requirement in terms of space is dispensed with in monolithic integration. In addition, manufacturing costs decrease significantly specifically with large numbers of pieces since the complex, hybrid setup techniques are dispensed with.

In the case, which is addressed here, of miniaturized sound-generating (micro-loudspeakers) or sound-sensing (microphone) MEMS components, monolithic integration comprising circuits or other actuator- or sensor-related elements nowadays is highly restricted. The reason for this are the modes of operation of the MEMS microphones or loudspeakers, for one thing. In both cases, a comparatively large membrane is needed which is formed in the chip surface. The chip surface on the top side and the bottom side is needed largely for the air flow which arises during the movement of the membrane. Thus, there is no significant amount of chip surface area available for integrating further functionalities. An enlargement, which is basically possible, of the chip surface conflicts, above all, with a yield which disproportionately decreases with the chip surface area. For another thing, the manufacturing processes are frequently not directly compatible with the manufacturing processes of the CMOS circuit, which increases the level of complexity of the overall process. For said two reasons, therefore, further functionalities are nowadays implemented, with the acoustic components, on one or more separate chips, and the overall system is merged via hybrid integration/system-in-a-package.

At the same time, there is a need to keep the installation space MEMS transducers to a minimum so as to enable utilization in portable devices, such as headphones and, in particular, so-called in-ear headphones.

What would therefore be desirable is a concept of improved MEMS transducers having a high level of efficiency while entailing little installation space.

SUMMARY

According to an embodiment, a MEMS transducer for interacting with a volume flow of a fluid may have: a substrate which comprises a layer stack having a plurality of layers which form a plurality of substrate planes, and which comprises a cavity within the layer stack; an electromechanical transducer connected to the substrate within the cavity and comprising an element which is deformable within at least one plane of movement of the plurality of substrate planes, deformation of the deformable element within the plane of movement and the volume flow of the fluid being causally correlated; an electronic circuit arranged within at least one layer of the layer stack, the electronic circuit being connected to the electromechanical transducer and being configured to provide a conversion between a deformation of the deformable element and an electric signal.

Another embodiment may have a device including an inventive MEMS transducer, wherein the MEMS transducer is configured as a MEMS loudspeaker, the device being configured as a mobile music reproduction device or as headphones.

Another embodiment may have a system comprising an inventive MEMS transducer, wherein the MEMS transducer is configured as a loudspeaker and is designed to reproduce an acoustic signal on the basis of an output signal.

According to another embodiment, a semiconductor layer may have, at a first layer main side, a first electronic pattern having the first distance raster, and may have, at a second, oppositely located layer main side, a second electronic pattern having a second differing distance raster, the first and second electronic patterns being electrically connected to each other.

According to another embodiment, a MEMS layer stack including layers stacked by bonding methods may have an inventive semiconductor layer and may have a circuit layer which has an electronic circuit including a first distance raster; wherein the electronic circuit is connected to the first electronic structure, so that the electronic circuit may be contacted via the second layer main side.

According to another embodiment, a health assistance system may have: a sensor means for sensing a vital function of a body and for outputting a sensor signal on the basis of the sensed vital function; processing means for processing the sensor signal and for providing an output signal on the basis of said processing; and headphones including an inventive MEMS transducer, the MEMS transducer being configured as a loudspeaker and including a wireless communication interface for receiving the output signal, and being configured to reproduce an acoustic signal on the basis thereof.

According to another embodiment, a method of providing a MEMS transducer for interacting with a volume flow of a fluid may have the steps of: providing a substrate which comprises a layer stack having a plurality of layers which form a plurality of substrate planes; producing a cavity in the layer stack an an electromechanical transducer within the substrate, so that the former is connected to the substrate within the cavity and comprises an element which is deformable within at least one plane of movement of the plurality of substrate planes, deformation of the deformable element within the plane of movement and the volume flow of the fluid being causally correlated; wherein an electronic circuit is arranged within at least one layer of the layer stack, so that the electronic circuit is connected to the electromechanical transducer and is configured to provide a conversion between a deformation of the deformable element and an electric signal.

According to another embodiment, a method of providing a semiconductor layer may have the steps of: arranging a first electronic pattern at a first layer main side of the semiconductor layer, so that the first electronic structure comprises a first distance raster; arranging a second electronic pattern at a second, oppositely located layer main side of the semiconductor layer, so that same comprises a second distance raster; and connecting the first and second electronic patterns to each other.

The core idea of the present invention consists in having recognized that the above object may be achieved in that a volume flow of a fluid may be influenced in a particularly efficient manner by means of an element which is deformable within a movement plane (in-plane) and/or in that the volume flow may deflect such an element in a particularly efficient manner. This enables large surface areas of the deformable element, which surface areas may interact with the volume flow, with simultaneously small dimensions of a chip surface, so that in total, an efficient MEMS transducer device having a high level of efficiency is obtained. In addition, one has recognized that integration of an electronic circuit for operating the MEMS into a layer of the layer stack will render such semiconductor surfaces which are otherwise unused useful for the electronic circuit, which results in that the device needs little installation space.

In accordance with an embodiment, a MEMS transducer for interacting with a volume flow of a fluid includes a substrate which comprises a layer stack having a plurality of layers. The substrate comprises a cavity within the layer stack. The layers form a plurality of substrate planes. The MEMS transducer includes an electromechanical transducer connected to the substrate within the cavity and comprising an element which is deformable within at least one plane of movement of the plurality of substrate planes. Deformation of the deformable element within the plane of movement and the volume flow of the fluid are causally correlated. The MEMS transducer further includes an electronic circuit arranged within a layer of the layer stack. The electronic circuit is connected to the electromechanical transducer and is configured to provide a conversion between a deformation of the deformable element and an electric signal.

In accordance with a further embodiment, a device includes a described MEMS transducer which is configured as a MEMS loudspeaker, the device being configured as a mobile music reproduction device or as headphones.

In accordance with a further embodiment, a health assistance system includes a sensor means for sensing a vital function of a body and for outputting a sensor signal on the basis of the sensed vital function. The health assistance system includes processing means for processing the sensor signal and for providing an output signal on the basis of said processing, and includes headphones including a described MEMS transducer. The MEMS transducer is configured as a loudspeaker and includes a wireless communication interface for receiving the output signal, and is configured to reproduce an acoustic signal on the basis thereof.

In accordance with a further embodiment, a method of providing a MEMS transducer for interacting with a volume flow of a fluid includes providing a substrate which comprises a layer stack having a plurality of layers which form a plurality of substrate planes, and which comprises a cavity within the layer stack. The method includes producing an electromechanical transducer within the substrate, so that the former is connected to the substrate within the cavity and comprises an element which is deformable within at least one plane of movement of the plurality of substrate planes, deformation of the deformable element within the plane of movement and the volume flow of the fluid being causally correlated. The method further includes arranging an electronic circuit within a layer of the layer stack, so that the electronic circuit is connected to the electromechanical transducer and is configured to provide a conversion between a deformation of the deformable element and an electric signal.

BRIEF DESCRIPTION OF THE DRAWINGS

Embodiments of the present invention will be detailed subsequently referring to the appended drawings, in which:

FIG. 2c shows a schematic perspective view of the MEMS transducer of FIG. 2a wherein the electromechanical transducers each exhibit a deformed state of a deformable element, in accordance with an embodiment;

FIG. 4a shows a schematic perspective view of a deformable element, which comprises three bimorph structures, in accordance with an embodiment;

FIG. 4b shows a schematic perspective view of the deformable element in accordance with FIG. 4a in a deflected state in accordance with an embodiment;

FIG. 5 shows a schematic top view of a MEMS transducer, wherein the electromechanical transducers each comprise a configuration that is modified as compared to that of the MEMS transducer of FIG. 2a, in accordance with an embodiment;

FIG. 6a shows a schematic top view of an electromechanical transducer, wherein spring elements formed in a straight line are arranged between plate elements and deformable elements, in accordance with an embodiment;

FIG. 6b shows a schematic top view of an electromechanical transducer, wherein spring elements are arranged at an angle of less than 90° in relation to deflectable ends of the deformable elements, in accordance with an embodiment;

FIG. 6c shows a schematic top view of an electromechanical transducer, wherein the spring elements are arranged at an angle of more than 90°, in accordance with an embodiment;

FIG. 7a shows a schematic top view of a deformable element connected to the plate element, in accordance with an embodiment;

FIG. 7b shows a schematic top view of a configuration, wherein the deformable element is fixedly clamped and formed between the substrate, in accordance with an embodiment;

FIG. 7c shows a schematic top view of a configuration of the electromechanical transducer, wherein the deformable elements comprise recesses in a central region, in accordance with an embodiment;

FIG. 12a shows a schematic top view of a section of a MEMS transducer which may be used as a MEMS pump, for example, in a first state;

FIG. 12b shows the MEMS transducer of FIG. 12a in a second state;

FIG. 17c shows a schematic perspective view of the MEMS transducer in accordance with the view of FIG. 17a, wherein, in accordance with a further embodiment, openings are designed such that grid webs are arranged;

FIG. 23 shows a schematic top view of a MEMS transducer in accordance with an embodiment, which comprises a multitude of electromechanical transducers comprising beam elements clamped on one side; and FIG. 24 shows a schematic top view of a MEMS transducer in accordance with an embodiment, which comprises a multitude of electromechanical transducers comprising beam elements clamped on two sides.

DETAILED DESCRIPTION OF THE INVENTION

Figure 1:
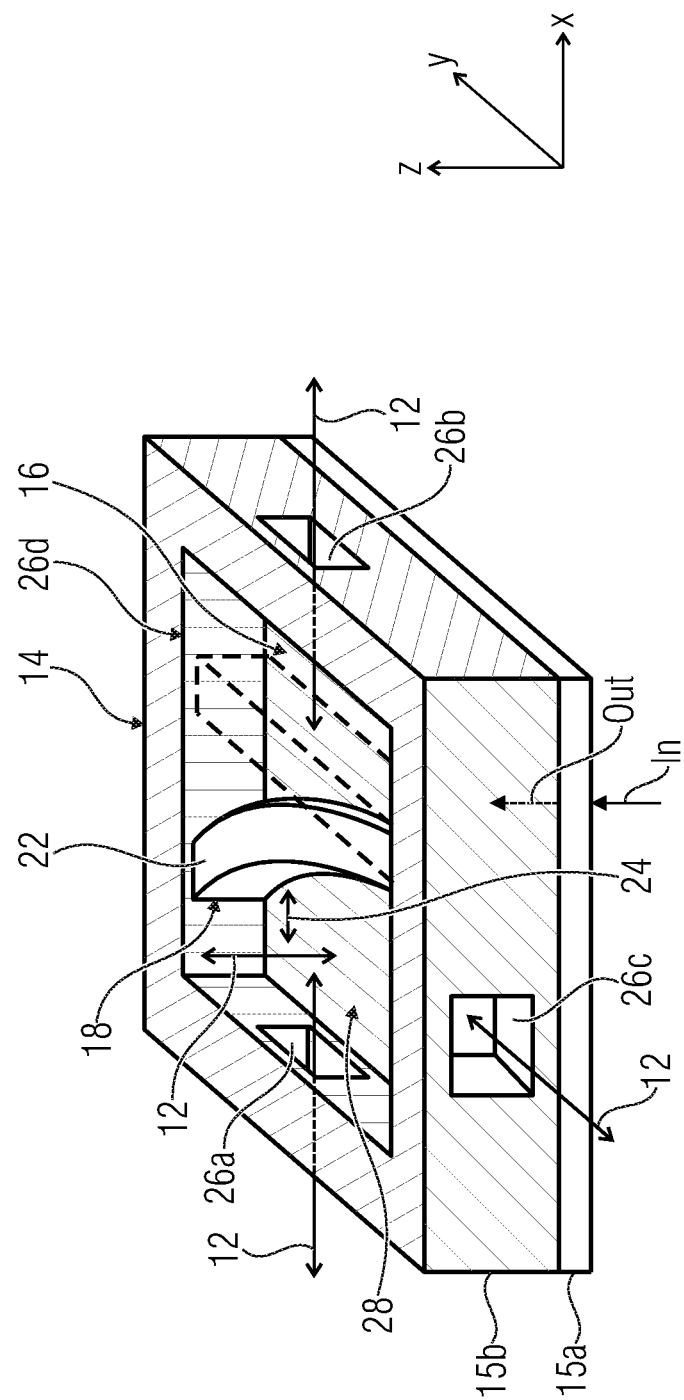
FIG. 1 shows a schematic perspective view of a MEMS transducer in accordance with an embodiment.

Before embodiments of the present invention will be explained in detail below by means of the drawings, it shall be noted that elements, objects and/or structures which are identical or equal in function or in action are provided with identical reference numerals in the various figures, so that the descriptions of said elements which are given in the different embodiments are mutually exchangeable and/or mutually applicable.

Reference shall be made to MEMS (microelectromechanical system) transducers below. A MEMS transducer may comprise one or more electroactive components which cause a change in a mechanical component on the basis of an applied electrical quantity (current, voltage, charge or the like). Said change may relate to, e.g., a deformation, a temperature rise or generation of tension in the mechanical component. Alternatively or additionally, a mechanical influence exerted on the component, such as a deformation, temperature rise or generation of tension, may result in an electrical signal or an electrical information (voltage, current, charge or the like) which may be detected at electric terminals of the component. Some materials or components exhibit reciprocity, which means that the effects are mutually exchangeable. For example, piezomaterials may have the inverse piezoelectric effect (deformation based on an electrical signal applied) and the piezoelectric effect (provision of an electrical charge on the basis of a deformation).

Some of the embodiments described below relate to fully integrated and highly miniaturized systems for human/computer, or human/machine, interface applications and interactions including applications in the field of "personal assistants". The acoustic interface here is in the focus of attention. The embodiments relate to integration of MEMS and CMOS.

Some of the embodiments described below relate to the fact that a deformable element of an electromechanical transducer is configured to interact with a volume flow of a fluid. An interaction may include, e.g., deformation of the deformable element, which is caused by an electric control signal which results in a movement, displacement, compression or decompression of the fluid. Alternatively or additionally, the volume flow of the fluid may deform the deformable element, so that on the basis of the interaction between the volume flow and the deformable element, a presence, a characteristic (pressure, velocity of flow or the like) or some other information regarding the fluid (e.g. a temperature) may be obtained. This means that deformation of the deformable element along the lateral direction of movement and the volume flow of the fluid have a causal relation. For example, MEMS may be produced in silicon technology. The electromechanical transducer may include the deformable element and further elements such as electrodes and/or electric terminals, for example. The deformable element may be configured to deform (macroscopically) along a lateral direction of movement, i.e. an element or a region may be movable along the lateral direction of movement. Said element or region may be a beam end or a central region of a beam structure, for example. From a microscopic point of view, deformation of the deformable element along the lateral direction of movement may incur deformation of the deformable element which is perpendicular to the lateral direction of movement. Embodiments described below relate to the macroscopic point of view.

Embodiments may provide miniaturized loudspeakers, microphones and/or pumps which are made in silicon and which are able to generate, in relation to their respective design sizes, as high a sound level as possible, as high a level of sensitivity as possible and/or as high a fluid flow rate as possible. Other embodiments may provide a MEMS transducer, a MEMS valve and/or a MEMS dosage system.

Embodiments of the present invention may be used for producing airborne sound, in particular within the audible sound range. Thus, embodiments relate to loudspeakers, in particular miniaturized loudspeakers, e.g. for hearing aids, headphones including in-ear headphones, headsets, mobile phones or the like. The mutual causal relation between the volume flow and the deformation of the deformable element enables application in loudspeakers as well. Embodiments thus relate to electroacoustic transducers.

Embodiments enable providing a multifunctional system which is miniaturized to as large an extent as possible and which may be used in human/computer and/or human/machine interaction and may be produced at low cost in bulk production. The core functionalities, which is to be supplemented by further functions, is in the field of sound generation and/or sound sensing.

FIG. 1 shows a schematic perspective view of parts of a MEMS transducer 10 in accordance with an embodiment. The MEMS transducer 10 is configured to interact with a volume flow 12 of a fluid. The fluid may be a gas (e.g. air) and/or a liquid. For example, the liquid may be a medicinal solution, a medicine, a chemical for a technical process or the like.

The MEMS transducer 10 comprises a substrate 14. The substrate 14 may comprise any material. For example, the substrate 14 may include a wooden material, a metal material and/or a semiconductor material such as a silicon material. The substrate 14 includes a cavity 16. The cavity 16 may be understood to be a recess or to be an at least partly enclosed volume of the substrate 14, for example. The cavity 16 may have arranged therein, at least in parts thereof, the fluid of the volume flow 12. The substrate 14 includes at least one material layer, e.g. a one-piece layer comprising the cavity 16, as may be obtained, e.g., by milling or etching it out from a material, and/or when the cavity 16 is omitted during production of the substrate 14, so that the substrate 14 is produced around the cavity 16. The substrate 14 may also comprise several layers 15a and 15b, which may be advantageous in semiconductor production, for example. Different patterns, e.g. the presence and the absence of the cavity 16, may be implemented in various layers of the substrate 14. Alternatively, the substrate may also have a larger number of layers, as will be explained below.

The MEMS transducer 10 includes an electromechanical transducer 18. The electromechanical transducer 18 is connected to the substrate 14. The electromechanical transducer 18 includes a deformable element 22 which may be deformed along a lateral direction of movement 24. For example, application of an electrical signal to the electromechanical transducer 18 may result in deformation of the deformable element 22 along the lateral direction of movement 24. Alternatively or additionally, the volume flow 12, when impinging on the deformable element 22, may result in that the deformable element 22 undergoes the deformation, so that an electric signal, which is based on the volume flow 12, may be obtained by the electromechanical transducer 18. This means that deformation of the deformable element 22 and the volume flow 12 have a causal relation. For example, the electromechanical transducer 18 may include or consist of at least one, e.g. two, piezoelectric layers. Both layers may be deformed by means of electric voltage. The electromechanical transducer may include further elements, for example electrodes.

The MEMS transducer 10 includes a non-depicted electronic circuit arranged in at least one of the layers 15a or 15b of the layer stack. The non-depicted electronic circuit is connected to the electromechanical transducer 18 and is configured to provide a conversion between a deformation of the deformable element 22 and an electric signal. This means that the non-depicted electronic circuit may be used, depending on the implementation of the MEMS transducer, for sensor-related and/or actuator-related control of the MEMS transducer 10. Arranging the electronic circuit in a lid layer of the substrate 14, e.g. within the layer 15a, may enable utilizing a large surface area of the lid layer for the electronic area, which enables corresponding savings in terms of chip surface area and/or installation space in other components, e.g. printed circuit boards, which have the MEMS transducer 10 mounted thereon. Arranging at least parts of the electronic circuit in a lid surface of the layer stack may further facilitate the advantage that simple contacting of the MEMS transducer with other electronic components is enabled.

The term "conversion" here is to be understood as a translation from an input variable to an output variable. The electronic circuit may be configured to convert an electric control signal to deflection of one or more deformable elements, i.e. to perform actuator-related control, and/or to convert deformation of one or more deformable elements to an electric output signal, i.e. to perform sensor-related evaluation or control. For conversion, the electronic circuit may include at least one of a digital-to-analog converter for converting a digital version of the control signal to an analog version of the control signal and an analog-to-digital converter for converting an analog version of the electric output signal to a digital version of the electric output signal. In simplified terms, the electronic circuit 17 may obtain the control signal in an analog or digital form and may convert it to an analog or digital signal Out that is suitable for the MEMS transducer 10. For example, the electronic circuit may be configured to convert the electric control signal In to a deflection of the deformable element of at least one electromechanical transducer. To this end, the electronic circuit may include a switching amplifier (a so-called class D amplifier). Said amplifier may be configured to provide the signal Out as a digital pulse-width modulated control signal for the deformable element.

It shall be noted here that utilization of the term "lid surface" relates to the described layer stack describing, e.g., outer layers of the stack. However, this is not to be understood to mean that no further layers may be arranged, since it is possible to provide additional layers, which partly or fully cover the outer layers, at the described stack. For example, insulating layers such as a semiconductor oxide or lacquers, or further electrically functional layers may be provided.

The substrate 14 may include one or more openings 26a-d through which the volume flow 12 may pass from surroundings of the MEMS transducer 10 into the cavity 16 and/or from the cavity 16 into surroundings of the MEMS transducer 10. A movement performed by the deformable element 22 during deformation may be understood to be present within the plane (in plane) in relation to the substrate 14. The volume flow 12 may exit, or get into, the cavity 16 at least partly perpendicularly to the direction of movement 24, as depicted, for example, by the opening 26c or 26d for the volume flow 12. In simplified terms, an in-plane movement of the deformable element 22 may result in an out-of-plane volume flow 12, and vice versa. This means that the lateral direction of movement and/or the deformation of the deformable element may take place in-plane in relation to the substrate.

Within the substrate 14, the openings 26c and 26d are arranged perpendicularly to the lateral direction of movement 24. Deformation of the deformable element 22 along the lateral direction of movement 24 may result in a movement of at least a region of the deformable element 22 toward the opening 26a, so that a partial cavity 28 is reduced in size on the basis of said deformation. A pressure of the fluid present within the partial cavity 28 may be increased on the basis thereof. In simplified terms, the fluid may be compressed. This may facilitate the fluid flowing out from the partial cavity 28, or the cavity 16. By means of the openings 26d and 26c, the volume flow 12 may be obtained perpendicularly to the lateral direction of movement 24.

A base area of the MEMS transducer 10 may be arranged within an x/y plane, for example. A large dimension of the MEMS transducer 10 along a z direction, which is arranged in space to be perpendicular to the x direction and/or the y direction, and/or a large dimension of the deformable element 22 along the z direction may result in an increase in the volume flow 12, whereas the base area of the MEMS transducer 10 remains unchanged. An enlargement of the partial cavity 28 may result in negative pressure of the fluid within the partial cavity 28, so that on the basis of the deformation of the deformable element 22, the volume flow flows into the cavity 28 and/or 16 in a manner that is perpendicular to the lateral direction of movement 24.

The deformable element may comprise an axial extension, e.g. along the y direction, which has a value ranging from at least 1 µm to 100 mm at the most, advantageously from at least 100 µm to 10 mm at the most, and particularly advantageously within a range from at least 500 µm to 5 mm at the most. The deformable element 22 may have an extension along the lateral direction of movement 24 which comprises a value ranging from at least 0.1 µm to 1000 µm at the most, advantageously from at least 1 µm to 100 µm at the most, and particularly advantageously ranging from at least 5 µm to 30 µm at the most. The deformable element may have an extension along a lateral direction, which is arranged perpendicularly to the lateral direction of movement, e.g. along the z direction, which has a value ranging from at least 0.1 µm to 1000 µm at the most, from at least 1 µm to 300 µm at the most, and particularly advantageously from at least 10 µm to 100 µm at the most.

Figure 2A:
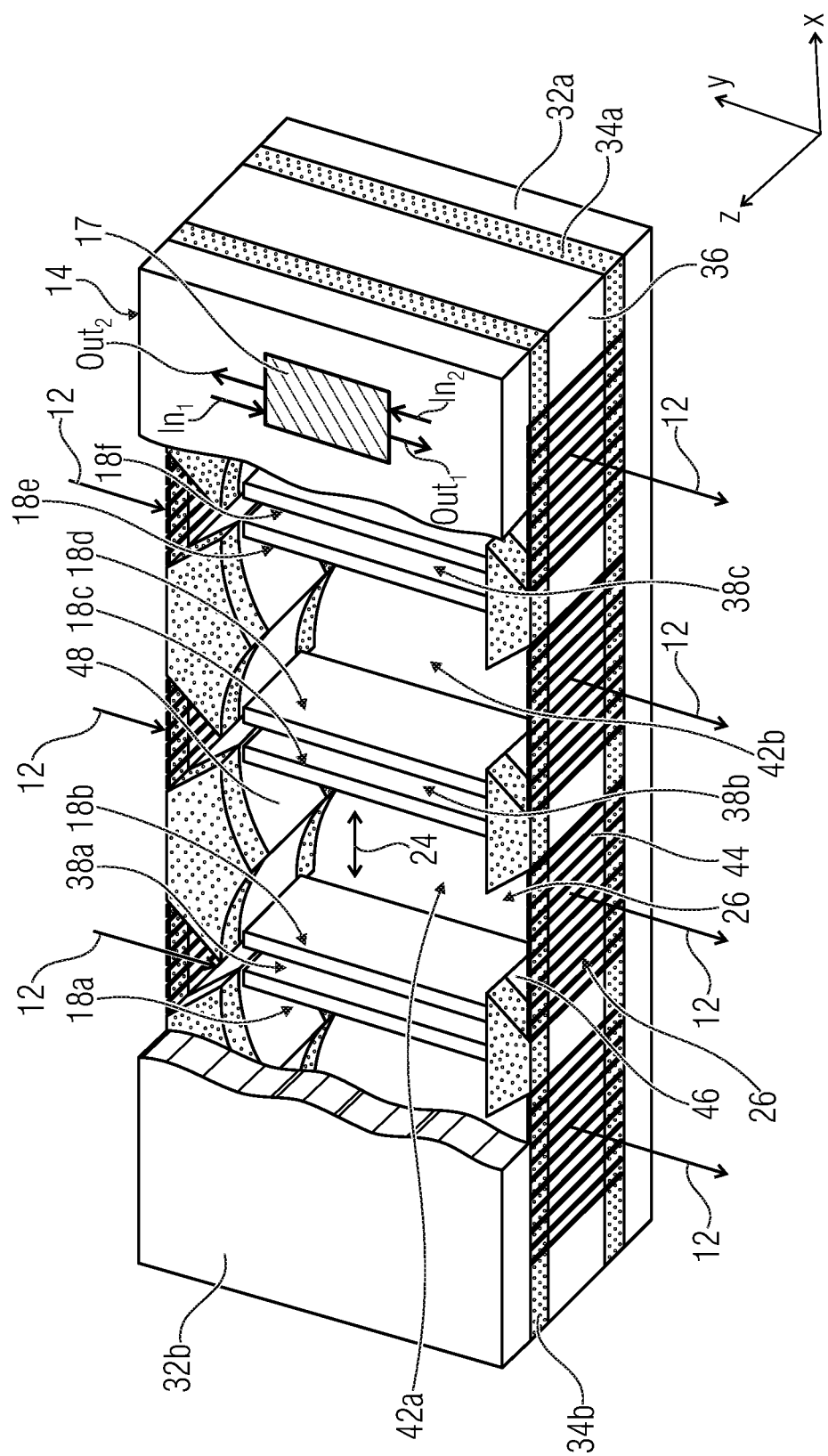
FIG. 2a shows a schematic perspective view of a MEMS transducer including a multitude of electromechanical transducers, in accordance with an embodiment.

FIG. 2a shows a schematic perspective view of a MEMS transducer 20 including a multitude of electromechanical transducers 18a-f. The electromechanical transducers 18a-f are connected to the substrate 14 and may each comprise an element that is deformable along the lateral direction of movement 24, as described in connection with FIG. 1.

For example, the substrate 14 includes a first layer 32a, a first spacing layer 34a, an intermediate layer 36, a second spacing layer 34b and a second layer 32b, which are arranged one upon the other in the order mentioned. In accordance with further embodiments, one or more further layers may be arranged between two of the consecutively arranged layers. In accordance with further embodiments, at least one of the layers 32a, 32b, 34a, 34b and/or 36 is designed to be multi-layered. An electronic circuit 17, e.g. the electronic circuit described in connection with FIG. 1, may be partly or fully arranged within the layer 32b. Alternatively or additionally, the electronic circuit 17 may be at least partly arranged within one or more of the layers 32a, 34a, 36 and/or 34b.

The electronic circuit may be configured to convert an electric control signal $In_1$ to a deflection of the deformable element in that the electromechanical transducer is provided with a signal $Out_1$ which is based on the signal $In_1$. Alternatively or additionally, a signal $In_2$ may be obtained, on the basis of a deformation of the deformable element, which may be converted to an electric output signal $Out_2$ by the electronic circuit. The conversion here may be performed such that the electronic circuit 17 comprises at least one of an analog-to-digital converter (ADC) and a digital-to-analog converter (DAC) or an AC/AC converter or a DC/DC converter. On the basis thereof, the electronic circuit 17 may be configured to obtain an input signal $In_1$ in an analog version and to convert it to a digital version so as to obtain the signal $Out_1$. Alternatively, the signal $In_1$ may also be a digital signal and the signal $Out_1$ may be an analog signal, and both signals $In_1$ and $Out_1$ may be digital or analog. Alternatively or additionally, the electronic circuit 17 may provide conversion of the signal $In_2$, which is obtained from the electromechanical transducer, e.g. in an analog form, to the signal $Out_2$. The signal $Out_2$ may be analog or digital. The electronic circuit 17 may thus be configured to convert a digital version of the control signal $In_1$ to an analog version of the control signal $Out_1$, and/or may include an analog-to-digital converter for converting an analog version of the electric output signal $In_1$ to a digital version of the electric output signal.

The electromechanical transducers 18a-f are configured, and/or controllable by the electronic circuit 17, to partly move toward and partly move away from one another on the basis of the volume flow 12 and/or on the basis of being controlled.

For example, the electromechanical transducers 18a and 18b are configured to move away from each other, whereas the electromechanical transducers 18b and 18c move toward each other. The electromechanical transducers 18a and 18b, 18c and 18d, and 18e and 18f have partial cavities 38a-c arranged between them, it being possible for the partial cavities 38a-c to become larger on the basis of the deformation of the electromechanical transducers 18a-f. The electromechanical transducers 18b and 18c, and 18d and 18e, respectively, have partial cavities 42a and 42b arranged between them which may simultaneously decrease in size on the basis of the movement or deformation. In a subsequent time interval, deformation or movement of the electromechanical transducers and/or of the deformable elements may be reversible, so that the volumes of the partial cavities 38a, 38b and 38c decrease while the volumes of the partial cavities 42a and 42b increase.

The electronic circuit 17 may be arranged along a direction perpendicular to the plane of movement within which the electromechanical transducers move. If a location of the electronic circuit is projected into the plane of movement, said location may correspond to a location where the deformable element is at least partly located during deformation. This means that the deformable element may be located, e.g., above or below the electronic circuit 17.

In other words, the lower lid (first layer 32a), which partly or fully closes off the chip on one side (e.g., however without limitation, a bottom side), may have a patterned layer, the spacing layer 34a, arranged thereon which may be used, e.g., as a spacer between the lower lid and the intermediate layer 36 arranged on the patterned layer 34a. The patterned layer 36 may in turn have a patterned spacing layer 34b arranged thereon which, in terms of its function as a spacer, fully or partly corresponds to the spacing layer 34a and may have an identical or similar shape. The MEMS transducer 20, or its cavity, may be partly or fully closed off by the upper lid, the second layer 32b, along the z direction. FIG. 2a shows the layer 32b as a partly exploded view so as to make visible elements arranged within the region of the cavity. Electromechanical transducers 18b and 18c and/or 18d and 18e, respectively, may be arranged in pairs within an x/y plane of the intermediate layer 36, it being possible for such an arrangement to occur several times along a spatial direction, e.g. along the x direction. The electronic circuit 17 may be fully or partly arranged within at least one of the lids 32a and 32b. It is further possible for the electronic circuit 17 to extend across several layers and to be arranged, for example, partly within the layer 32a and the adjacent layer 34a or within the layer 32b and the adjacent layer 34b.

Arranging the electronic circuit fully or least partly in at least one of lids 32a and/or 32b enables space-saving and, therefore, surface-area efficient arrangement of the electronic circuit. This is advantageous in particular in combination with an element that is movable laterally, i.e. in-plane. In contrast to elements which are movable perpendicularly thereto and out-of-plane, as is the case with loudspeaker membranes, for example, thinning of the corresponding layer (e.g. for membrane formation) may be dispensed with, and/or the movable element may be arranged to be covered by the lid, without affecting functionality. With out-of-plane movements, the thinned membrane layer, which at least partly forms the movable element, would either be poorly suitable for arranging an electronic circuit, and/or an additional covering layer would affect performance of the device. In embodiments, the lid of the stack, which may also be covered by further layers, forms no part of the movable element.

The substrate may comprise a multitude of openings 26 connected to a multitude of partial cavities 38a-c and 42a-b, respectively, it being possible, for example, for one opening 26 to be connected to a partial cavity 38a-c or 42a-b in each case. A volume of each partial cavity 38a-c or 42a-b may be influenced by a state of deflection of at least one element 22 deformable along the lateral direction of movement 24. Adjacent partial volumes may be able to be made larger or smaller, in a complementary manner, during a first or second time interval. In simplified terms, a partial volume of a partial cavity 38a-c or 42a-b may be reduced in size whereas an adjacent partial volume of a partial cavity 42a-b and/or 38a-c is increased in size.

In a region of one or more openings 26, bar structures 44 may be arranged. The bar structures 44 may be arranged such that passage of the volume flow 12 in one or two directions is enabled, whereas entering of particles into or exiting of particles from the cavity is reduced or suppressed. Shapes of the layers 32a, 32b, 34a, 34b and/or 36 may be influenced during a manufacturing process, for example, by selectively removing and/or selectively arranging or growing of layers. For example, the bar structures 44 may be formed from the layers 34a, 36 and/or 34b on the basis of a selective etching process. In addition, shapes of the cavities 38a-c and 42a-b may be influenced during the manufacturing process. For example, walls of one or more layers 32a, 32b, 34a, 34b and/or 36 may be adapted to a movement of the deformable elements of the electromechanical transducers 18a-f, e.g. so as to enable an at least approximately constant and/or small distance between the deformable elements and the substrate 14.

A cover 43 may be arranged adjacently to or at the bar structures or bar elements. The cover 43 may be arranged adjacently to the cavity 16 and/or separately therefrom due to the bar elements 44. The cover may include, e.g., a mesh material, a foam material and/or a paper material. The cover may enable entering of particles into the cavity 16 or exiting of particles from the cavity 16 which have diameters that are smaller than is a distance between bar structures. Alternatively, the cover 43 may also be arranged adjacently to or at an opening 26 which does not comprise the bar elements 44.

If a free end of the movable elements moves, e.g., in a bent path and/or a circular path, the substrate 14 may have a parallel or similar shape in a region within which the movable end is moving.

Figure 2B:
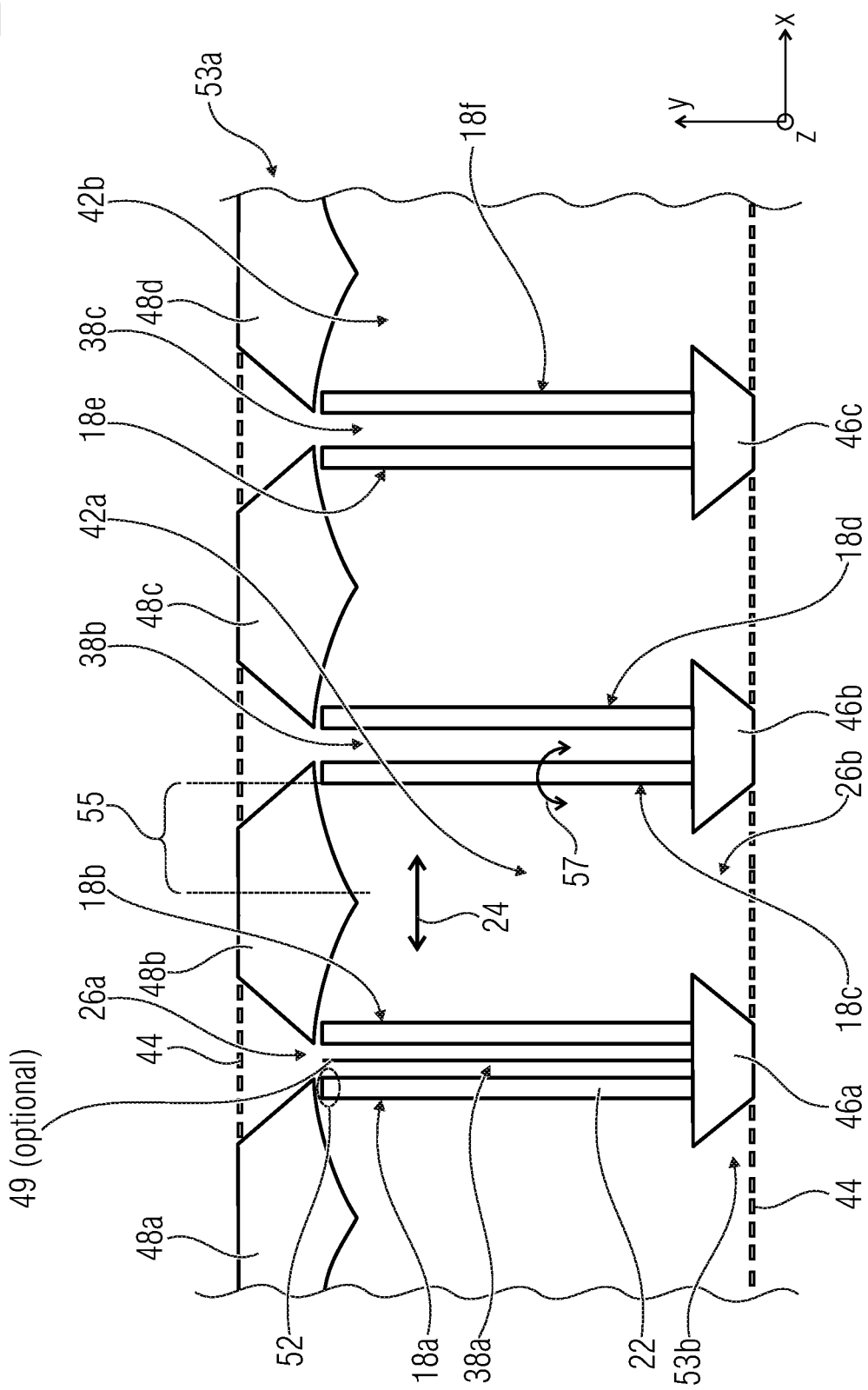
FIG. 2b shows a schematic top view of the MEMS transducer of FIG. 2a in accordance with an embodiment.

FIG. 2b shows a schematic top view of the MEMS transducer 20 of FIG. 2a. The electromechanical transducers 18a-f may be connected to the substrate 14 at elements 46a-c in a non-positive or positive manner. For example, one or more deformable elements of the electromechanical transducers 18a-f may be integrally formed with the elements 46a-c. The elements 46a-c may be arranged within a plane of the layer 36 or be parts of the layer 36. An extension of the deformable elements 22 of the electromechanical transducers 18a-f may be smaller than or equal to an extension of the layers 34a, 36 and 34b along the z direction, for example. This means that the deformable elements 22 of the electromechanical transducers 18a-f may be arranged and movable in a manner that is free of contact with the layer 32a and/or 32b. Alternatively, at least one deformable element may also be deformed while making contact. For example, a low-friction layer, e.g. a layer having a small coefficient of friction, may be arranged between the at least one deformable element and an adjacent layer, e.g. the layer 32a and/or 32b. The low-friction layer may enable fluidic separation between partial cavities as described, e.g., for the wall structure 49. A coefficient of friction may be smaller, e.g. by 10%, 20% or 50%, than a coefficient of friction of the layer 32a and/or 32b or of the layer 34a and/or 34b. A frictional force acting between the deformable element 22 and adjoining layers may be smaller than a force needed for deformation of the deformable element 22. On the basis of a reduced frictional force, e.g. a force to be provided by an actuator may be smaller, so that the actuator may be designed to have less power. Alternatively or additionally, a level of sensitivity of the deformable element 22 with regard to the volume flow 12 may be increased.

The electromechanical transducers 18b and 18c form, e.g., sidewalls of the partial cavity 42a (chamber). The movable elements 22 of the electromechanical transducers 18a-f may be positively fixed to the elements 46a-c. A distance from the substrate 14, or from elements 48a-d of the substrate 14, may be arranged between a deflectable or movable end 52 of the deformable elements 22. The end 52 of the deformable element 52 may thus be arranged to be freely movable. One or more deformable elements 22 may be deflectable to a particularly large extent along the lateral direction 24 due to dimensional ratios, e.g. an extension along the x direction in relation to an extension along the y direction, in simple terms a ratio between the beam width to the beam height. If the electromechanical transducers 18a-f are configured as actuators, for example, said actuators may be deflectable, i.e. be curved, upon application of a corresponding signal, so that, e.g., the end 52 of the deformable element 22 will move on a bent path. In accordance with the progress of said path, at least one of the elements 48a-d may be configured such that a distance between the elements 48a-d and the end 52 will remain more or less constant and/or small even if the deformable element 22 is deflected.

The MEMS transducer 20 may comprise at least one wall structure 49. Movement of the actuators, electromechanical transducers 18a-e or deformable elements may have the effect on a chamber 42a-b, for example, that due to the fluid flows, triggered by the movement, for filling the chamber 38a-c, fluid-mechanical coupling to the adjacent chambers may occur. On the basis of said fluid-mechanical coupling, a fluid flow 57 may occur between the partial cavities 42a and 38b. In order to reduce or avoid said direct coupling, and/or the fluid flow 57, one or more partition walls (wall structures 49), which may possibly be designed to be immobile, may be arranged for separating adjacent pairs of chambers 38 and 42. The wall structures may be implemented in a simple manner, for example, at the respective locations, as an element that is integrally formed with layers 34a, 36 and 34b. For example, such structures may continue to be arranged during a selective etching process. In addition, the wall structure 49 may increase mechanical stability of the MEMS transducer 20 and may facilitate a bonding process between the individual layers. The at least one wall structure 49 may comprise openings or may be designed in one piece, which enables modifying attenuation, which results from fluid streaming into and out of the chambers 38a-c and 42a-b, in a targeted manner, in particular for setting the width of the resonance curve, or, generally, for setting dynamic properties of the actuator/chamber systems.

If FIG. 2b is considered together with FIG. 1, a volume of the cavity 16 and/or of the multitude of partial cavities 38a-c and 42a-b may be influenced or determined by the layers 32a and 32b and lateral regions 53a and 53b of the substrate 14. The lateral regions 53a and 53b may be arranged between the layers 32a and 32b. The deformable elements of the electromechanical transducers 18a-c may be configured to perform, at least within one portion 55 of the lateral direction of movement 24, a movement that is parallel with the first layer 32a and/or 32b. This means that the deformable element may deform or move between the layers 32a and 32b.

A resonant frequency of a cavity or partial cavity may be influenced by a geometry of the volume, by a frequency of controlling of the electromechanical transducers and/or by a mechanical resonant frequency of the deformable element(s). (Partial) cavities which are at least partly fluidically separated from one another, e.g. by means of a wall structure 49, by a low-friction layer being arranged, or on the basis of being arranged in different MEMS transducers, may have different resonant frequencies and/or be controlled at different frequencies, e.g. by means of a control device. On the basis of different control frequencies and/or different resonant frequencies, a multipath loudspeaker may be obtained. Resonant frequencies of cavities are exploited, e.g., in the field of cavity resonators or Helmholtz resonators.

FIG. 2c shows a schematic perspective view of the MEMS transducer 20, wherein the electromechanical transducers 18a-f have a deformed state of the deformable element. For example, the deformable elements are deflected up to a maximum deflection. As compared to the depiction of FIG. 2a, a volume of the partial cavity 42a is reduced on the basis of the deformation (bending) of the deformable elements (beams). For example, if a thickness (dimension along the z direction, or thickness direction) of the layers 34a and 34b (spacers) is small, the bypass flow of electromechanical transducers 18a-f and/or the deformable elements which occurs during movement of the electromechanical transducers 18a-f may be negligible. This may also apply to a distance between the electromechanical transducer 18a-f and the substrate, e.g. the element 48. On the basis of the deformation of the deformable element, a volume of the fluid, e.g. an air volume, which may correspond to the difference in volumes of the partial cavities 42a in FIGS. 2a and 2c, may be discharged to surroundings of the MEMS transducer 20, e.g. in the form of the fluid flow (volume flow) 12.

A dimension of the spacing layer 34a or 34b along the z direction, along which the first and second spacing layers 34a and 34b are arranged at the intermediate layer 36, may have a value ranging from at least 1 nm to 1 mm at the most, advantageously ranging from at least 20 nm to 100 μm at the most, or particularly advantageously ranging from at least 50 nm to 1 μm at the most. For example, if the dimensions of the spacing layers 34a and 34b are small as compared to dimensions of the electromechanical transducers 18a-f along the z direction, a quantity of the fluid flow 57 which bypass-flows around the electromechanical transducer 18a-f from a first side to a second side (e.g. from a positive x direction to a negative x direction, or vice versa), while the deformable element is about to deform, may be smaller than a quantity of the volume flow 12 within the cavity.

The bypass flow and/or the fluid flow 57 may be based, e.g., on at least partial removal of the spacing layers 34a and/or 34b within a region within which the electromechanical transducer 18a-f is moving. In simplified terms, a fluid flow around movable elements may result (fluidic losses) on the basis of the distance between the electromechanical transducer and adjacent layers. Said fluid flow may be small as compared to the fluid flow 12. For example, it may be smaller than the quantity of the volume flow divided by the value of 10, divided by the value of 15 or divided by the value of 20.

The electromechanical transducers may move toward or away from one another in pairs. For example, the electromechanical transducers 18a and 18b may move away from each other in pairs as compared to the state shown in FIG. 2b, and may move toward one another in pairs during a subsequent time interval. At the same time, e.g., the electromechanical transducers 18b and 18c may move toward or away from one another in pairs. Such a movement of electromechanical transducers, which is complementary in pairs in each case and which is also possible if the transducers are not arranged adjacently to one another, may result in an at least partial, but also full, compensation of inertial forces, so that a small amount of vibrations or no vibrations at all are obtained within the MEMS transducer and/or are transferred from the MEMS transducer to its surroundings.

In other words, a specific feature of the chamber approach described so far may consist in that the actuators move toward and/or away from one another in pairs in an anticyclical manner. Therefore, (when both active bending actuators which limit each chamber wall are carefully designed accordingly) no vibrations arise which might interfere with utilization as a hearing aid or as in-ear headphones.

The fluid flow 12 may pass the opening 26a and/or 26b, for example. The openings 26a and 26b may be configured identical or be adapted to a geometry of the adjacent partial cavity 38a and/or 42a. The opening 26a may comprise, for example, a variable cross section along an axial direction (e.g. the y direction), e.g. a dimension along the x direction. The dimension of the opening 26b along the x direction may decrease in a direction toward an interior of the MEMS transducer 20, i.e. toward the cavity or partial cavity 42a. Alternatively or additionally, the opening 26 may comprise a variable dimension or a variable cross section along a further direction, e.g. a z direction (thickness direction) perpendicular to the axial direction y. The variable cross section may decrease from an outer side of the MEMS transducer 20 toward the cavity 16. A tapering cross section or a decreasing dimension of the opening 26 from the outer side of the MEMS transducer 20 toward the cavity 16 along one or more directions x and/or z may be referred to as a funnel-shaped opening.

The possibly funnel-shaped opening 26b may be utilized as a device for impedance adaptation. Impedance adaptation may be advantageous, for example, when using the MEMS transducer 20 as a loudspeaker. An implementation or geometry of the opening 26b may be realized by analogy with macroscopic loudspeakers having dimensions of several centimeters. A shape of the opening 26b may enable the actual sound irradiation to be defined by the outer surface area of the funnel. The opening 26b may be formed in one piece, e.g., within the patterned layers 34a, 36 and 34b. A bar grid 54, which includes at least one bar element 44, may comprise openings and/or gaps between bar elements 44 and/or between bar elements 44 and the adjacent substrate. The gaps may be formed such that the fluid may flow through them.

The bar grid 54 may present protection against entry of particles into the cavity of the MEMS transducer 20. A width of the openings of the bar grid 54, i.e. a distance between bar elements 44, may be configured such that the fluid flow 12 is influenced or not influenced to a desired degree in terms of flow-related aspects. For example, or ideally, the distance between the bar elements 44 may be smaller than smallest gap distances within the MEMS transducer 20, so that the bar grid is able to filter a large number of or even all of the relevant particles. A gap distance may describe, e.g., a distance of a deformable element 18a-c from a layer 32a or 32b. The distance between the bar elements 44 may be smaller than, e.g., 5 µm, than 1 µm, than 0.1 µm or than 0.05 µm.

Dimensions of the bar elements 44 along the spatial directions may be implemented such that the bar elements 44 comprise no resonances within the audible sound range, i.e. within a frequency range from at least 16 Hz to a maximum of 22 kHz. Even though the bar elements 44 are depicted to be arranged on an outer side of the MEMS transducer 20, e.g. within a region where the opening 26a or 26b comprises a maximum dimension along the x direction, one or more bar elements may also be arranged at a different location of the opening 26a or 26b, e.g. within a tapered region of the opening 26a and/or 26b.

Due to the deformation of the deformable elements, the volume of a partial cavity 42a may be reduced. During a same time interval, a volume of the chamber (partial cavity) 38a may increase. The partial cavity 38a may be connected, in the same or a similar manner as the partial cavity 42a, to the surroundings of the MEMS transducer 20 via a funnel-shaped opening 26b and/or a bar grid 54 including one or more bar elements 44. Electromechanical transducers 18a-f may be configured to be controlled at, or may comprise, one of different frequencies o. A volume of each partial cavity may change at different frequencies or at at least partly identical frequencies.

The opening 26a and the opening 26b may be arranged at or within sides of the MEMS transducer 20 which are arranged to be spatially opposite one another. For example, the fluid flow 12 may be ejected or sucked in, by means of the partial cavities 42a and/or 38a or a multitude of such partial cavities, on one side, respectively, which comprises the opening 26a or 26b. This means that the fluid flow 12 may be generated in opposite directions. For example, during a first time interval the volume flow 12 may be ejected from the opening 26a in a negative y direction and sucked into the partial cavity 38a. During a second time interval, said directions may reverse. A flow short circuit may thus be prevented or excluded from occurring along the MEMS transducer 20.

The deformable elements (beams) of the electromechanical transducers 18a-f may be configured to curve in accordance with a signal supplied from outside. A frequency at which the curving is effected may influence or determine a frequency at which the volume flow 12 is generated and/or oscillates, and may consequently influence or determine a sound frequency. An amplitude of the vibration that is determined via the signal supplied may influence or determine, given one or more resonant frequencies, an amplitude of the volume flow 12 and may therefore have effects on the sound level.

Also, at least one chamber (cavity or partial cavity) may act as a sensing element, and another chamber may act as an actuating element. This means that the MEMS transducer may include at least one sensing deformable element and at least an actuating deformable element. The movement of the beams is detected and evaluated. For example, the electromechanical transducers 18a and 18b may be controlled as actuators, while the electromechanical transducers 18c and/or 18d may be used as sensors for detection within the fluid. Electrostatic (capacitive), piezoelectric or piezoresistive sensor elements may be integrated for detection. Such an element may be used as a microphone and/or pressure sensor. Such an integrated microphone and/or such a pressure sensor may also be used for checking and controlling the properties of the loudspeaker chambers (actuators) and/or the ultrasonic transmitter chamber and/or pump chamber. For this purpose, corresponding electronics are to be employed as a control circuit.

Further embodiments of the electromechanical transducers, or actuators, will be explained below. Even though the MEMS transducer 20 was described to the effect that a non-deflected, or non-actuated, state comprises non-deflected deformable elements, the states may also be mutually exchangeable. This means that in a first, non-actuated state, the deformable elements may be deformed or curved and may deform, on the basis of a control signal, into a less curved, more heavily curved or straight state.

Even though the above explanations illustrate that an electrical signal is brought to the MEMS transducer 20, e.g. by a control device, it is also the volume flow 12 which may result in a deformation of the deformable elements, it being possible for the deformation to be obtained by means of an electric signal applied to the MEMS transducer 20, i.e. the MEMS transducer 20 is also configurable as a sensor.

Advantageous further developments of the deformable elements will be referred to below. One or more electromechanical transducers may comprise deformable elements in accordance with the further developments described below.

Figure 3:
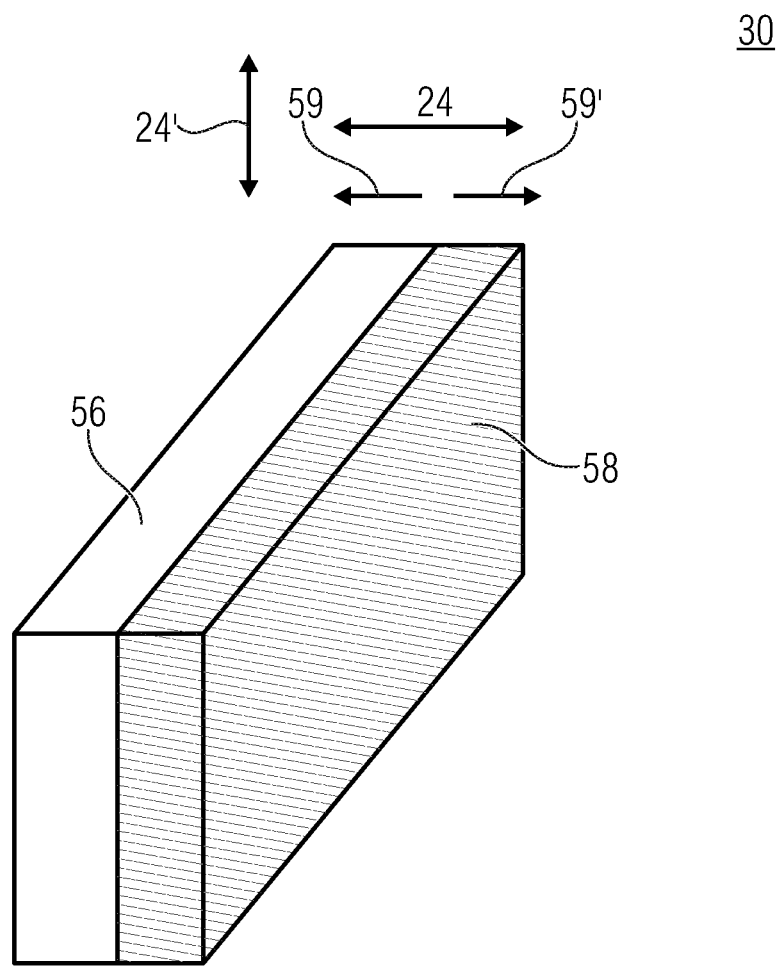
FIG. 3 shows a schematic perspective view of a deformable element configured as a bimorph, in accordance with an embodiment.

FIG. 3 shows a schematic perspective view of a deformable element 30 configured as a bimorph. The deformable element 30 comprises a first layer 56 and a second layer 58 which are firmly connected to each other at least in some places, advantageously across their entire surface areas. The first layer 56 and the second layer 58 are configured to become deformed, e.g. to expand or to contract, to different degrees on the basis of mechanical, physical or chemical influences. For example, the layers 56 and 58 may have coefficients of thermal expansion which differ from each other. Alternatively or additionally, the layer 56 or the layer 58 may be configured to expand or contract on the basis of an electric signal that is brought to the corresponding layer. For example, said layer may comprise piezomaterials.

Different contractions or expansions of the layers 56 and 58 may result in a deformation of the deformable element 30 along a direction of actuation 59 or 59'. The actuation direction may be arranged in parallel with the lateral direction of movement 24. The actuation direction may be a direction along which the deformable element 30 is deflectable by application of a positive electric voltage.

Alternatively or additionally, a deformation along a further lateral direction of movement 24' may also be usable which is based, e.g., on transverse contraction or transverse expansion of the deformable element 30 and/or on contraction or expansion of any of the layers. This means that the deformable element 30 may be configured to curve, with its beam structure, along an axial direction (e.g. the y direction, or in-plane) of the beam structure. This may be effected on the basis of a reciprocal movement, i.e. a movement along the lateral direction of movement 24 and along an opposite direction.

In other words, the bimorph may correspond to a beam consisting of two layers. The layers are arranged, e.g., in one direction (e.g. vertically) to each other. A passive layer (e.g. layer 56) may be fixedly connected to an active layer (e.g. layer 58). By applying a suitable signal, a mechanical tension may be generated within the active layer 58, which results in contraction or expansion of the layer 58. A direction of the change in length of the layer 58 may be selected such that the bimorph will laterally bend in the one direction (contraction) or the other direction (expansion).

FIG. 4a shows a schematic perspective view of a deformable element 40 comprising three bimorph structures 30a-c, as described in connection with FIG. 3. A spatial schematic arrangement of the deformable element 40 along the x, y and z directions is depicted, by way of example (however, not in a limiting sense), in terms of how the deformable element 40 may be arranged within the MEMS transducer 10 or 20, for example. The deformable (partial) elements 30a-c may have different dimensions, e.g. along the x, y or z directions. For example, the deformable elements 30a and 30c may have equal expansions along the y direction. The actuation directions 59a-c of the deformable elements 30a-c may be arranged in an alternating manner, for example, or may be arranged to have mutual alignments, e.g. in a positive/negative/positive x direction. In simplified terms this may be understood to mean that the deformable elements 30a and 30c have equal lengths. The deformable element 30b may have a length that differs therefrom. For example, a length of the deformable element 30b may be double the comparable length of the element 30a or 30c. In accordance with further embodiments, further elements, e.g. spring elements, may also be arranged between the deformable elements 30a-c.

A direction along which the deformable elements 30a-c will deflect upon application of an identical or comparable quantity (e.g. a sign of an electric voltage) may alternate along the length of the deformable element 40. This enables an alternating progress of the curvature. Even though the deformable element 40 is depicted to include three deformable elements 30a-c, it is also possible that two deformable elements or more than three deformable elements 30 are arranged.

FIG. 4b shows a schematic perspective view of the deformable element 40 in a deflected state. The layers 58a-c are contracted, for example, so that a multiple curvature results along an axial progress (y direction).

In other words, three beams depicted in FIG. 3 may be arranged to adjoin one another in the direction of their expansion. This may be effected such that, upon a corresponding signal, a first beam and a third beam (30a and 30c) have a curvature in a first direction, and the second beam (30b) has a curvature in the other direction. In this manner, an actuator may be obtained which, upon application of a corresponding signal, deforms in an S-shape, as depicted in FIG. 4b, from the stretched shape it exhibits when no signal being applied, as depicted in FIG. 4a. The configurations with a signal and without a signal are mutually exchangeable. For example, the deformable elements 30 may comprise a pre-deflection or bias in each case which result, on the basis of the signal applied, in a reduced curvature or straight-line extension of the deformable element(s) 30 and/or 40. It may be assumed, for example, that the curvatures of the individual beams 30a-c are identical except for the sign and that a length of the first and third beams 30a and 30c each corresponds approximately to a quarter of a total length of the deformable element, a length of the central beam 30b corresponding roughly to half the length of the deformable element 40.

Figure 4C:
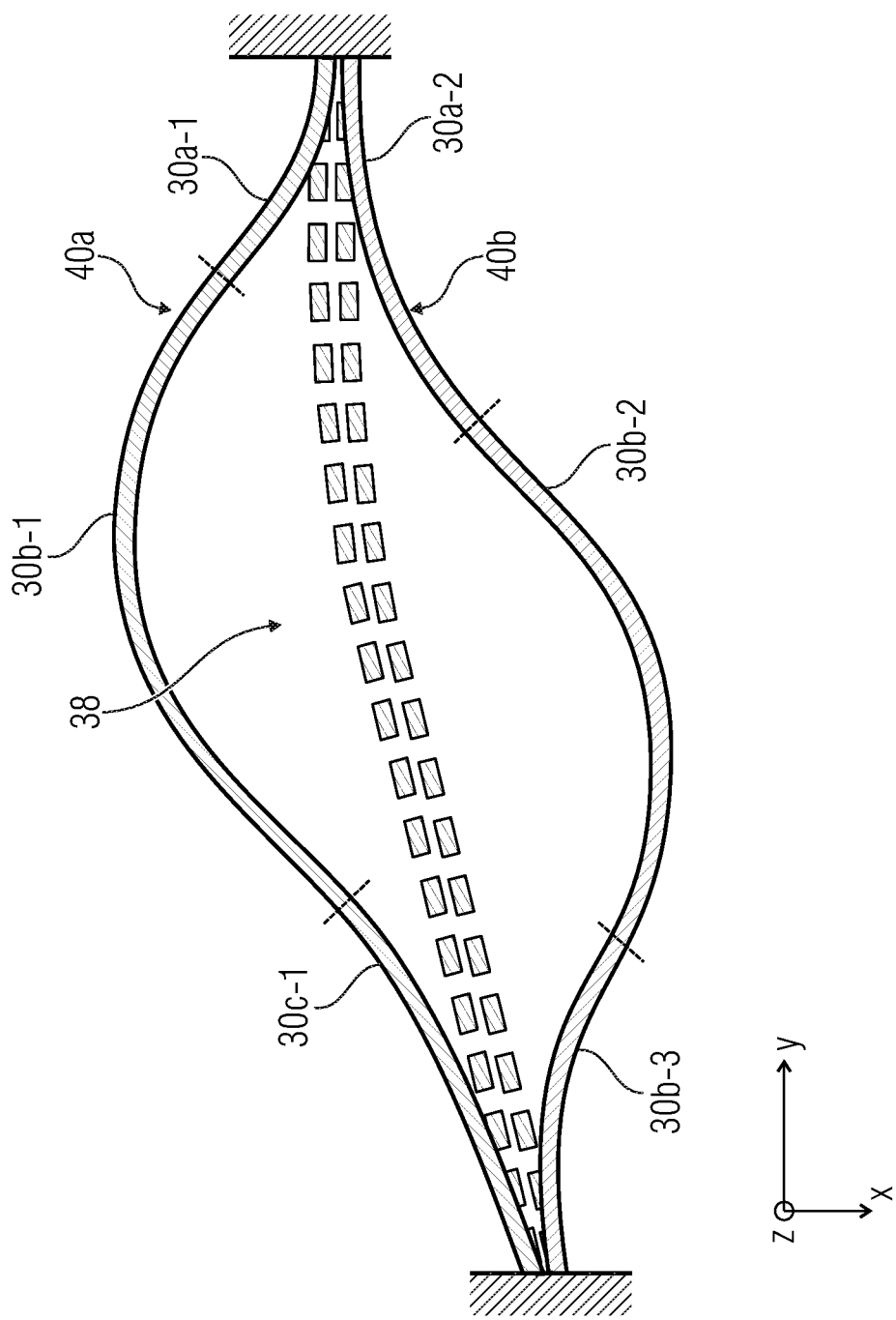
FIG. 4c shows a schematic top view of an arrangement of two deformable elements arranged adjacently to each other, in accordance with an embodiment.

FIG. 4c shows a schematic top view of an arrangement of two deformable elements 40a and 40b clamped on both sides and being arranged adjacently to each other such that the partial cavity 38 is arranged between the deformable elements. The continuous lines show, e.g., an actuated state of the deformable elements 40a and 40b, whereas the dashed lines show a non-actuated state, said description of the deformable elements being mutually exchangeable since the non-actuated state may adopt any form for reasons related to manufacturing.

The deformable elements 40a and 40b may be configured to each comprise a curvature in the non-actuated state. Moreover, the deformable elements 40a and 40b may be formed of three segments 30a-1 to 30c-1, and 30a-2 to 30c-2, respectively, which undergo mutual curving during actuation. Each segment, e.g. the central segment 30b-a or 30b-2, may also be formed from two or more segments. Compared to the depictions of FIGS. 4a and 4b, the segments 30a-1, 30b-1 and 30c-1 may have lengths which differ as compared to one another and as compared to every other segment. The lengths may be adaptable to a desired shape that is to be obtained upon actuation. The S-shaped actuators exhibit the major advantage that they serve not only to achieve a large planar filling factor but that they may also be clamped on both sides in the process. Due to the two-sided clamping, pre-deflection of the beams, which technologically can never be avoided and is due to layer tension gradients, is markedly reduced. Thus, the distances from the lower and upper lids of the substrate may be kept very small, which disproportionately reduces the flow/pressure losses and, consequently, not only significantly increases efficiency of loudspeakers, ultrasonic converters, microphones and pumps, but may in some circumstances actually enable their correct functioning. In accordance with further embodiments, it is also possible for only one of the deformable elements 40 to be arranged, e.g. within the MEMS transducer 10.

FIG. 5 shows a schematic top view of a MEMS transducer 50, wherein the electromechanical transducers 18a-c have different configurations as compared to the MEMS transducer 20. The electromechanical transducers 18a-c each include a first and a second deformable element 22a and 22b, 22c and 22d, and 22e and 22f, respectively. The deformable elements are arranged opposite each other. Deflectable ends of the beam elements are arranged to face one another. Regions where the deformable elements 22a-f are connected to the substrate are arranged to face away from one another.

The electromechanical transducers 18a-c each include a plate element 62a-c connected to the respective deformable elements 22a and 22b, 22c and 22d, and 22e and 22f, respectively. The respective plate element 62a-c may be connected to the deflectable ends of the respective deformable elements 22a-f.

The deformable elements 22a-f may each be partly or fully configured as a deformable element 30 or 40 or have a different configuration. Different types of hatching of the deformable elements 22a and 22b, 22c and 22d, and 22e and 22f, respectively, indicate that the deformations of the respective deformable elements differ from one another. The deformable elements of an electromechanical transducer 18a-c may be arranged such that they perform a deflection of the deflectable ends along a same spatial direction, irrespectively of a respective implementation of the deformable element 22a-f.

For example, from the non-deflected state depicted in FIG. 5, control may result in that movement of the deflectable ends of the deformable elements 22a and 22b is performed along a positive x direction. In addition, controlling of the deformable elements 22c and 22d may cause a deflection of the respective deflectable elements to be performed along a negative x direction. This enables the plate elements 62a and 62b to move toward each other during said control, so that the partial cavity 42a is reduced in size on the basis of the movement of the plate elements. Alternatively or additionally, a negative pressure within the cavity 42a may result in that the plate elements 62a and 62b move toward each other, so that deformation of the deformable elements 22a-d is obtained. Alternatively or additionally, it is also feasible for one or more deformable elements 22a-d to be implemented in an electrically passive manner. For example, an electric potential may be applicable to one or more plate elements 62a-c, so that on the basis of an electric potential of the plate elements 62a and 62b, an attractive or repulsive force between the plate elements 62a and 62b may be obtained which causes movement of the plate elements 62a and 62b and, therefore, deformation of the deformable elements 22a-d. Alternatively or additionally, the deformable elements 22c-f and/or the plate elements 62b and 62c may be controlled at the same time or with a time offset so as to obtain deformation of the deformable elements 22c-f and a change in the volume of the partial cavity 38a.

In other words, FIG. 5 shows a variant of the configuration depicted in FIGS. 2a-c, wherein four bending beams 22a-d and 22c-f, respectively, are employed for narrowing and/or broadening each chamber (cavities 42a and 38a). In connection with FIGS. 2a-c, this is described on the basis of two bending beams (deformable elements) in each case. FIG. 5 shows a non-actuated state. The actuated and non-actuated states are mutually exchangeable. For example, each controllable deformable element may generally be deformed when no signal is applied, and may change its deformation as a function of a signal, which also includes achieving a stretched (non-deflected) state as a special case.

Bending beams which are vertically (e.g. along the y direction) opposite one another, for example the deformable elements 22a and 22b, and 22c and 22d, respectively, may be connected to each other via a bendable web including elements 64a and 64b, respectively. In a central region of the web thus obtained, a relatively stiff extension, the element 66, may be arranged. Said element 66 may in turn have the plate element 62b arranged thereat, which is configured to be stiff, or as stiff as possible. Upon application of a corresponding signal, the plate elements 62a-c may move toward or away from one another in parallel so as to decrease or increase, respectively, volumes of partial cavities. The parallel movements of the plate elements may enable the volume of the partial cavity 42a to be zero in a borderline case, which means that the plate elements 62a and 62b contact each other. As compared to a configuration as described in connection with FIGS. 2a-c, such an arrangement may provide a volume flow of the fluid which is clearly larger than the volume flow of the MEMS transducer 20. Upon reduction of the volume of the partial cavity 42a, the volume of the partial cavity 38b may be increased accordingly, or may be increased at least on the basis thereof. Supply of the fluid may be effected through an opening 26a, 26b and 26c, respectively, as described in connection with the MEMS transducer 20. The elements 64a and 64b may also be referred to as spring elements.

The deformable elements (bending beams) 22a and 22b may be designed to curve toward the right (positive x direction) when a signal is applied. The deformable elements 22c and 22d may be designed to curve toward the left (negative x direction) when a signal is applied. Both types of beams (hatchings of the deformable elements) may be designed to curve, e.g., in the event of a first signal being applied, as in connection with FIG. 3 or 4, and to curve in the opposite direction in the event of a second signal being applied. In this case, both the narrowing and the broadening of the chamber (partial cavity) to the original size may be achieved independently of the mechanical restoring force due to the bending of the beams. The first and second signals may be positive and negative electric voltages, respectively, for example. If one considers FIG. 3, for example, layers 56 and 58 may each be active layers, and/or a further active layer may be arranged at the layer 56 on a side facing away from the layer 58; both active layers may be addressed separately from each other so as to obtain a deflection in the one or the other direction.

A volume existing between two opposite deformable elements, e.g. deformable elements 22c and 22d, and the plate element 62b connected thereto may also change upon movement or deformation of the bending beams. For example, the plate element 62 may be configured to be rigid. In order to enable improved equalization of pressure, the deformable elements 22c and/or 22d and/or connecting elements 64 and/or 66, which connect the plate element 62b to the deformable elements 22c and 22d, may be locally thinned so as to provide a local flow passage. This may be effected, e.g., by additional patterning or etching. The connecting elements 64a, 64b and 66 may be arranged in a T arrangement. The connecting element 66 may have a high level of stiffness as compared to elements 64a and 64b. During deformation of the deformable elements 22c and 22d, elements 64a and 64b may thus deform so as to enable the respective plate element to move in a straight line.

By means of FIGS. 6a-e, advantageous embodiments will be described below wherein the plate element 62a and 62b, respectively, is connected to respectively oppositely located deformable elements 22a and 22b, and 22c and 22d, respectively.

Even though the below explanations refer to a connection of the plate elements to the deformable elements, which are configured to be identical in each case, different electromechanical transducers and/or combinations of individual deformable elements to form a plate element may be configured to differ from one another. The details described below do not describe final advantageous further embodiments and may be able to be implemented by themselves or in combination with one another or with further advantageous embodiments.

FIG. 6a shows a schematic top view of a configuration wherein spring elements 68, which are configured to be straight, are arranged between the plate element 62a and 62b, respectively, and the deformable elements 22a and 22b, and 22c and 22d, respectively. The spring elements 68 may be formed from a material of the deformable elements 22a-d or from a material of the plate elements 62a or 62b, and/or may be integrally formed with one or more of said elements. For example, the spring elements 68 may be arranged at right angles to the plate elements 62a or 62b.

FIG. 6b shows an alternative configuration wherein spring elements 68' are arranged at angles α of less than 90°, e.g. 30° or 40° in relation to deflectable ends of the deformable elements. This enables a distance, which is higher than in the configuration of FIG. 6a, of the points of contact at the plate element 62a, which may result in reduced sagging of the plate element 62a during the movement.

FIG. 6c shows a configuration wherein the spring elements 62a are arranged at angles α of more than 90°. This may result, e.g., in reduced restoring forces of the spring elements 68 when compared to the configuration depicted in FIG. 6a.

Figure 6E:
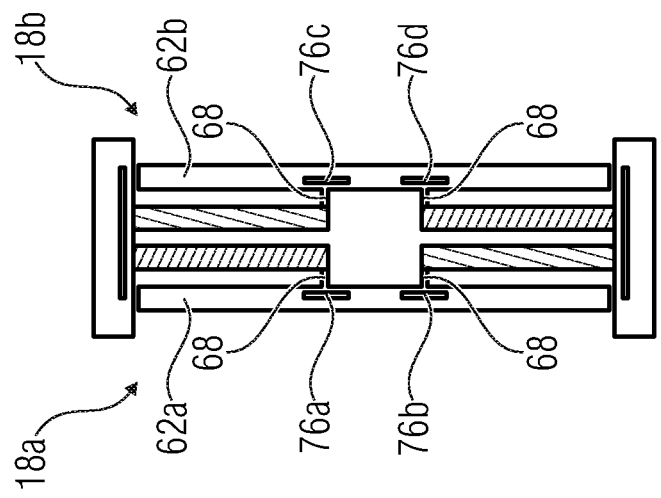
FIG. 6e shows a schematic top view of an electromechanical transducer, wherein plate elements comprise recesses, in accordance with an embodiment.
Figure 6D:
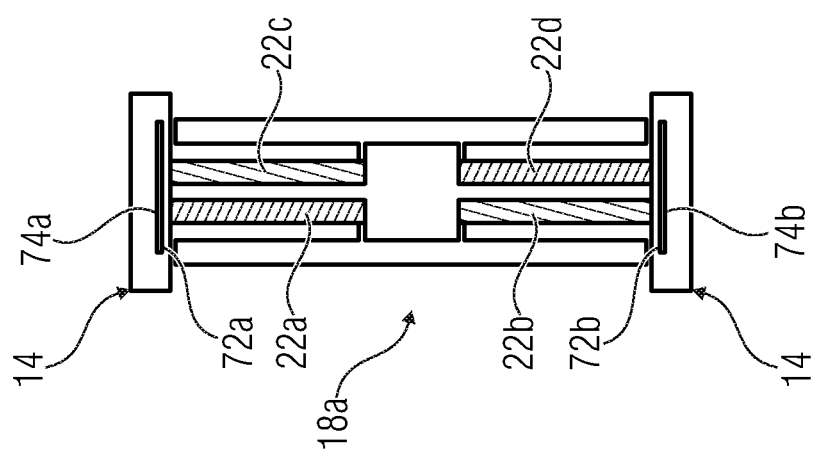
FIG. 6d shows a schematic top view of an electromechanical transducer, wherein the substrate comprises a spring element adjacent to a deformable element, in accordance with an embodiment.

FIG. 6d shows a configuration wherein the configuration of FIG. 6a is modified in that regions of the substrate 14, adjacently to which the electromechanical transducer 18a is arranged and/or the respective deformable element is connected to the substrate 14, have a spring element 72a or 72b arranged therein.

The spring element 72a and/or 72b may be at least partly determined by a recess (cavity) 74a and/or 74b within the substrate 14. This means that, e.g., due to the recesses 74a or 74b, a stiffness of the substrate 14 may be locally reduced, so that the spring elements 72a and/or 72b are formed. Even though the recesses 74a and 74b are depicted to extend across adjacent deformable elements 22a and 22c, and 22b and 22d, respectively, within the substrate 14, the recess 74a or 74b may also be arranged to be adjacent to merely one deformable element or adjacent to several deformable elements. Alternatively, the substrate 14 may also comprise several recesses or spring elements.

In other words, FIG. 6d shows a configuration wherein a further structure in the form of a flexion spring (spring elements 72a and 72b), which has the deformable elements (beams) attached thereto, may result in further reduction of the tensile stress. Such flexion spring elements may also be integrated into the rigid plate, for example, as shown in the configuration of FIG. 6e and as described in connection with the recesses 76a-d. In the event that the beams are deflected, said elements may deform to be S-shaped and may reduce the tensile strain acting on the rigid plate.

FIG. 6e shows a configuration of electromechanical transducers 18a and 18b, wherein the plate elements 62a and 62b—as compared to the configuration described in connection with FIG. 6d-comprise recesses 76a-d adjacent to a region where the plate elements 62a and/or 62b are connected to the deformable elements via the spring elements 68. A distance between the recesses 76a-d and a side, facing the deformable elements, of the plate elements 62a and/or 62b may influence a stiffness of the plate element 62a and/or 62b within said region. The recesses 76a-d enable reduced restoring forces acting upon the deformable elements 22a-d.

In other words, FIGS. 6a-e show variants of implementing the movable elements and/or the electromechanical transducers. Said variants differ from a configuration as described in connection with FIG. 5, for example or particularly in that the elements 64a or 64b depicted in FIG. 5 were combined with the bracing 66 to form the spring elements 68. The configuration of FIG. 6a may have an increased level of stiffness toward parasitic tilting of the plate elements 62a and/or 62b about an axis perpendicular to the drawing plane (x/y plane). By analogy, the same may apply to the configurations of FIGS. 6b and 6c. In addition, all three configurations enable larger deflections of the bending beams as compared to the configuration of FIG. 5. In FIG. 5, the element 64a and/or 64b (bendable web) may be under tensile stress upon deflection of the beams, which tensile stress may result, as the deflection increases, in an increasing mechanical resistance against the beam deflection of the deformable elements. In the variants of FIGS. 6a-c, the mechanical connection of the two deformable elements may be configured to be clearly softer (less stiff) since the respectively connecting spring elements 68 may respond by a bending which, given corresponding configuration of said elements, represent a clearly reduced mechanical resistance.

The connecting elements/springs 68 and/or the elements/springs 64a-b described in connection with FIG. 5 may also have curved or meandering shapes. This enables increased flexibility in a favoured direction. The configurations as described in connection with FIGS. 6d and 6e enable a reduction of the tensile strain that would lead to effective stiffening of the deformable element. The configurations described in FIGS. 6a-e neglect inlet and/or outlet openings 26. If said openings are arranged, recesses and/or spring elements within the substrate may be dispensed with in regions where the opening is arranged. Alternatively or additionally, one, several or each of the spring elements 72a and/or 72b obtained by at least one recess may be implemented within the plate elements 62a or 62b on the basis of two or more mutually separate and independent spring elements.

FIGS. 7a-c described below will describe, by way of example, possible arrangements of deformable elements and plate elements.

FIG. 7a shows the deformable element 40 connected to the plate element 62. The plate element 62 may be arranged, e.g., directly at the deformable element 40.

FIG. 7b shows a configuration wherein the deformable element 40a is fixedly clamped between the substrate 14 and is configured to deform along the lateral direction 24. The deformable element 40 and the plate element 62 have two further deformable elements 40b and 40c arranged therein, the ends of which may be connected to each other. On the basis of the connections, the deformable elements 40b and 40c may be aligned to one another such that warpage of the respective deformable element 40b or 40c points away from the other deformable element. For example, the deformable elements 40a-c may be jointly controlled or may jointly react to the volume flow of the fluid; for example, joint control of the deformable elements 40a-c results in an increase of the adjustment travel, e.g. in an increase in the travel by which the plate element 62 is deflected. This means that the deformable element and the plate element may have at least one further deformable element arranged therebetween which is configured to increase an adjustment travel of the deformable element in case it is jointly controlled together with the deformable element.

FIG. 7c shows a configuration of the electromechanical transducer 18 wherein the deformable elements 40a-c comprise, in a central region, recesses 70a or 70b which enable fluidic coupling of a volume 82 present between the deformable elements 40b and 40c to a further partial cavity, e.g. the partial cavity 38a. The deformable elements 40a, 40b and/or 40c may each be configured in two parts so as to provide the recesses 78a and 78b. Alternatively or additionally, the recesses 78a and 78b may be configured as recesses which are enclosed, along a thickness direction (z direction), by a further material of the deformable elements 40a, 40b and 40c, respectively.

In other words, FIG. 7a shows a configuration with actuated S-shaped bending beams of FIG. 4, wherein a connection to the bending beam is arranged in the center of the rigid plate. To increase the level of deflection, several bending actuators may be arranged one behind the other in series. FIGS. 7b and 7c schematically show an arrangement of three serially connected S actuators. In accordance with further embodiments, two S actuators (deformable elements 40) or more than three actuators may be serially connected. The hatchings of the deformable elements in FIGS. 7a-c are depicted, e.g., in line with the hatchings selected in FIG. 4. Differences in hatchings may signify differing curvature directions of the respective portions. FIG. 7c shows a configuration which comprises, in the center of the S-shaped actuators, an opening (recesses 78a and 78b) enabling improved ventilation of the space in between (cavity 82).

Figure 7D:
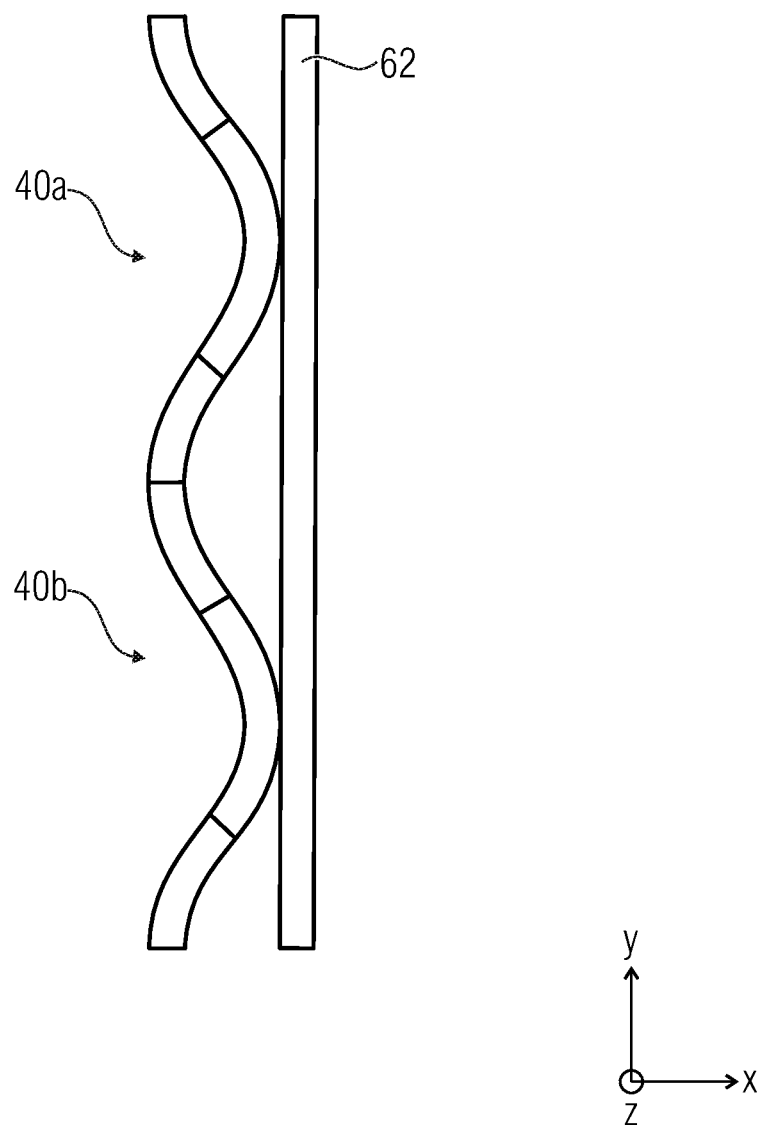
FIG. 7d shows a schematic top view of a configuration of the electromechanical transducer, wherein a first deformable element and a second deformable element are arranged in parallel with each other.

FIG. 7d shows a configuration of the electromechanical transducer, wherein a first deformable element 40a and a second deformable element 40b are arranged in parallel with each other along the y direction. This enables an increase in the action of force by which the plate element 62 is deflected. Ends of the deformable elements may be connected to one another or may jointly be arranged on the substrate. Alternatively, it is also possible for two or more deformable elements 40a and 40b to be arranged in parallel along a different direction, e.g. along the z direction (thickness direction). Alternatively or additionally, it is also possible to combine a series connection and a parallel connection of deformable elements.

Movable elements may come across a different movable element or a fixed element in the event of a high degree of, or excessive, deflection. This may result in sticking. The movable elements or the fixed elements may be provided with proximity elements (bollards), which enable significant reduction in the area of contact and, thus, enable reduction or avoidance of sticking. Instead of so-called bollards, it is also possible to arrange small structures configured as spring elements. In addition to avoiding sticking, the pulse which arises when two elements impinge may thus be reversed, whereby energy losses may be reduced or avoided and/or the dynamic behavior of the actuators may be improved.

Figure 8A:
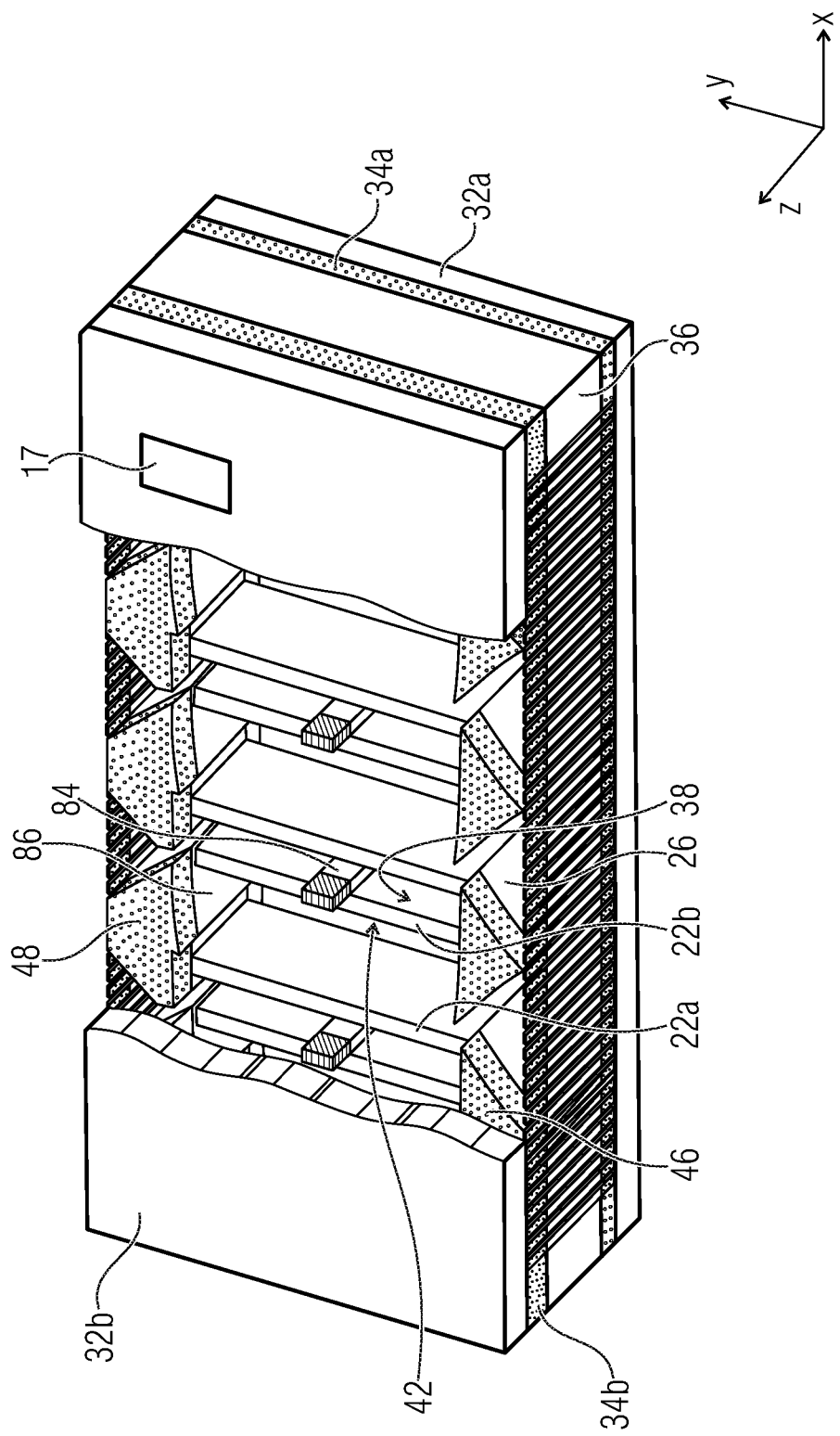
FIG. 8a shows a schematic perspective view of a MEMS transducer, wherein the deformable elements are alternatingly connected to the substrate and an anchor element, respectively, in accordance with an embodiment.

FIG. 8a shows a schematic perspective view of a MEMS transducer 80 wherein the deformable elements are alternatingly connected to the substrate and/or the intermediate layer 36 and/or to an anchor element 84 that is connected to the substrate. For example, the deformable element 22a is fixedly connected, at ends, to the substrate in the regions 46 and 48 of the intermediate layer 36 and is configured to perform an S-shaped movement, as is explained by way of example in connection with the deformable element 40. The adjacently arranged deformable element 22b is connected to the anchor element 84. The anchor element 84 is arranged in a central region of the deformable element 22b and may be connected thereto at the spacing layer 34a or the layer 32a. This means that the substrate may comprise an anchor element.

Sidewalls of the intermediate layer 36 which are arranged adjacently to movable ends of the deformable elements 22a or 22b may be shaped on the basis of a movement pattern of the deformable elements 22a and/or 22b.

Figure 8B:
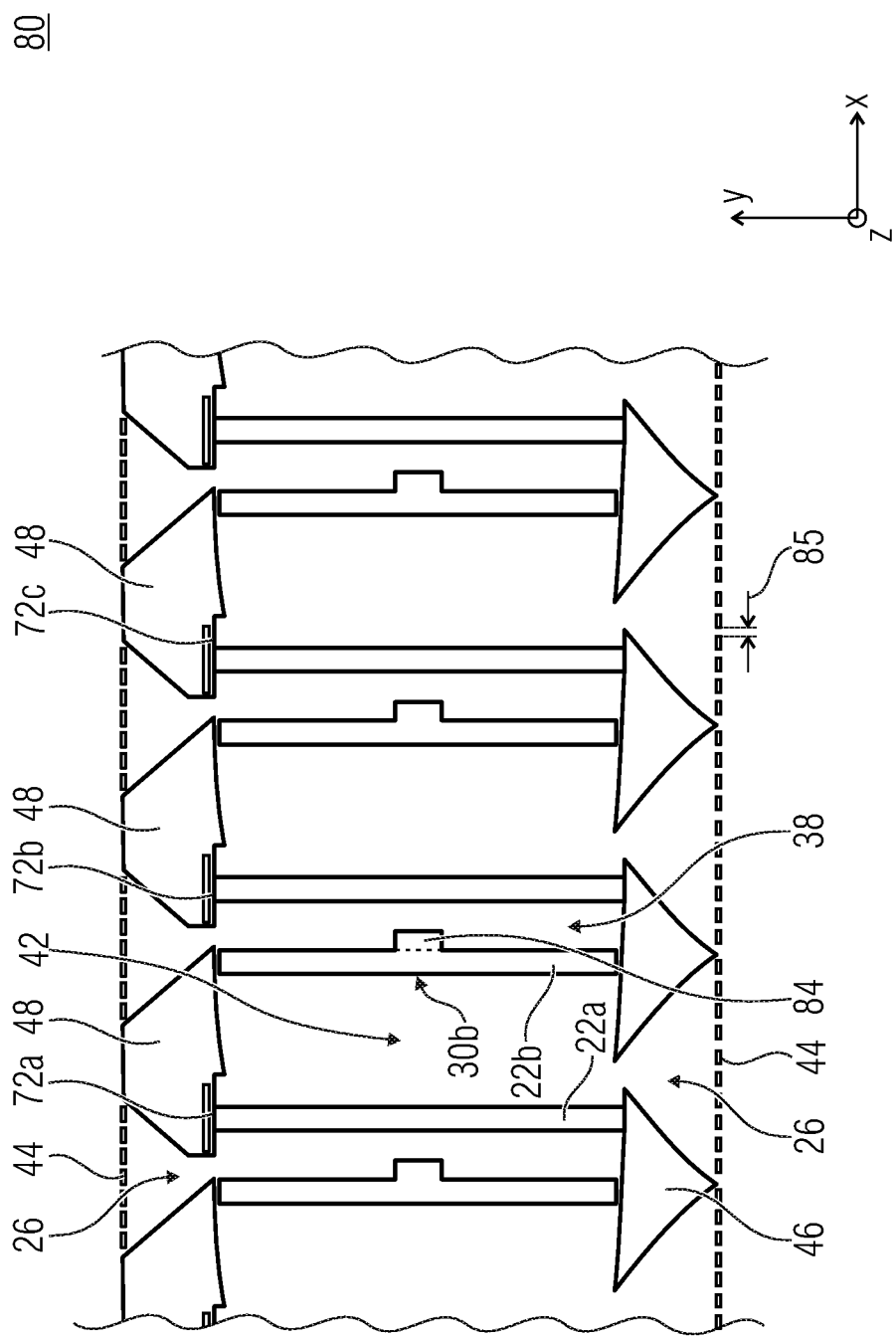
FIG. 8b shows a schematic top view of the MEMS transducer of FIG. 8a, in accordance with an embodiment.

FIG. 8b shows a schematic top view of the MEMS transducer 80, wherein the spacing layer 34b and the layer 32b are not shown by way of example. The MEMS 80 includes the bar elements 44 in regions of the openings 26. The regions 48 may comprise the spring elements 72a-c. The regions 48 are depicted, by way of example, as a top view of the intermediate layer 36.

The anchor element 84 may be integrally formed with the deformable element 22b and/or with a layer of the substrate. As depicted in FIG. 8, however, the anchor element 84 may project beyond the deformable element 22b along the z direction so as to connect the layers 32a and 32b to each other. This enables reduced susceptibility of the layers 32a and 32b to vibration. Alternatively, the anchor element 84 may also be formed of a different piece and/or of a different material than that of the mechanically deformable element 22b. The deformable element 22a, which is arranged adjacently thereto, is fixedly connected, e.g., on both sides to the substrate in the regions 48 or 46, for example in a positive or non-positive manner.

A distance 85 between bar elements 44 may be, e.g., smaller than 1 μm, than 0.1 μm or 0.05 μm.

The anchor element 84 may be arranged within a central region of the deformable element 22b. The central region may include, e.g., a geometric center of gravity the deformable element. The central region may be, for example, the beam segment 30b of the deformable element 40.

Figure 8C:
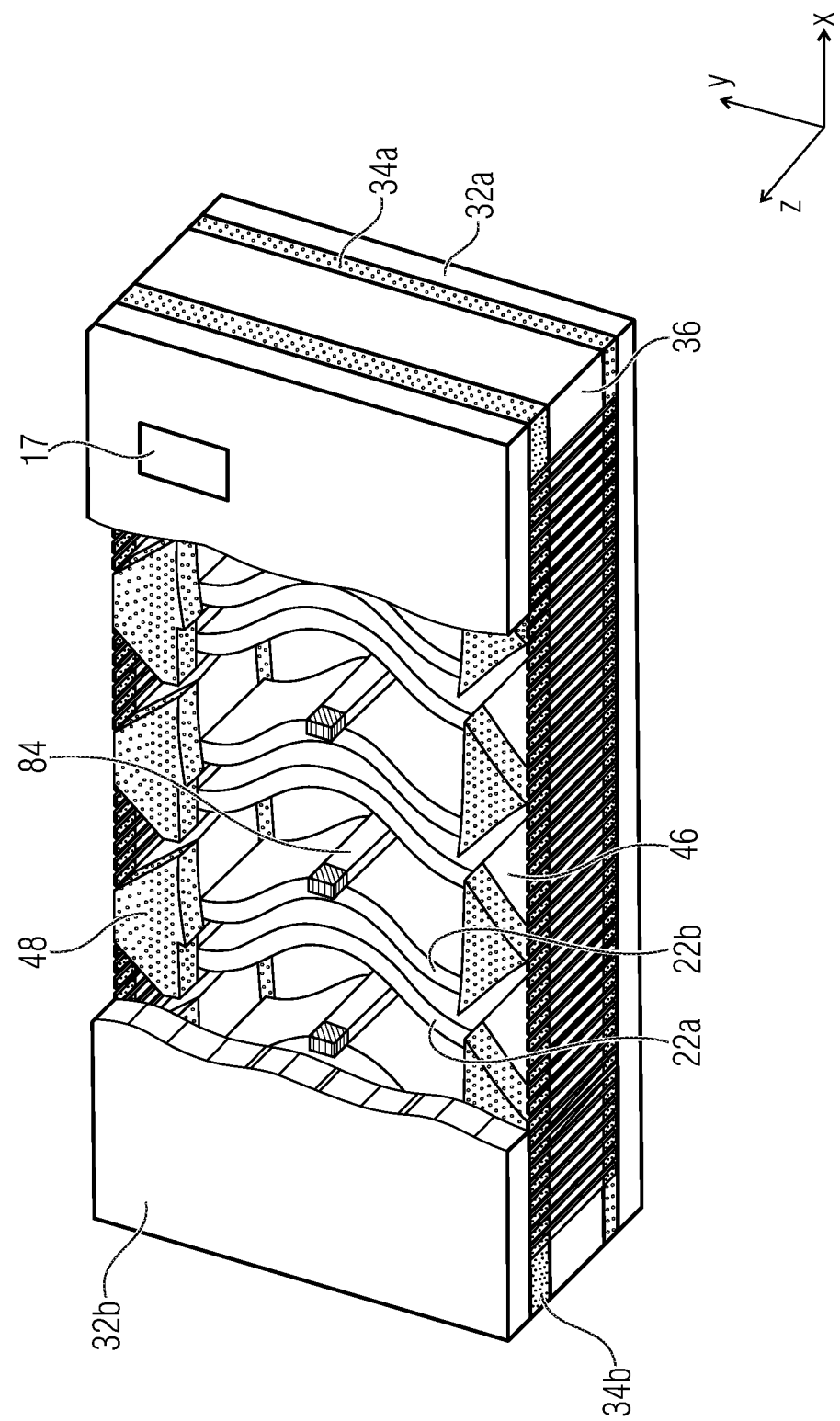
FIG. 8c shows a schematic perspective view of the MEMS transducer of FIG. 8a in a deflected state, in accordance with an embodiment.

FIG. 8c shows a schematic perspective view of the MEMS transducer 80 in a deflected state. Outer regions of the deformable element 22b may have moved in a direction toward the deformable element 22a, while locations of the outer ends of the deformable element 22a have essentially remained unchanged. A central region of the deformable element 22a may have moved in a direction of the deformable element 22b, while a location of the central region of the deformable element 22b has remained essentially unchanged on the basis of the anchor element 84.

Figure 8D:
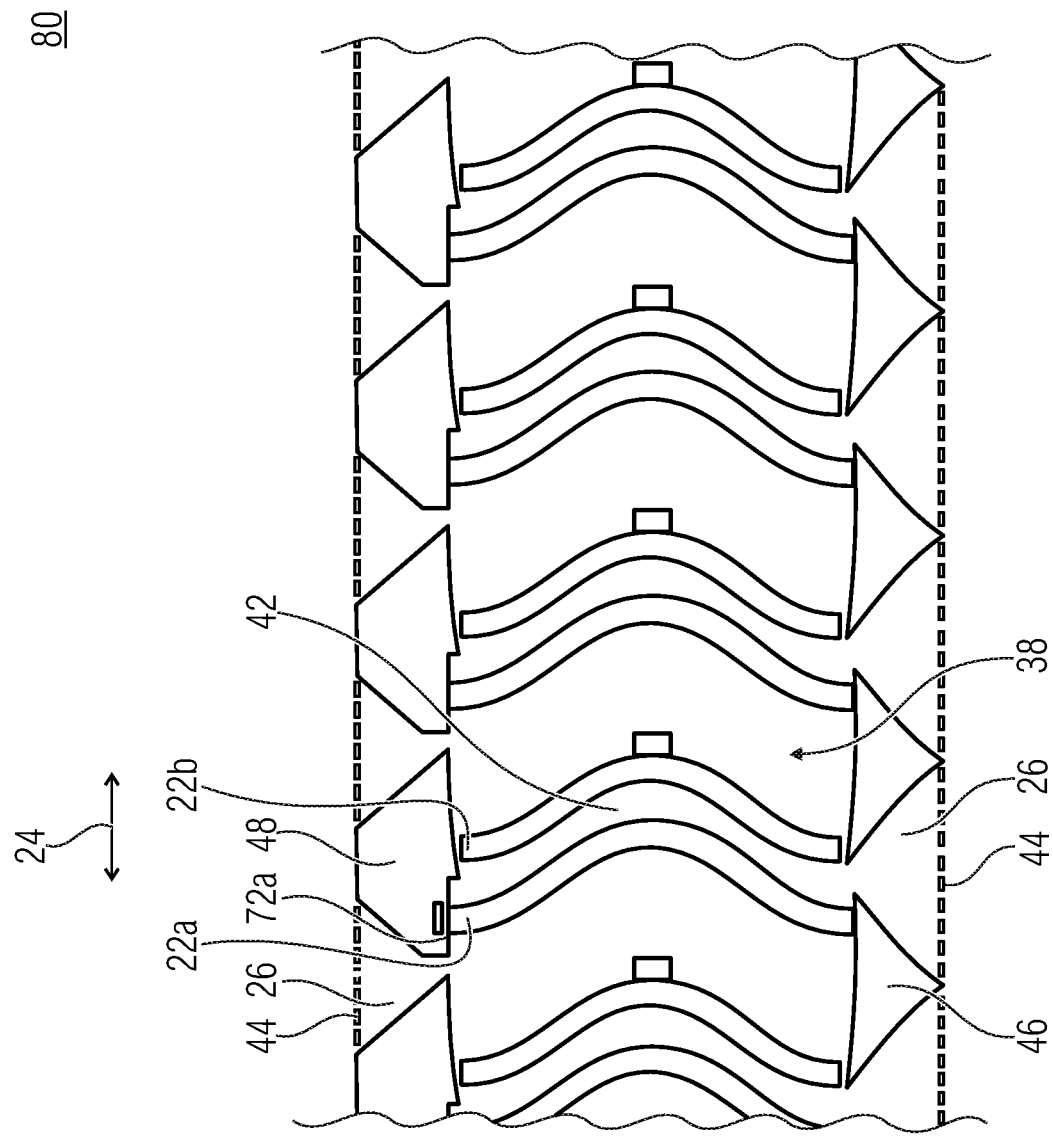
FIG. 8d shows a schematic top view of the MEMS transducer of FIG. 8b in the deflected state, in accordance with an embodiment.

FIG. 8d shows a schematic top view of the MEMS transducer 80 in the deflected state as described in FIG. 8c. As compared to the view of FIG. 8b, the volume of the cavity 42 is reduced, whereas a volume of the partial cavity 38 is increased. The spring element 72a may result in reduced application of force to the deformable element 22a; however, it may not be arranged. A first partial cavity 42 adjoining an opening 26 of the substrate may be arranged between the beam structures of the first electromechanical transducer and of the second electromechanical transducer, and/or between the actuators 22a and 22b.

In other words, FIGS. 8a and 8b show a schematic 3D presentation and a top view of a variant, respectively, wherein a chip surface area of the MEMS transducer can be exploited very efficiently. As in the basic configuration described in connection with FIGS. 2a-c, one may exclusively or predominantly use bending actuators, i.e. one may dispense with the additional rigid plate element. As illustrated in FIG. 8a, the chamber 42 is limited by two non-deflected S actuators 22a and 22b. The S actuator 22a presenting a limit on the left-hand side (negative x direction) may be connected, with both its ends, to the remaining structural element at the top and/or bottom of the drawing (i.e. along the positive or negative y direction). The S actuator 22b presenting a limit on the right-hand side may be attached to a post (anchor element) 84. Both ends of said S actuator may be freely movable. The post 84 may be fixedly connected to the upper and lower lids 32a and 32b, respectively. Upon application of a signal, both actuators will deform in the shape of a S. The spring element 72a which is depicted in a hidden manner in FIG. 8a and is influenced by a recess may serve to achieve strain relief. Within the drawing plane of FIG. 8b, the spring element is arranged within the element 48 along the lateral direction of movement 24, so that the spring element 72a is fixedly clamped along the lateral direction of movement 24. As depicted in FIG. 8, for example, the spring element 72a may have a fixed connection to the spacing layers 34a and 34b on the basis of said spacing layers, and may also be clamped. Alternatively, the layers 34a and 34b may also be patterned such that the spring element 72a has no contact with the spacing layer 34a and/or 34b and may thus exhibit more pliability.

As depicted in FIGS. 8c and 8d, the bulging warpings of the S actuator 22a may be moved toward the post 84, so that the center of the S actuator 22a almost touches the center of the S actuator 22b. At the same time, the free ends of the S actuator 22b have moved toward the fixed clamping of the S actuator 22a, so that they also almost touch each other. The actuated shapes of both S actuators may be approximately identical or actually identical, so that the chamber 42 may virtually or almost completely close upon sufficient deflection of the actuators. The original volume of the chamber 42 may thus be fully employed for generating the volume flow or for detecting same. To the same degree that the chamber 42 decreases in terms of volume, the chamber 38 may gain volume, whereby suitable dimensioning of the elements influencing the flows may prevent an excessive pressure difference, which may occur between the chambers 38 and 42 and is due to dynamic effects, from affecting the movement of the actuators. The elements 46 and 48 may be configured such that the distance from the free ends of the actuators 22b remains small and/or more or less constant independently of the deflection of the ends. To achieve strain relief of the actuators 22a, flexion spring elements 72a may be arranged, as described above.

Embodiments described above may include further actuators arranged within arising flow passages. The further actuators possibly may not serve to directly generate sound as may be enabled, for example, by the electromechanical transducers 18, but may be employable for variably setting the flow properties. Thus, e.g., attenuation and, consequently, the width of the resonance curve may be individually adapted in a flexible manner and as needed for each chamber during operation of the structural element (MEMS transducer).

In the estimation given at the outset, the change in volume per active area (ΔV/A) for a membrane loudspeaker in accordance with conventional technology was estimated to be 3.75 µm. As will be explained below, this may be re-estimated for a MEMS transducer depicted in FIGS. 8a-c by means of dimensions which are useful in microcircuitry technology so as to obtain an estimation for an active area ΔV/A. To this end, a width of the actuators (in FIG. 8a in the x direction) may be assumed to have a value of 5 µm. The width of the post 84 may have a value of 5 µm as well. The distance of the actuators which form the sidewalls of chamber 38 (e.g. in FIGS. 8a and 8b in the non-deflected state) may be assumed to be 10 µm. A distance of the actuators which form the sidewalls of the chamber 42 (FIGS. 8a and 8b in the non-deflected state) may be assumed to be 100 µm. A planar filling factor $F_p$, which may indicate which proportion of the active area may be used for generating a volume flow, may then yield $F_p=100/(5+100+5+10)=83\%$.

ΔV/A may be expressed as: $\Delta V/A = A \times F_p h/A = F_p h$

In the above expression, h may indicate the height of the chamber (e.g. the z direction in FIG. 8a). In simplified terms, merely the actuator height may be assumed for this purpose. A thickness of the spacing layers 34a and 34b may be neglected. As compared to the above 3.75 µm for the membrane loudspeakers, it becomes clear that an actuator height of merely 3.75 µm/$F_p$ (i.e. 4.5 µm) will already be sufficient for providing the same volume flow per active area. With an actuator thickness h of approximately 50 µm, which may be produced in micromechanical technology without any additional overhead, the value may already exceed that of the MEMS membrane loudspeaker by a factor of 10.

In embodiments in accordance with the MEMS transducer 80 which are configured without any rigid plates, parasitic vibrations may be considerably easier to deal with or to be reduced, due to the clearly reduced number of mechanical elements and mechanical connections, than in variants comprising the plate elements and possibly further deformable elements between the deformable element and the plate element. Serially connecting of actuators as depicted in FIGS. 7b and 7c, for example, may serve to achieve larger strokes and/or larger forces.

Figure 9:
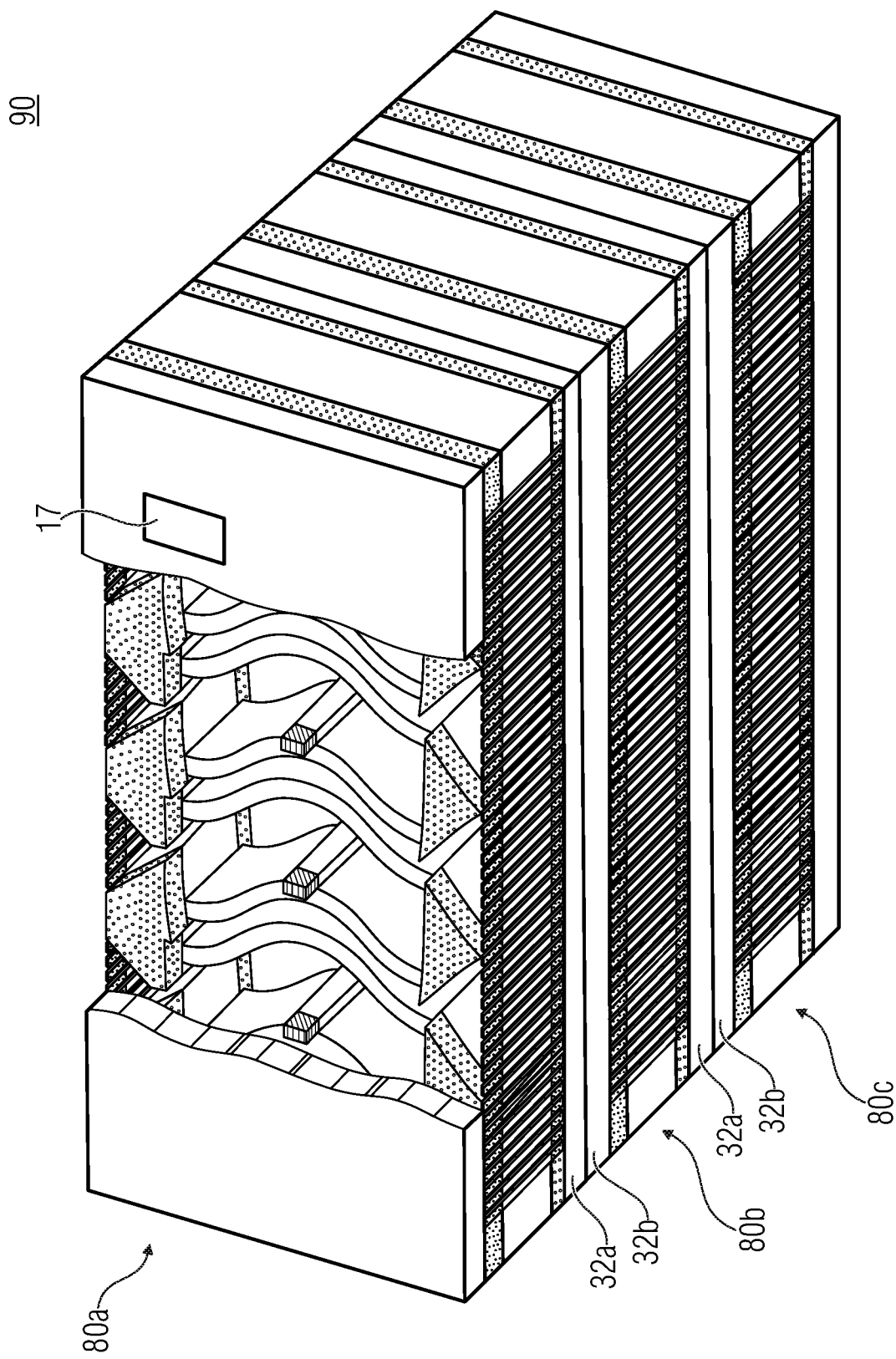
FIG. 9 shows a schematic perspective view of a stack comprising three MEMS transducers, in accordance with an embodiment.

FIG. 9 shows a schematic perspective top view of a stack 90. The stack 90 includes a MEMS transducer 80a, which is connected to further MEMS transducers 80b and 80c to form the stack 90 and is arranged within the stack 90. The electromechanical transducers of the MEMS transducer 80a and of a further MEMS transducer 80b and/or 80c may be jointly controllable. This means that while the chip surface area remains the same, a volume flow which may be produced or detected increases. Even though the stack 90 is described to include the MEMS transducers 80a, 80b and 80c, other MEMS transducers 10, 20 and/or 50 may be arranged alternatively or additionally. Even though the stack 90 is described to include three MEMS transducers, the stack 90 may also include a different number of MEMS transducers, e.g. two, four, five, six or more MEMS transducers. The cavities or partial cavities of the MEMS transducers and/or of adjacent MEMS transducers, which are arranged within the stack 90, may be connected to one another. The cavities or partial cavities may be connected, e.g., by openings provided in layers between individual MEMS transducers. The electronic circuit 17 may be configured to control one or more of the MEMS transducers, i.e. to provide the conversion between a deformation of the deformable element and an electric signal. Thus, the stack 90 may comprise at least one, but also several electronic circuits 17.

In other words, wafers, or chips, (MEMS transducers) may be stacked, for example, by means of bonding methods on the basis of silicon technology, so that in this case, as opposed to classical membrane loudspeakers, a further increase in the volume flow may result. When employing technologies for thinning the individual wafers, or chips, prior to stacking, the height of the stack may be kept small. Such a technology may include, e.g., an etching process and/or a grinding process.

A reduction in layer thicknesses of the layers 32a and/or 32b, which are arranged adjacently to each other, may be performed to such an extent that one or even both said layers are removed. Alternatively or additionally, in order to reduce the height of the stack, a manufacturing process may be performed such that specific lower and/or upper lids (layers 32a and/or 32b) are dispensed with. For example, the stack 90 might be configured such that the MEMS transducers 80b and/or 80c are each implemented without a layer 32b.

Figure 10:
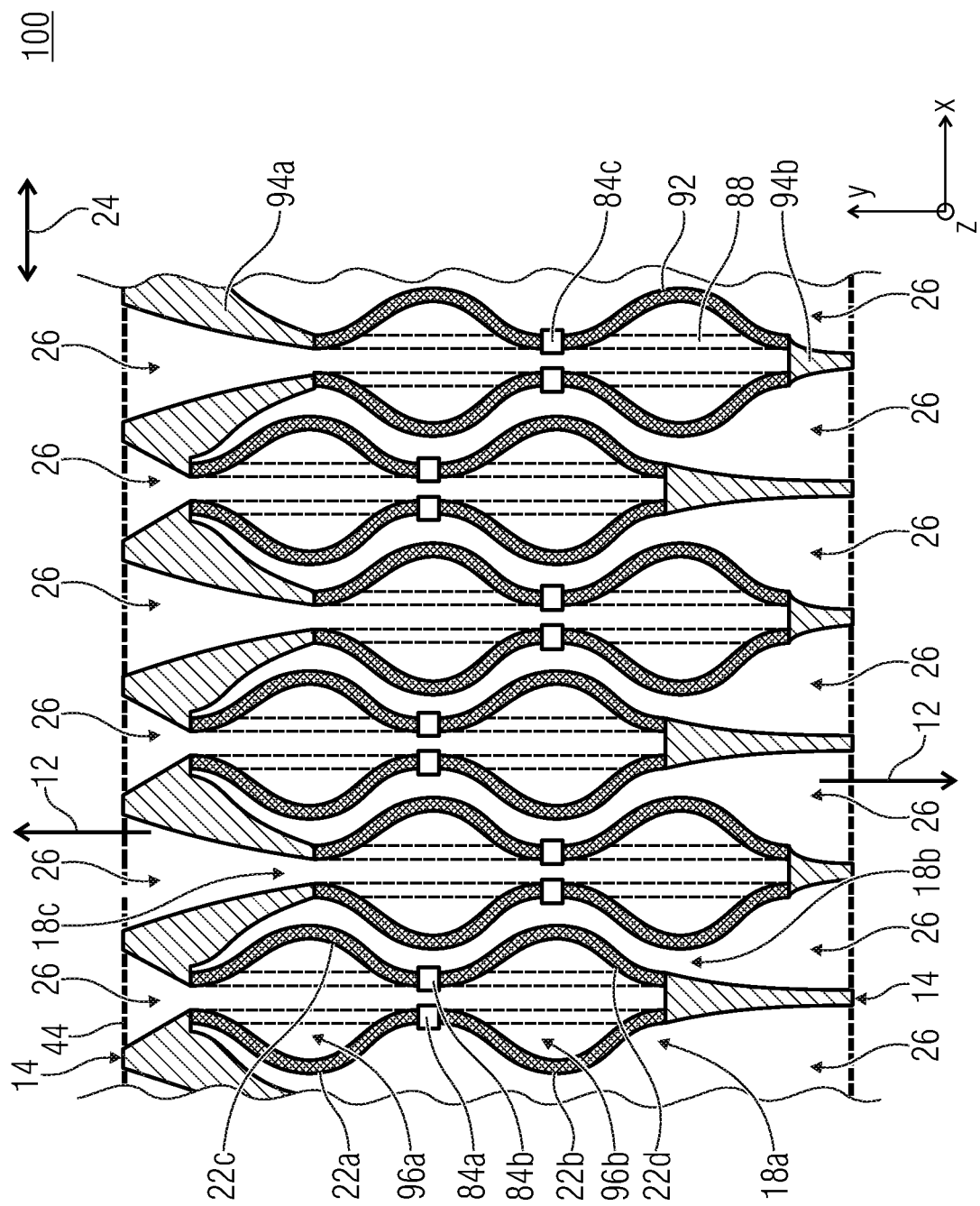
FIG. 10 is a schematic perspective top view of a section of a MEMS transducer which has deformable elements arranged between sides of the substrate, in accordance with an embodiment.

FIG. 10 shows a schematic perspective top view of a section of a MEMS transducer 100, wherein deformable elements 22a-d are arranged between sides of the substrate 14. The deformable elements 22a and 22b are indirectly connected via the anchor element 84a. This means that ends of the deformable elements 22a and 22b may be fixedly connected to the substrate, possibly to the anchor element 84a, and may therefore be (fixedly) clamped. This means that the deformable elements 22a-d or other deformable elements in accordance with further embodiments may each comprise a beam structure. The beam structure may be fixedly clamped at a first end and at a second end. Clamping of ends of a deformable element 22a-d and/or of a beam structure enables a reduction or marked reduction of the pre-deflection of the deformable elements (e.g. due to layer tension gradients). Thus, the gaps between the lids and the actuators may be much smaller, which has considerable advantages in terms of efficiency for several applications.

The deformable elements 22a-d are fixedly clamped on both sides in each case, for example. Fixed clamping may be obtained by arranging or producing the deformable elements 22a and/or 22b at the substrate 14 and/or at an anchor element 84a and/or 84b. Dashed lines 88 indicate a non-deflected state, whereas continuous beams 92 indicate a deflected form of the deformable elements 22a-d. Implementations or elements 94a and 94b of the substrate 14 may enable positioning of the deformable elements 22a-d along the y direction. A pair-wise position of electromechanical transducers 18a-c may be displaced on the basis of the elements 94a and 94b. Electromechanical transducers 18a and 18b which are arranged adjacently and/or in pairs in relation to one another may be deformable in a mutually opposite manner.

The deformable element 22a and possibly an oppositely located deformable element 22c may be configured to influence, i.e. to increase or reduce, a partial cavity portion 96a on the basis of the deformation, and/or to perform deformation on the basis of the volume flow within the partial cavity portion 96a. The deformable element 22b and possibly the oppositely located deformable element 22d may be configured to influence a partial cavity portion 96b. The partial cavity portions 96a and 96b may be connected to each other, for example in a region of the anchor elements 84a and 84b. Deformation of the deformable elements 22a-d may be obtained such that the deformable elements 22a and 22c, and 22b and 22d, respectively, will deform at different frequencies, i.e. a change in volume within the partial cavity portion 96a may occur at a frequency which differs from a frequency at which a volume of the partial cavity portion 96b changes. For example, if the MEMS transducer is used as a loudspeaker, different frequencies may be obtained within the partial cavity portions on the basis of the change in volume which differs in terms of frequency. If the MEMS transducer 100 is used as a microphone, for example, the partial cavity portions 96a and 96b may have different resonant frequencies, for example. Alternatively, further partial cavity portions and further deformable elements may be arranged along the y direction, so that the MEMS transducer 100 may generate further frequencies or may comprise further resonant frequencies, for example.

Alternatively, the deformable elements 22a and 22b or the deformable elements 22c and 22d may also be directly connected to each other. For example, anchor elements may be arranged within a central region of one or more deformable elements 22a-d so as to influence deformation of the deformable elements 22a-d. This means that the deformable elements 22a and 22b may be directly connected to each other. Alternatively, it is also possible for a spring element or a different element to be arranged between the deformable elements 22a and 22b.

The MEMS transducer 100 may be configured such that during a first time interval, the volume flow 12 is obtained, in a positive y direction, from openings 26 and, subsequently, during a second time interval, the volume flow 12 is obtained, in a negative y direction, from openings 26.

In other words, FIG. 10 shows a configuration wherein again, possibly exclusively, S-shaped actuators are arranged. To illustrate the principle, the S-shaped actuators may be presentable in the figure both in an actuated manner (continuous lines 92) and in a non-actuated manner (dashed lines 88). The actuated and the non-actuated states may be exchangeable by means of a corresponding design. The S-shaped actuators (deformable elements 22a-d) may be clamped both at one (upper end) of their ends and at the other one (lower end) of their ends. The anchor elements 84a-b may be used for this purpose. The anchor elements 84a-b may be formed from the layers 34a, 36 and 34b and be connected to a layer 32a and/or 32b. Distances between the free ends of the S-shaped actuators and elements 94a or 94b may be dispensed with on the basis of this configuration. This may enable smaller losses in terms of bypass flow. A starting substrate may be processed such that the actuators may be produced therefrom; the starting substrate may comprise layer tension gradients, or layer tension gradients may be introduced during production of the actuators. A deflection of the deformable elements which is induced thereby may be reduced or prevented on the basis of the arrangement of the anchor elements 84a and/or 84b. In particular, suspending the deformable elements on both sides may result in a reduction or prevention of deflection thereof in the direction of one of the layers 32a or 32b. The spacing layers 34a and/or 34b may be designed to be thinner accordingly, which in turn may result in a reduction in losses in terms of bypass flow. Each chamber (partial cavity portion 96a or 96b) may be limited by two S-shaped actuators. In the example of FIG. 10, two chambers may be serially connected. The number of serially connected chambers may be selectable on the basis of a surface area made available on the chip while taking into account the acoustic properties, in particular the resonant frequency of the S-shaped actuators and/or of the actuator chamber system, and may vary between 1 and a large number, e.g. more than 3, more than 5 or more than 10.

The elements 94a and 94b may be optionally arranged, i.e. the MEMS transducer 100 may also be configured without said elements. For example, if a corresponding part of the actuator is not deflected because of a specific design or control of the electromechanical transducers and/or of the deformable elements, a distance from the substrate 14 by means of elements 94a or 94b may be dispensed with. A multiple-S actuator (wavy actuator) may be configured. In particular, this enables obtaining low resonant frequencies on the basis of said arrangement since a resonant frequency of the beam (of the deformable element) may decrease as the length increases.

FIG. 1a shows a schematic top view of a section of a MEMS transducer 110, wherein the electromechanical transducers 18a-b are obliquely arranged, as compared to the configuration of FIG. 10, in relation to a lateral direction of the substrate 14, e.g. the x direction. With an extension along the y direction which is identical to that of the MEMS transducer 100, the electromechanical transducers 18a-b may have longer axial extensions. This may enable larger partial cavity portions 96a and/or 96b and/or a larger number of serially connected partial cavity portions and/or deformable elements.

An outer beam segment 30a of a deformable element may be indirectly connected to an outer beam segment 30c of a further deformable element via the anchor element 84. Alternatively, the beam segments 30a and 30c may also be immediately, i.e. directly, connected to each other.

Figure 11A:
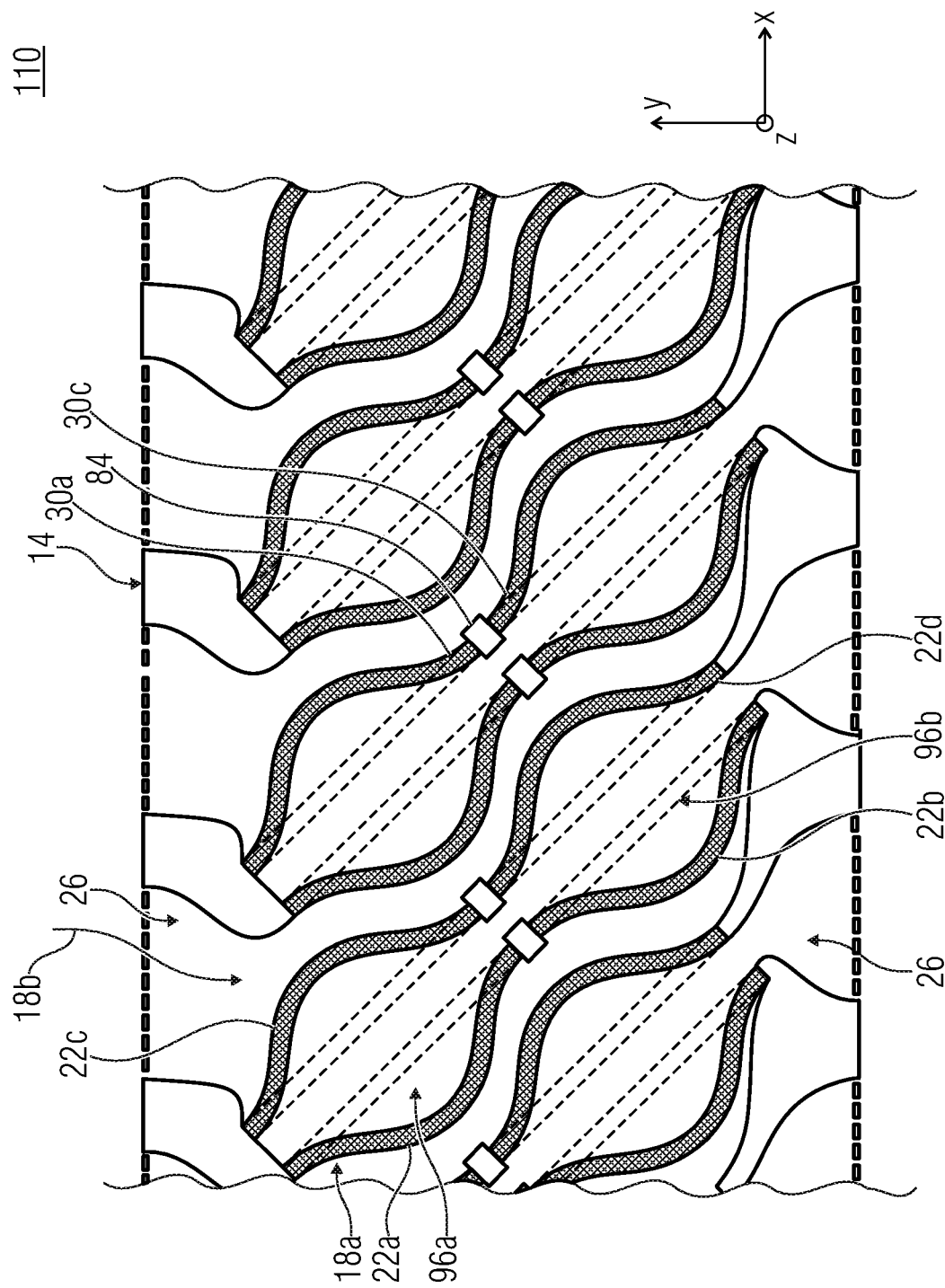
FIG. 11a shows a schematic top view of a section of a MEMS transducer, wherein the electromechanical transducers are disposed in an oblique manner in relation to a lateral direction of the substrate, in accordance with an embodiment.

In other words, FIG. 11a depicts a further embodiment wherein the active area is rotated by 45° as compared to the illustrations of FIG. 10; the chip surface area which is available may possibly be used to a larger extent. Funnel-shaped openings 26 may be designed such that the sound may be emitted perpendicularly to the chip edge area, i.e. along the y direction in a positive or negative direction thereof.

Each of the above-described deformable elements may also be formed as a multitude of interconnected deformable elements.

Figure 11B:
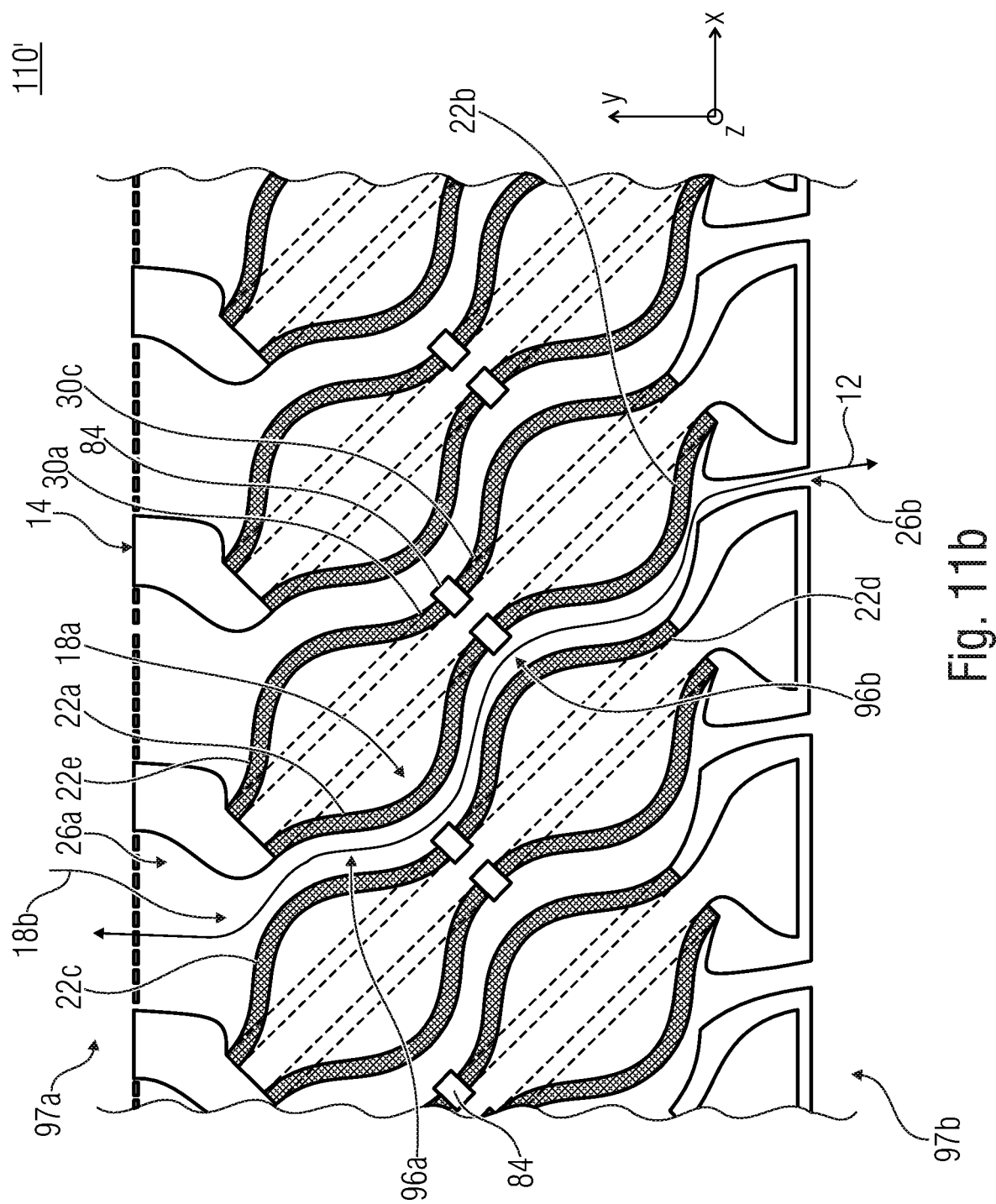
FIG. 11b shows a schematic top view of a section of a MEMS transducer which may be employed as a pump, in accordance with an embodiment.

FIG. 11b shows a schematic top view of a section of a MEMS transducer 110', which may be used as a pump, for example. As compared to the MEMS transducer 110 of FIG. 11a, the partial cavity portions 96a and 96b may be connected to surroundings of the MEMS transducer 110' via two openings 26a and 26b. The partial cavity portions 96a and 96b may be connected to a first side 97a of the MEMS transducer 110' via the opening 26a and may be connected to a second side 97b of the MEMS transducer 110' via the opening 26b. The first side 97a and the second side 97b may be arranged to be oppositely located, for example. Alternatively, the sides 97a and 97b may also be at an angle to each other. For example, one of the sides 97a or 97b may comprise a side face of the MEMS transducer 110', and the other side 97b or 97a may include a main side (e.g. a top or a bottom side) of the MEMS transducer 110'.

On the basis of a deformation of the deformable elements 22a-d, the fluid flowing from the first side 97a to the second side 97b or vice versa may be producible through the MEMS transducer 110'. For example, during a first time interval, the deformable elements 22a and 22c may be deformed and the volume of the partial cavity portion 96a may be reduced. During a second time interval, the volume of the partial cavity portion 96b may be reduced. On the basis of an order of the decrease or increase of the volumes, a direction of the volume flow 12 may be influenced.

Alternatively, it is also possible to arrange several partial cavity portions one behind the other or to arrange one partial cavity portion only.

In simplified terms, the function of a pump may be obtained in that the volume flow 12 is generated in accordance with a principle of flowing through the MEMS transducer, instead of back and forth, by analogy with a loudspeaker. An entry side and an exit side of the MEMS transducer may be arranged opposite each other, but may alternatively also be arranged at an angle to each other or be arranged on the same side and be positionally or fluidically spaced apart from each other. The cavity including the partial cavity portions 96a and 96b may comprise the openings 26a and 26b in the substrate. At least one of the electromechanical transducers 18a or 18b may be configured to provide the volume flow 12 on the basis of the fluid. For example, at least one of the electromechanical transducers 18a or 18b may be configured to convey the fluid, on the basis of actuation of the electromechanical transducer, through the first opening 26a in a direction toward the cavity or to convey the fluid, on the basis of said actuation, through the second opening 26b in a direction away from the cavity, or vice versa.

Even though a pump function is described in connection with the MEMS transducer 110', other embodiments described here may also be usable as a pump or micropump, for example in that an arrangement of openings of the cavity, partial cavity or at least one of a partial cavity portion is adapted.

If the deformable elements 22a and 22e are deflected at the same time, a negative pressure (alternatively, excess pressure) may result within an interposed volume, which pressure counteracts the deformation or deflection. The volume may have an opening, e.g. within layer 32a and/or 32b, so that equalization of pressure within said volume is enabled. This facilitates efficient operation of the MEMS transducer 110'.

FIG. 12a shows a schematic view of a MEMS transducer 120, which may be used as a MEMS pump, for example, in a first state. The MEMS transducer 120 comprises, e.g., two deformable elements 22a and 22b, which have a beam structure and are clamped or fixedly clamped at the substrate 14 on both sides. Alternatively, the MEMS transducer 120 may also be configured with one deformable element or with more than two deformable elements.

FIG. 12b shows the MEMS transducer 120 in a second state. On the basis of a deformation of at least one deformable element 22a and/or 22b, the second state may be obtained starting from the first state as depicted in FIG. 12a. Starting from the second state, the first state may be obtained on the basis of a recovery of the deformable element(s) in terms of shape. In the second state, the partial cavity 38 between the deformable elements 22a and 22b is larger as compared to the first state, for example. During a transition from the first to the second states, a negative pressure may arise within the partial cavity 38. During a transition from the second state to the first state, a negative pressure may arise within the partial cavity 38.

A deformable element 22a and 22b, respectively, and the substrate 14 have a partial cavity 42a and 42b, respectively, arranged between them, the volumes of which may be decreased or increased, respectively, in a manner that is complementary to the volume of the partial cavity 38; an excess pressure or negative pressure, respectively, may also be obtained, in a manner that is complementary to the partial cavity 38, on the basis of the deformation of the deformable elements.

In a region of a respective opening 26, a valve structure 85a-f may be arranged. One or more valve structures 85a-f may be formed from a material of the substrate 14, for example. The valve structures may be integrally formed with one or more layers of the substrate 14 and may be produced, for example, by means of an etching process.

The valve structures may be configured to impede, i.e. to reduce or to prevent, passage of the volume flow 12 through the opening 26 at least along one direction. For example, the valve structures 85b, 85d and 85f may be configured to reduce or prevent exit of the fluid from the respective partial cavity. Alternatively or additionally, the valve structures 85*a*, 85*c* and 85*e* may be configured to reduce or prevent entry of the fluid into the respective partial cavity. One or more valve structures 85*a-f* may be passively configured, e.g. as bending beam structures or tongue structures clamped on one side. Alternatively or additionally, one or more valve structures 85*a-f* may be actively configured, e.g. as electromechanical transducers or deformable elements. In simplified terms, the valve structures 85*a-f* as well as the other actuators (electromechanical transducers) of the MEMS transducer may be able to be actuated.

The valve structure 85*d* may be configured, e.g., to allow the volume flow 12 to flow into the partial cavity 38 on the basis of a negative pressure within the partial cavity 38, while the valve structure 85*c* simultaneously reduces or prevents entry of the volume flow 12 into the partial cavity 38. If, as shown in FIG. 12*b*, an excess pressure arises within the partial cavity 38, the valve structure 85*c* may be configured to allow the volume flow 12 to flow out of the partial cavity 38 on the basis of the excess pressure, while the valve structure 85*d* simultaneously reduces or prevents exit of the volume flow 12 from the partial cavity 38.

A function of the valve structures 85*a*, 85*b*, and 85*e* and 85*f*, respectively, may be identical with or comparable with regard to the partial cavities 42*a* and 42*b*, respectively. The valve structures 85*a-f* may also be referred to as check valves, and they enable, e.g., setting of a favoured direction of the volume flow 12.

Although the MEMS transducer is described to the effect that, e.g., the volume flow flows from the partial cavities 38, 42*a* and 42*b* along the same direction (positive y direction) and during different time intervals during which transition occurs between the first and second states, the valve structures may also be arranged such that the volume flow flows from at least one partial cavity 38, 42*a* or 42*b* along a different direction, e.g. the negative y direction.

Even though the MEMS transducer is described such that the valve structures 85*a-f* are arranged at each opening 26, valve structures may alternatively not be arranged at any opening 26 or be arranged only at a few openings 26.

Even though the valve structures may be passively configured for acting as check valves, the valve structures may also be actively configured, which means they may be controllable and may provide an opened or closed state of the valve in the sense of actuators on the basis of said control. In particular, two valve structures 85*a* and 85*b*, 85*c* and 85*d* or 85*e* and 85*f*, which are associated with one partial cavity in each case, may be controlled such that pressure pulses arise within the fluid flow 12, e.g. by a control means connected to the MEMS transducer. For example, actuation of the electromechanical transducers 18 may be effected such that an excess pressure or negative pressure is built up within the fluid inside the partial cavities 42*a*, 42*b*, and that it is only thereafter that opening of the valve structures 85*a-f* is controlled.

In other words, by means of such pressure pulses, it is also possible to achieve an approximate imitation of a low-frequency sound wave by means of short pressure pulses. By using several chambers serially arranged one behind the other, this may occur in an almost continuous manner. Similarly, this is also possible with chambers which are adjacent to one another in parallel. FIG. 12*a* shows an example in a non-actuated state, wherein each chamber is provided, at the top and at the bottom, with one valve each which may be configured to be active. Each valve may be opened or closed individually. Partial opening/closing is also feasible. The valve beams may be designed and/or operated exactly like the movable sidewalls, i.e. the deformable elements. They may thus be based on the same or identical actuator principle. In this context, said valve bending beams may also be configured to be movable in both directions, and/or to close the opening (by means of a corresponding counterforce to be applied by the bending actuator valve) upon a fluid flow (i.e., to close it except for a very little gap, which is needed for the movement). This setup ensures full flexibility for controlling the fluid flow with regard to direction and/or negative/excess pressure, specifically individually for each chamber. If the direction for the fluid flow is determined, one may also work with stops for the valve beams ("check valve").

In yet other words, in the first state, the central chamber (partial cavity 38) may be expanded by the two actuators depicted to be dark (deformable elements 22*a* and 22*b*), while the two outer chambers (partial cavities 42*a* and 42*b*) are compressed. The first chamber fills up with the fluid from the lower region via the check valve 85*d*. The latter press fluid into the upper region by means of the check valve 85*a* and/or 85*e*. In the second state, the central chamber is compressed. Fluid is pressed into the upper region. The outer chambers fill up with the fluid from the lower region.

Figure 13:
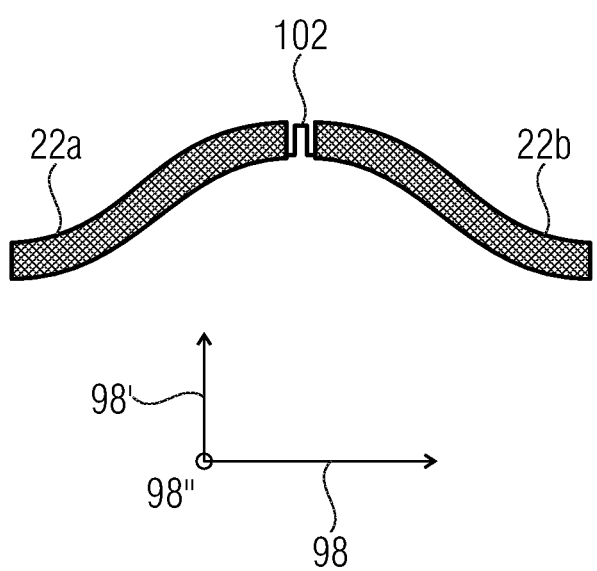
FIG. 13 shows a schematic view of two deformable elements connected to each other along a lateral extension direction, in accordance with an embodiment.

FIG. 13 shows a schematic view of a first deformable element 22*a* and of a second deformable element 22*b*, which are connected to each other along a lateral extension direction 98 of the deformable element 22*a* and/or 22*b*. A spring element 102 is arranged between the deformable element 22*a* and the deformable element 22*b*. The spring element 102 may cause reduced mechanically induced restoring forces in the deformable elements 22*a* and 22*b*. For example, the spring element 102 may exhibit a small level of stiffness in a direction 98' arranged perpendicularly to the direction 98, and may exhibit a large degree of stiffness along a direction 98", which may be spatially arranged perpendicularly to the directions 98 and 98'. The deformable elements 22*a* and 22*b* and the spring element 102 may be arranged within the MEMS transducer 110 as the deformable element 22*a*, for example.

In other words, suitable spring elements 102 may be arranged in order to achieve a strain relief of the S-shaped actuators 22*a-d*, which are clamped on both sides, at clamping locations or, e.g., also in a region between clamping locations, for example centrally, of the actuators. For example, the spring element 102 is employed in the center of the actuators and is particularly flexible in the desired direction (98') and is stiff in the two directions (98 and 98"), i.e. it exhibits a high or relatively high level of stiffness. The spring element 102 may be arranged between deflectable ends of the deformable elements 22*a* and 22*b*. The spring element 102 may comprise a lower level of stiffness along the lateral direction of movement 24 than in a direction that is perpendicular to the lateral direction of movement 24.

Figure 14:
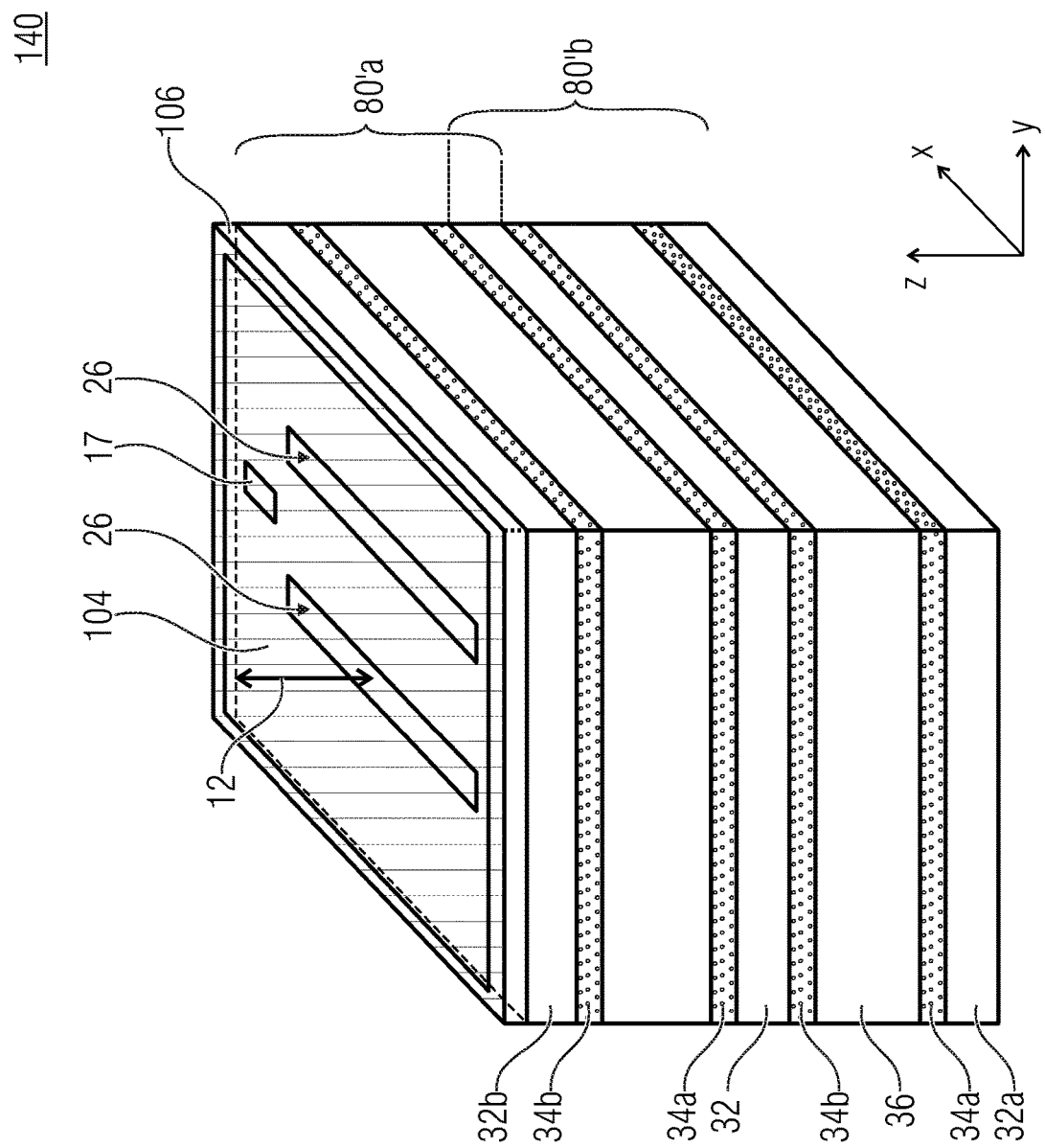
FIG. 14 shows a schematic view of a stack including two MEMS transducers which are connected to each other and share a layer, in accordance with an embodiment.

FIG. 14 shows a schematic view of a stack 140 including a MEMS transducers 80'*a* and a MEMS transducer 80'*b*, which are connected to each other and comprise a shared layer 32 as compared to the MEMS transducer 80, which means that a layer 32*a* or 32*b* of the MEMS transducer 80 has been removed. The electronic circuit 17 may be configured to jointly control the MEMS transducers 80'*a* and 80'*b*. As an alternative thereto, each of the MEMS transducers 80'*a* and 80'*b* may comprise an associated electronic circuit.

In addition, the MEMS transducer 80'*a* has the openings 26 within the layer 32*b*, which means that as compared to the MEMS transducer 80, a radiation direction of the volume flow 12 and/or an entry direction of the volume flow 12 is perpendicularly tilted. This means that a lid surface of the MEMS transducer may form an outer side of the stack; the MEMS transducer may have an opening in the lid surface which is arranged to face away from a side which faces the second MEMS transducer, the volume flow 12 of the MEMS transducer 80'a exiting or entering the cavity perpendicularly or opposite to the volume flow of the MEMS transducer 80'b.

The MEMS transducer 80'a may have a membrane element 104 arranged thereon. The membrane element 104 may be arranged such that exit of the volume flow 12 from the cavity and through the membrane element 104, or entry of the volume flow 12 into the cavity 16 may be at least partially prevented. The cavity may extend to regions which are arranged outside the MEMS transducer 80'a and are arranged between the MEMS transducer 80'a and the membrane element 104. On the basis of the volume flow 12, deflection of the membrane element 104 may be causable. The membrane element 104 may be arranged on the MEMS transducer 80'a by means of a frame structure 106, for example. The frame structure 106 may be arranged on a side of the MEMS transducer 80'a, for example on a main side of the layer 32b.

Alternatively, it is also possible to perform tilting by an angle other than 90°. The MEMS transducer 80'b may comprise openings at or within the layer 32b, so that the volume flow 12 may enter into and/or exit from cavities on two sides of the stack 140, said sides being arranged to be opposite each other.

Alternatively or additionally, the stack 140 may also comprise a further or another MEMS transducer, e.g. the MEMS transducer 20 or 80. For example, the MEMS transducer 20 may be arranged between the MEMS transducers 80'a and 80'b. This enables entry or exit of the volume flow 12 into or from cavities along a direction that is perpendicular to a corresponding direction of the MEMS transducer 80'a.

In other words, the sound exit openings 26 may also be mounted in the lower lid 32a and/or in the upper lid 32b rather than on the chip side faces. FIG. 14 shows a corresponding simplified representation. The openings 26 in the upper lid 32b are discernible. Similar openings may be located in the lower lid 32b, but cannot be discerned because of the perspective view. The layer 32 may also comprise openings, i.e. cavities, partial cavities and/or partial cavity portions of the MEMS transducers 80'a and 80'b may be connected to one another. Chambers which are vertically (along the z direction) superimposed may be connected to one another via the openings within the layer 32.

A grid which includes one or more bar elements (grid webs) 44 and may be configured for setting the attenuation and may be configured, in particular, as a protection from particles, may be implemented in a simple manner also in the variant described in FIG. 14. For example, the openings 26 in the upper lid 32b and/or the lower lid 32a may be configured by means of a wet- or dry-chemical etching process. Prior to etching, the desired grid may be patterned in an additionally applied thin layer, which has a suitably high selectivity toward etching of the openings. For etching the openings 26, an etching process having a suitably high level of isotropy and/or lateral undercutting may now be selected, so that undercutting of the grid webs 44 may result. By way of example, the grid may be produced in a silicon oxide or nitride layer, and the lids may be patterned from silicon, which lids may then be patterned by means of deep reactive ion etching (DRIE). Said process may be set such that undercuttings in the order of magnitude of micrometers are achievable. Alternatively, for example, it is possible to perform wet-chemical etching with tetramethyl ammonium hydroxide (TMAH) and/or potassium hydroxide (KOH) and/or nitric acid (HNA).

If the openings in the lower lid 32a and in the upper lid 32b are designed to be funnel-shaped, the sound exit surface may occupy a larger proportion of the chip surface area and may possibly be designed to be larger as compared to MEMS transducers comprising an exit on a side face, like the MEMS transducer 80, for example. With regard to the acoustic properties and to attenuation, said option offers further creative leeway. A combination of sound exit openings in the lids 32a and 32b and the side faces between the lid faces 32a and 32b is a feature of further embodiments. A variant of highly integrated systems may include mounting of openings in the lid 32b so as to emit the sound in the upward direction, and mounting of the pressure equalization openings on the side so as to be able to apply the structural element in a simple manner, e.g. onto a printed circuit board.

Generally, the sound entry openings and/or sound exit openings 26 may be designed such that the acoustic properties and/or the attenuation properties are set in a targeted manner. The lower and upper layers 32a and 32b, respectively, may also be capable of vibrating, in principle. Vibration of said elements may be suppressed and/or reduced by means of suitable additional connection elements which are present in the interposed layers 34a and 34b and/or 36, e.g. by means of the anchor elements 84. Suppression or reduction may include shifting the vibration to a frequency range outside of audible sound. Alternatively or additionally, vibration of the layers 32a and/or 32b may also be implemented in a targeted manner in order to optimize acoustic irradiation; it is also possible to employ targeted connections within the layers and to additionally set the level of stiffness and/or the acoustic properties of the layers 32a and 32b by means of corresponding patterning (continuous openings or blind holes).

It is also possible to apply a membrane to the upper lid 32b, which membrane will then be caused to vibrate by the volume flow 12 of the chambers. This is schematically indicated by the dashed line 104. In a simple case, a spacer 106 in the form of a frame, which may have the membrane 104 arranged or clamped thereon, may be arranged on the upper lid 32b for said purpose. Such a membrane 104 may be produced by means of known micromechanical processes. Alternatively, the membrane 104 may also be arranged inside the cavity or partial cavity and/or cover only one opening or only a portion of the openings 26.

What may apply to some of the previously described embodiments of the MEMS transducers (e.g. MEMS structural loudspeaker elements) is that there are chambers which may generate a partial volume flow, e.g. in partial cavities or partial cavity portions, independently of several, some or all of the other chambers. Chambers may be implemented which consist of partial chambers which are contiguous in the lateral and/or vertical direction (lateral: see, e.g., FIGS. 10 and 11) (vertical: see, e.g., FIG. 14); embodiments also show a combination thereof. Such contiguous partial chambers (e.g. partial cavity portions 94a and 94b) may be used for generating a partial volume flow which is independent of or dependent on other chambers or partial chambers. A case where a chamber (partial cavity) may produce a volume flow independently may be referred to as a monochamber. A chamber which may produce a volume flow on the basis of several partial chambers (partial cavity portions) may be referred to as a composite chamber.

Embodiments described above are modifiable such that both types of chambers may be combined in any manner desired. Therefore, embodiments are possible wherein exclusively monochambers or exclusively composite chambers are arranged. Alternatively, it is possible to implement embodiments where both types of chambers are arranged.

In other words, when using exclusively monochambers, the resonant frequencies of all actuator/chamber systems may be identical or may be designed differently. For example, specific frequency ranges in sound irradiation may be emphasized by an increased number of corresponding monochambers. In particular, by spreading the resonant frequencies and the widths of the resonant curves accordingly via attenuation, e.g. by means of the dimensioning of the grid openings or, generally, of the sound exit openings and/or the flow passages, configuration of the frequency response (sound pressure level as a function of the frequency) may be achieved. Smoothing of the frequency response, above all, plays a major part in this.

Partial cavities and/or partial cavity portions may emit the volume flow at different frequencies and/or may be optimized to detect specific frequencies of the volume flow on the basis of spatial extensions of the volumes, of geometries of the electromechanical transducers and/or of a frequency at which the electromechanical transducers are operated.

In a further embodiment, monochambers are exclusively used. The sound exit openings may be arranged to be exclusively lateral. Three chips/wafers (MEMS transducers) may be stacked one above the other. The upper chip may be optimized for sound irradiation within a first (e.g. high) frequency range. A second, e.g. medium, MEMS transducer may be adapted to a second frequency range (e.g. medium-range frequencies). A third MEMS transducer may be adapted for a third frequency range, e.g. for low frequencies. Consequently, a three-way loudspeaker may be obtained. The three channels (three MEMS transducers) might also be arranged in a chip in that laterally, a first number $N_1$ of chambers is used for the high frequencies, a second number $N_2$ of chambers is used for medium-range frequencies, and a third number $N_3$ is used for low frequencies. This principle may be readily extended for an N-way system in a lateral direction and, in the event of stacking, also in the vertical direction. In a further embodiment, an N-way system is designed such that the sound is produced, via a Fourier synthesis of the corresponding harmonics, to have frequencies $N*f_1$, $f_1$ constituting the lowest frequency.

This means that a MEMS transducer may be arranged to form a stack together with at least one further MEMS transducer, it being possible to obtain a stack by arranging, e.g., at least two MEMS transducers along a lateral direction (e.g. the x direction) and/or a thickness direction (e.g. the z direction). Alternatively, the MEMS transducers may also be arranged at a distance from one another. The cavity of the MEMS transducer and the cavity of the at least one further (second) MEMS transducer may have different resonant frequencies.

In the event of an actuator operation, i.e. the deformable elements are actively deformed, an N-way loudspeaker may be obtained, wherein N indicates a number of MEMS transducers having different resonant frequencies. In the event of a sensor operation, for example different frequency ranges of the volume flow may be detected by using different MEMS transducers. This enables, e.g., performing a Fourier synthesis of the volume flow. For example, the control device 128 may be configured to detect the deformation of the deformable elements of one or more of the electromechanical transducers of the MEMS transducer and of the further MEMS transducer. The control device may be configured to calculate a Fourier synthesis (Fourier analysis) on the basis of the electric signals and to output a result.

The examples that have just been presented and employ monochambers may also be implemented while using composite chambers, the individual partial chambers of a composite chamber having identical resonant frequencies.

When employing composite chambers, the contiguous partial chambers may also support different frequencies due to corresponding locations of the resonant maxima. For example, three partial chambers might present a three-way system. The air flow which is modulated in a low-frequency manner, e.g. in the rear partial chamber (first portion along an axial extension) would additionally undergo medium-frequency modulation in the central partial chamber (second portion along an axial extension) and would additionally undergo high-frequency modulation in the front part of the chamber (third portion along an axial extension).

In order to generate the same sound pressure, a stroke, i.e. a deflection of the electromechanical transducers, may be smaller with high frequencies than with low frequencies. The chambers or partial chambers which are employed for high frequencies may thus be designed with smaller chamber volumes and/or with smaller distances between the sidewalls which function as actuators and demarcate the chamber.

During operation, a phase offset may be introduced via control between chambers of equal frequency, so that the wave front is tilted and will not exit in a manner that is perpendicular to the surface (phased array).

In all of the variants that have been presented up to now and will be presented below, each chamber is surrounded by at least one second chamber into which air flows for equalization of pressure when air flows into the first chamber, and vice versa. This becomes obvious specifically when no partition walls exist between said chambers since an actuator will increase the volume of the one chamber during its movement while simultaneously reducing the volume of the other chamber, and vice versa.

For application, e.g., as loudspeakers in hearing aids or in-ear headphones, the external air (i.e. the air outside the ear) is not moved through the loudspeaker. Rather, the volume present within the ear channel is periodically varied merely by the vibration of a membrane, for example. This may be effected, in all of the variants presented above and to be introduced below, in that the corresponding openings, which in the presented variants lie either on a chip top side, a chip bottom side or a chip side face, remain closed. To this end, patterning of the bar grids is to be dispensed with merely at said locations.

What applies generally and to all of the fields of application of loudspeakers is that bar grids may also be completely replaced by a closed membrane in certain places. This, reduces particle sensitivity by a maximum, and enables operation to be performed, in particular, also in contaminating and/or corrosive gases and liquids.

In the following, measures taken in terms of design and operation of the bending actuators will be presented which have the goal of being able to depict the desired frequency response in an optimum manner.

By including several additional spring elements, which subdivides the bending actuator into individual elements, the effective stiffness of the actuators and, therefore, the resonant frequency may be reduced. Please refer to FIG. 15 by way of example, where a single spring element was used for dividing the bending actuator into two elements. Said subdivision into two or more elements is important for achieving a resonant frequency within the low frequency range of audible sound since without such a measure, the bending actuators will exhibit, given the usual dimensions of the bending actuators (e.g. 5 µm in width, 2 mm in length, silicon as the material), natural frequencies within the kHz range. Alternatively or additionally, an additional mass element may be provided, in a targeted manner, at the bending actuator or at the possibly existing rigid plate so as to reduce the resonant frequency. Such an element may be provided in a simple manner when patterning the layer 36. The mode of action of an additional mass Δm may be explained by using the example of a model of the harmonic oscillator.

The vibration amplitude $A(\omega)$ an element of the mass m, which element is suspended via a spring having a stiffness k, is given as follows in the event of sinusoidal excitation with a force of the amplitude $F_0$:

$$A(\omega) = \frac{F_0}{m} \frac{1}{\sqrt{(\omega - \omega_0^2)^2 + \left(\frac{c}{m}\omega\right)^2}} \quad \text{(eq. 3)}$$

$\omega$ is the angular frequency of excitation, and c is the attenuation constant. If the resonator is operated within a quasi-static range, the amplitude will be independent of the mass. The following applies for $\omega \ll \omega_0$:

$$A(\omega) = F_0/k \quad \text{(eq. 4)}$$

Thus, an additional mass Δm changes the resonant frequency $\varphi_0$ to the lower value $\omega_{0-}$, however, the amplitude of the vibration remains unchanged. The situation is different when the bending reactor is operated within the range of its natural frequency. For $\omega = \omega_0$, the first term within the root of eq. 3 may be neglected as compared to the second term, and the following applies:

$$A(\omega) = F_0/(c\omega_{0-}) \quad \text{(eq. 5)}$$

Since $\omega_{0-}$ is inversely proportional to the root of the mass of the vibrator (resonator), an increase of the mass results in a corresponding reduction of $\omega_{0-}$ and, therefore, in an increase in the amplitude. The gain in amplitude results under the condition c $\omega_{0-}$ <k. The possibility that the bending beams are constructed so as to be able to bend in the one or the other direction, depending on the addressing and/or signal, was already described above. Thus, the restoring force need no longer necessarily be applied via the mechanical spring action upon bending of the beam. The lower the level of stiffness selected for such a bending beam, the larger the deflection will be given that the energy that may be coupled in is constant.

While all considerations have related to the audible sound range, it is feasible to configure the structural element also for generating ultrasound. In principle, it is also feasible that instead of actuators, beams are provided with position-sensing elements (e.g. piezoresistive, piezoelectric, capacitive, etc.) so as to then make a structural element available as a microphone.

For the essence of producing the MEMS loudspeakers in silicon technology, one may fall back on known wafer bonding methods and deep reactive ion etching. Production of the actuators depends on the selected principle of action and is initially disregarded. Said part may be included in a modular manner in the following exemplarily procedure. The following representation relates to a structural element which has exclusively lateral openings for the air flow.

As the starting material, BSOI (bonded silicon on insulator) wafers are employed. The carrier wafer (handle wafer) forms the lower lid 32a of the MEMS structural loudspeaker element. The buried oxide layer of the BSOI wafer may later act as a spacing layer 34a. The active layer of the BSOI wafer may correspond to the layer 36. The carrier wafer may have a thickness of 500 to 700 µm and may be further thinned—possibly at the end of the process—as needed. The buried oxide layer may have a thickness of 50 nm to 1 µm. The active layer of the BSOI wafer may have a thickness of 1 to 300 µm. The layer 36 is patterned by means of deep reactive ion etching (DRIE), for example. Following said patterning, the buried oxide layer (34a) may be removed, or at least thinned, at least locally within the region of movement of the actuators. This may be effected in a wet-chemical manner, e.g. by using BOE (buffered oxide etch), or in a dry-chemical manner, e.g. by means of gaseous HF (hydrofluoric acid). Once the spacing layer 34a has been at least partly removed in the region of movement of the actuators, a low-friction layer, which will close, or heavily reduce, the gap between the layer 34a and the actuators (deformable elements), may be deposited, e.g., via chemical vapor deposition, CVD, or atomic layer deposition, ALD. Alternatively, it is as early as during bonding of the wafers for producing the BSOI wafers that regions may be defined, by depositing and patterning suitable layers, wherein no bonding is effected, as described, e.g., in U.S. Pat. No. 7,803,281 B2. Such a method may be employed for the upper lid and the lower lid. The layer 34b is patterned by means of reactive ion etching (RIE), for example. With said two instances of patterning, all of the elements within the layers 36 and 34b are produced as shown in the corresponding figures. This also includes the bar-shaped grid structure.

The above-described deposition of a low-friction layer may also be employed for the upper lid (layer 32b). Said layer will then be applied, e.g., to the lid prior to bonding. The spacing layer 34b may then be dispensed with. For example, a low-friction layer may be obtained by depositing a material. A coefficient of friction may be, e.g., 10%, 20% or 50% smaller than in a material of the layers 32a, 34a, 34b or 32b.

Given appropriate doping, the layer 36 may also be used as an electric conductor. Specifically when actuators are to be excited at different frequencies, vertical electric insulation in layer 36 is advantageous. This may be achieved, e.g., by so-called filled trenches, as described in [8]. Utilization of open trenches for electric insulation also is a possibility.

A second wafer, which may be formed as a silicon wafer having a typical or possible thickness of 500 to 700 µm and will form, e.g., the upper lid 32b, has a layer applied thereon, which will be patterned. Said layer corresponds to the spacing layer 34b. The thickness of said layer advantageously corresponds to that of the buried oxide layer. As a material for the spacing layer, any materials may be used which enable bonding, to be performed at a later point in time, of the second wafer onto the BSOI wafer. Silicon oxide, advantageously thermal oxide for direct bonding of silicon oxide onto silicon, shall be mentioned here by way of example. Alternatively, polysilicon may also be used for direct bonding. A further alternative consists in etching suitable depressions into the second wafer, so that both the function of the upper lid 32b and the function of the spacing layer 34b are configured on the wafer. At least in the region of movement of the actuators, said depressions may be dispensed with if the wafer is coated with a suitably low-friction layer at said locations, so that the distance between the actuator (movable element) and the lid (layers 32a and/or 32b) may be dispensed with. A further layer on the second wafer—except for auxiliary layers (masking) for patterning—may then be omitted. In addition, direct bonding of silicon onto silicon is thus possible.

In addition to direct bonding, it is also possible to employ adhesive bonding methods, so that the spacing layer 34b will then consist of a polymeric material (e.g. PCB). What is also feasible but not advantageous for reasons of the lack of CMOS compatibility are Au—Si eutectic bonding methods or anodic bonding methods (layers containing Na ions).

Following bonding of the two wafers, the major part of production in a wafer array (wafer stack) has been completed. What has not been performed is production of electric wiring and contacts and any electric insulation structures which might be needed. Said elements may be made available by means of standard processes of conventional technology: manufacturing of conductor lines, e.g. by means of sputtering and patterning AlSiCu, vertical insulations by deposition and patterning of oxides, lateral insulations by means of open or filled insulation trenches, which completely penetrate the layer 36.

Dicing of the structural elements having laterally disposed openings entails protection of the bar grids, in particular. This is enabled, e.g., in that the structural element within a frame is connected to said frame via four thin webs, for example. To this end, the lower lid 32a and the upper lid 32b as well as the layers 34a, 36 and 36b are to be patterned accordingly. For said patterning, anisotropic etching methods such as TMAH, KOH and DRIE are possible, above all. Specifically for patterning along the bar grids, DRIE patterning of the layer 36 is the advantageous variant. For removing the structural elements from the wafer array, the webs are destroyed. This may be effected mechanically or by means of laser processing, for example.

It is also feasible not to the lower lid 32a for dicing, but to pattern only the layers 34a, 36, 34b and 32b. Especially layer 36 may be patterned by means of DRIE so as to implement the perpendicular run of the bar grids. A trench will then result starting from the chip surface and will end on the lower lid 32b. Said trench may now be filled with a polymeric material (e.g. photoresist). The polymer serves to protect against contamination during the subsequent sawing/dicing process. Following sawing, the structural elements are rinsed and cleaned so as to remove the saw slurry. Subsequently, the polymer is removed by means of suitable solvents or in an oxygen plasma.

Figure 16:
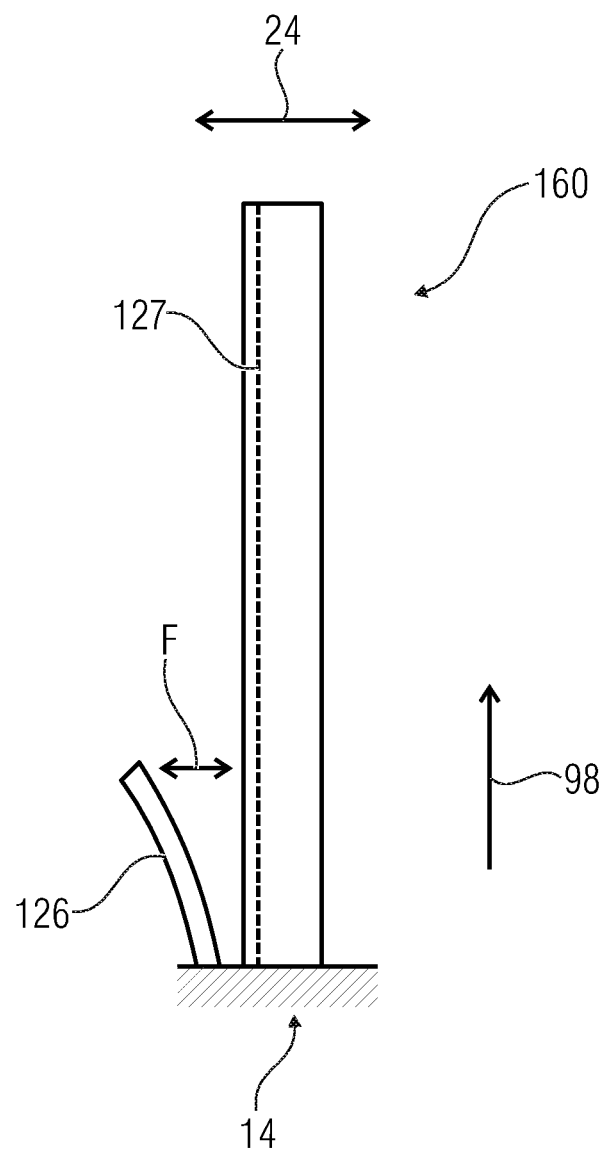
FIG. 16 shows a schematic top view of a deformable element arranged adjacently to an electrode, in accordance with an embodiment.

If openings in the lower and upper lids are used instead of the lateral openings, manufacturing is to be expanded, as was already described in the context of FIG. 16. The lower and upper openings may be protected by a film, for example, for dicing, so that sawing processes or laser cutting are possible. Alternatively, the openings may also be closed by means of a polymeric material, e.g. photoresist, for the dicing process, and subsequently, said polymeric material may be removed by means of a solvent or in the oxygen plasma.

Stacking of structural elements is advantageously performed by bonding methods in a wafer array. Electric contacting may then be effected either by means of electric contacts (bondpads) in the respective layer 36 or, when using TSVs (through-silicon vias), also via so-called bumps present on the bottom side of the chip. For electrically connecting the stacked individual chips, TSVs may also be employed. For non-stacked chips, TSVs and bumps may also be employed.

In order to achieve increased stability of the bar grids 54, the spacing layers 34a and 34b may remain unpatterned in the region of the bar grids.

Variants of implementation in terms of manufacturing the lateral bending actuators will be described below.

In principle, known electrostatic, piezoelectric, thermomechanical and electrodynamic principles of action may be employed for actuating the bending beams.

A simple electrostatic principle of action may be implemented for some of the above-shown variants of structural elements even without any active bending beams. The MEMS transducer 50 may be configured such that rigid plate elements 62a and 62b are configured as or comprise capacitor plates which move toward one another, on account of an electrical potential difference, so much that the elements 64 which will then act as flexion springs will have a corresponding mechanical counterforce.

Alternatively, the bending beams may also be directly deflected via an additionally arranged, fixed counterelectrode. It is also feasible to employ comb-shaped electrodes for increasing the forces, or the deflection.

A further electrostatic principle is based on using a beam clamped on one side which at its clamping location has a very small distance from an electrode, which electrode distance increases as the distance from the clamping location increases. The distance at the clamping location may be zero. If an electric voltage is applied between the bending beam and the electrode, part of the bending beam, which is determined by the amount of the electrical voltage and the level of stiffness of the beam, will make contact with the electrode. With regard to the principle described herein, the space between the beam and the electrode forms the chamber 42a, which may be changed in terms of volume as described.

A basic principle of such actuators is described in literature, for example. E.g., in [9], vertically deflecting actuators are presented. Variation of the electrode distance is implemented by introducing layer tensions in a targeted manner during manufacturing of the bending beams. For the structural element described within the context of the present application, actuators may be readily implemented, according to said principle, by patterning the layer 36 accordingly. In addition to patterning the layer 36, which is involved anyway, an insulation layer is to be applied between the electrode and the bending beam, which may be readily implemented by means of known methods of microsystems technology. Introducing a layer tension is not needed since the bending beams obtain their desired shapes already due to the patterning. In the manner described here, the actuators are laterally deflectable and may thus be used for the structural-element principle described further above.

In terms of integration and scalability for large numbers of pieces, the electrostatic principle of action offers a large number of advantages. No external components such as magnets or coils are needed, and no materials are needed which are critical in terms of contamination and are used for clean rooms and, in particular, CMOS-compatible clean rooms. The membrane approach which has been followed so far has several disadvantages, however. They include the fact that by using one single vibrating membrane or plate, the entire audible sound range can be covered to an insufficient degree only. The approach of operating the membrane(s) in a quasi-static manner solves this problem, however at the expense, due to the lack of resonance step-up, of the deflection and, therefore, at the expense of the achievable volume flow and/or of the achievable sound level. The latter two are correlated as follows for a fixed volume, such as for in-ear headphones, for example, [11]:

$$SPL = 20\log_{10}\left(-1.4\frac{P_0 \Delta V}{P_{ref} V_0}\right) \quad \text{(eq. 6)}$$

In this context, SPL stands for sound pressure level, $P_0$ is the normal pressure, $\Delta V$ is the change in volume achievable on the part of the loudspeaker, $P_{ref}$ is the reference pressure indicating a measure of the audibility threshold, it amounts to 20 µPa, $V_0$ is, in the case of in-ear headphones or hearing aids, the volume of the cavity of the ear and amounts to approx. 2 cm³.

With regard to MEMS loudspeakers it is therefore desirable to achieve as large a volume flow as possible per chip surface area, or per volume of the entire loudspeaker. Electrodynamic transducers may achieve very large membrane deflections, for example, and therefore, a large volume flow. However, since permanent magnets are needed, the volume of the total design is very large. For loudspeakers in mobile phones, which offer less and less space in one dimension from a perspective point of view, said approach seems to be generally limiting.

Piezoelectric bending actuators involve deposition of a piezoelectric layer onto a substrate. Said piezoelectric layer might correspond, e.g., to layer 58 of FIG. 3, which will then be arranged laterally to the layer 56, which includes, or consists of, silicon, for example. Manufacturing of said actuators is possible by means of surface-micromechanical processes.

Lateral thermomechanical actuators in the form of one cold arm and one warm arm, as described in [10], for example, may be very readily integrated by taking into account the corresponding geometries in the DRIE patterning, described above, of the layer 36.

A further variant of thermomechanical actuators consists in using bimorphs which are heated by electric current. For manufacturing such a bimorph, an oxide layer might be deposited in a conforming manner, e.g. following patterning of the layer 36, so that all of the sidewalls are also coated. Said oxide layer might then be removed anywhere, except for the one sidewall of the bending element, by means of masking and etching processes.

Employing an electrodynamic principle of action may be readily implemented for the bending beams clamped on both sides. When a current flows through the beams or through a separately mounted conductor pattern, the beams will experience, within a magnetic field, a force which results in deflection. The direction of the flow of current may be selected, for the individual beams, in accordance with the desired direction of deflection. Optional manufacturing of the conductor lines is effected by means of standard processes of surface micromechanics. In this case, the additional topography is to be taken into account when selecting the thickness of the spacing layer 34b.

The advantageous implementation of the bending actuator is a lateral electrostatic actuator which is based on using very small interelectrode gaps and may thus operate and be operated at low voltages. Such lateral actuators are described in EP 2 264058 A1, for example. Said technology enables manufacturing of all of the above-described variants of bending actuators and structural components and may be readily integrated into the above-described major part of the manufacturing process of the structural elements in a simple and modular manner.

In the following, reference will be made to the bypass-flow losses which occur during movement of the sidewalls, i.e. the deformable elements. When assuming a laminar flow, it can be shown in a simple model that the bypass-flow losses, e.g. volume flows from the chamber 42a to the chamber 38a in FIG. 2a as compared to the useful volume flows, i.e. that volume flow which leaks to the outside and/or reaches the inside from the outside, may be kept suitably small if the spacing layers 34a and 34b are small as compared to the thickness of the layer 36. The same applies to the distance that is present at the possibly free end of a bending beam from the laterally limiting structure. The latter consideration may be dispensed with in bending actuators clamped on both sides. If the flow losses are calculated, for said configuration, in the model of a laminar flow through rectangular pipes, a loss of approx. 3% caused by bypass flows might result in relation to the useful volume flow if the dimensions are assumed to be as follows:

bending actuator: 1 mm in length, 30 µm in height, 10 µm in width

Chamber: for calculating the flow resistance toward the outside, a medium width of 50 µm was assumed. This underestimates the flow resistance that is present in the event of a large amount of deflection of the bending actuators.

Layer thicknesses of the spacers 34a and 34b: 0.5 µm each

The assumed dimensions are to be understood by way of example only and may be implemented very well with micromechanical technologies. The assumption of a laminar flow might be incorrect on account of the small width of the actuators (above: 10 µm), which corresponds to the length of the pipe. However, said assumption is a worst-case assumption since the flow resistance will increase in the event of turbulences occurring. In order to motivate such turbulences, the bending actuators within layer 36 may be provided with suitable, laterally formed elements. Suitable arrangements are considered to be arrangements which form eddies in the event of a bypass flow. As an alternative or supplementation, intentional roughening of that face of the lid 32a and 32b which faces the chamber may promote formation of a turbulent flow.

Figure 15:
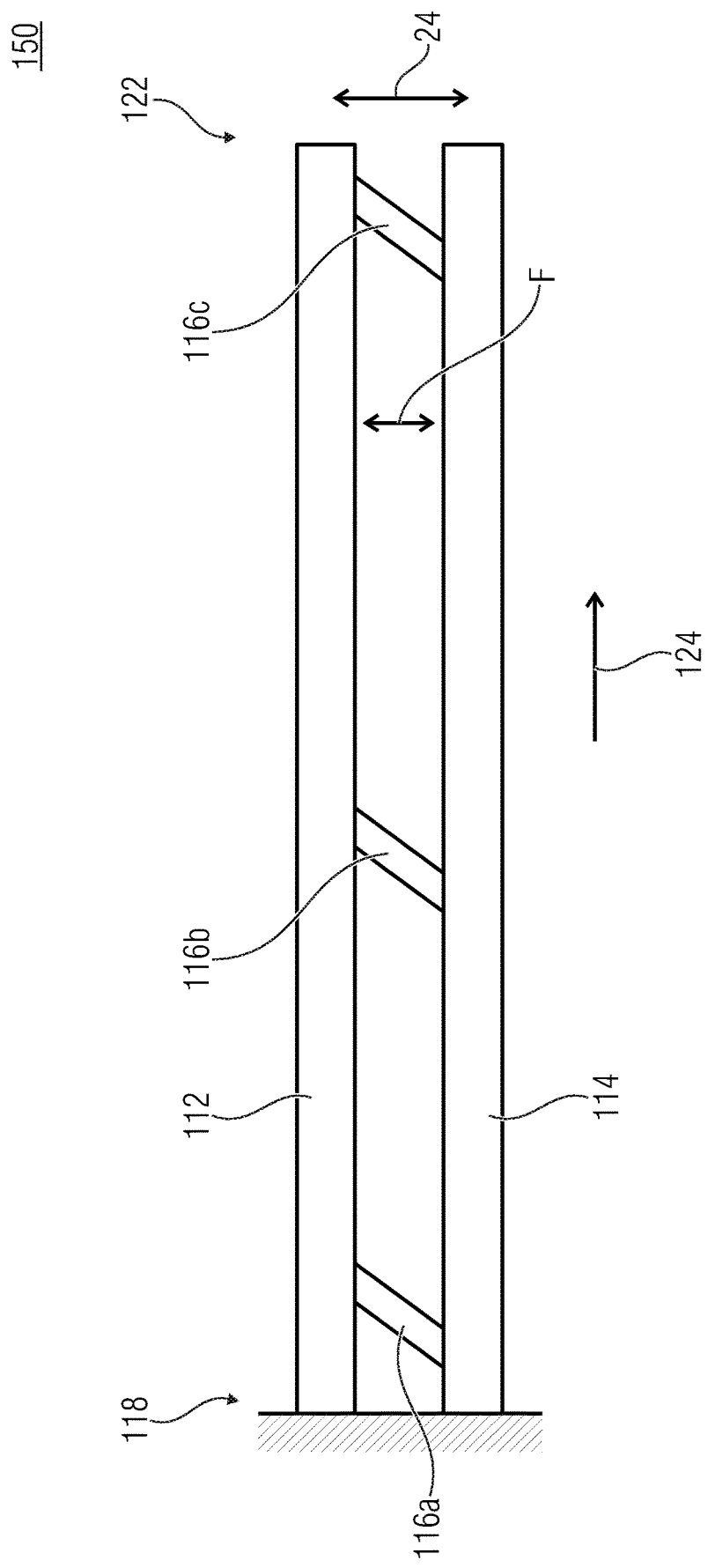
FIG. 15 shows a schematic sectional side view of a deformable element comprising two layers which are spaced apart from and connected to each other via connecting elements, in accordance with an embodiment.

FIG. 15 shows a schematic sectional side view of a deformable element 150 comprising a first layer 112 and a second layer 114, which are spaced apart from and connected to each other via connection elements 116, the connection elements 116a-c being arranged at an angle of 90° in relation to the layer 114 and the layer 112. For example, the layers 112 and 114 may comprise one electrode. Alternatively, an electrode may be arranged at each of layers 112 and/or 114. On the basis of applying an electric potential, a repulsive or an attractive force may be generated between layers 112 and 114. The attractive or repulsive force may result in deformation of elements 116a-c, so that a deflectable end 122, which faces away from a clamped end 118, of the deformable element 144 is deflectable along the lateral direction of movement 24.

This means that the deformable element 150 may comprise a first layer 114 and a second layer 116, which may have spacers 116a-c arranged between them. The spacers 116a-c may be arranged in a direction of inclination 124 that is oblique with regard to a run of the layers 112 and 114. An attractive force that acts between the layers 112 and 114 may cause the deformable element 150 to bend.

The deformable element 150 may be configured, along the direction of inclination, to be planar or to have one curvature. Alternatively, the deformable element and/or the layers 112 and/or 114 may also comprise two portions which are arranged to touch each other in a discontinuous manner, e.g. in line with a sawtooth pattern.

FIG. 16 shows a schematic top view of a deformable element 160 arranged adjacently to an electrode 126. The deformable element 160 may comprise or be a further electrode 127. On the basis of an electric potential applied between the electrode 126 and the further electrode 127 of the deformable element 160, an electrostatic or electrodynamic force F may be generated. On the basis of the electrostatic or electrodynamic force F, deformation of the deformable element 160 may be caused.

In a state of the deformable element 160 that is not influenced by the volume flow or the electric potential, i.e. the force F, a distance between the deformable element 160 and the electrode 126 along the axial extension direction 98 of the deformable element may be variable. In a region where the mechanical transducer and/or the deformable element 160 has a connection to the substrate 14, the distance may be at a minimum. This enables a large degree of controllability of the deformation of the deformable element 160. Alternatively, the distance between the electrode 126 and the deformable element 160 along the extension direction 98 may be variable or constant, as desired.

In accordance with embodiments, electromechanical transducers may be configured as electrostatic transducers, piezoelectric transducers, electromagnetic transducers, electrodynamic transducers, thermomechanical transducers or magnetostrictive transducers.

On the basis of a force that may be generated, deformation of the deformable element may be caused or may be ascertainable and/or determinable.

By means of the following figures, several advantageous implementations of the electronic circuit will be explained.

Figure 17A:
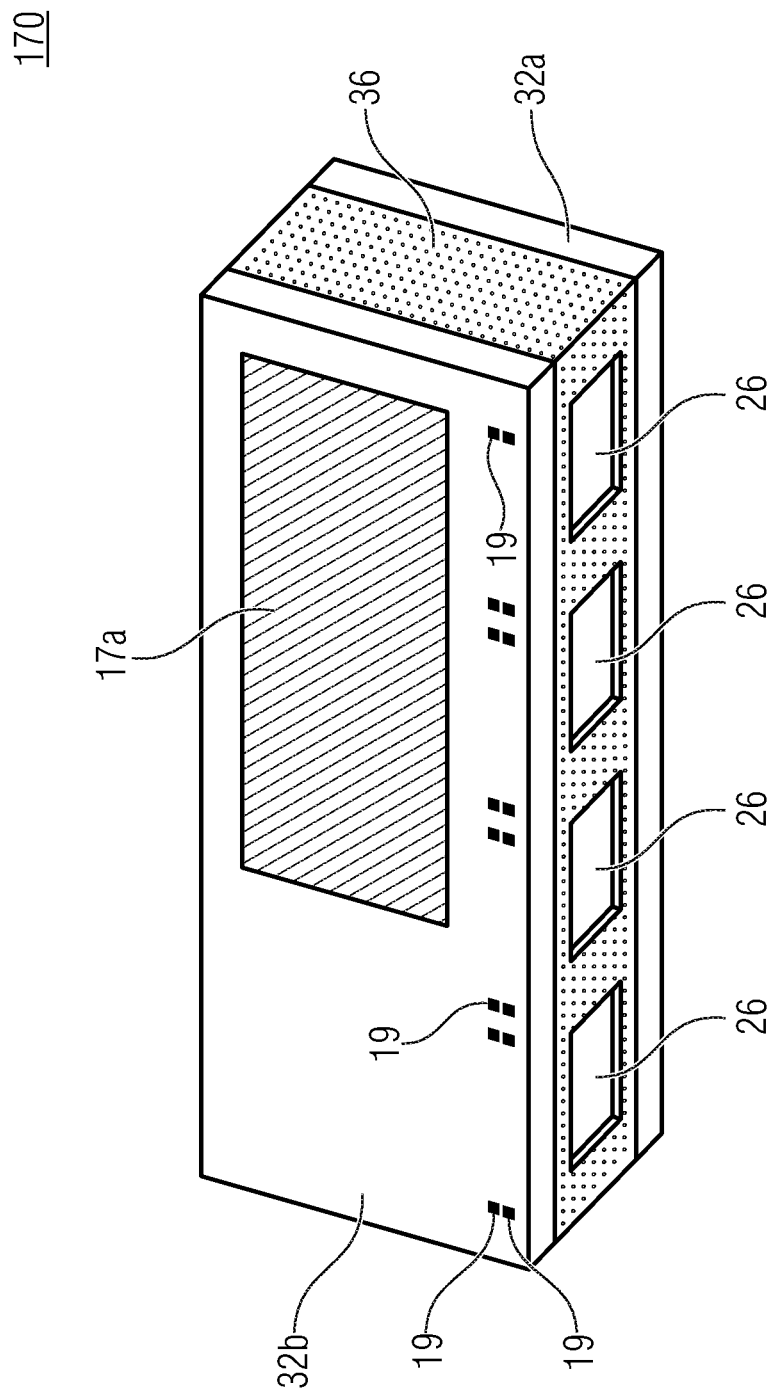
FIG. 17a shows a schematic perspective view of a MEMS transducer in accordance with a further embodiment from a first side.

FIG. 17a shows a schematic perspective view of a MEMS transducer 170 in accordance with an embodiment. For simplicity's sake, the layer 36 also comprises the layers 34a and 34b, which were described, e.g., in connection with FIG. 2a. The cavity of the MEMS transducer 170 is connected to outer surroundings of the MEMS transducer 170 via openings 26. The electronic circuit 17 may be configured to comprise many parts, so that a first part 17a of the electronic circuit 17 is arranged on or within the layer 32b. A further part 17b of the electronic circuit 17 may be arranged in a different layer, e.g. the layer 32a and/or 36.

At or in the layer 32b, the MEMS transducer 170 may comprise through-connections 19 serving, e.g., as contact pins for inputting and/or outputting electric signals at or from the electronic circuit 17.

Figure 17B:
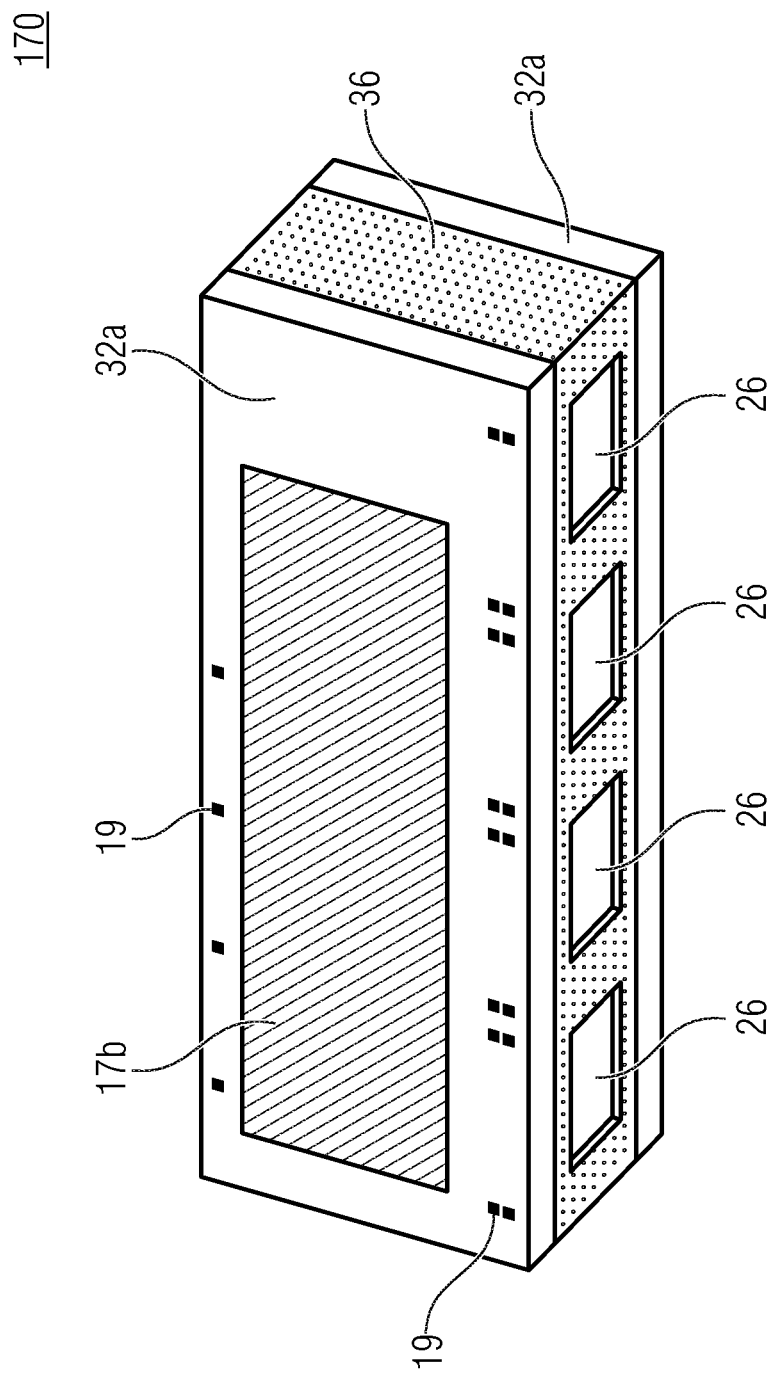
FIG. 17b shows a schematic view of the MEMS transducer of FIG. 17a from a second side.

FIG. 17b shows a further schematic view of the MEMS transducer 170, wherein the side 32a is in the foreground. A second part 17b of the electronic circuit 17 may be arranged on or within the layer 32a. The layer 32a may also comprise through-connections 19. Several of the through-connections may have identical functionalities. The through-connections may be used, for example, for the purpose of achieving a through-connection through the entire layer stack; one, several or all of them, however, may also be used for parts of the stack only, e.g. up to the deformable elements. In one example, therefore, some of the through-connections 19 may represent the places of contacting the deformable elements of the transducer, and other trough-connections 19 may represent such places of contacting which connect the electronic circuit of the lid wafer to the electronic circuit on the bottom wafer.

FIG. 17c shows a schematic perspective view of the MEMS transducer 170 by analogy with the view shown in FIG. 17a; the openings are configured such that grid webs 44 are arranged so as to at least impede entry of particles.

Arranging the electronic circuit 17 in layers of the MEMS transducer, e.g. of the MEMS transducer 170, enables obtaining a highly integrated structure, on the one hand, which enables reduction or avoidance of external circuit structures, so that the overall device may be designed to be small. In addition, arranging the electronic circuit in a layer of the layer stack enables obtaining short signal paths, which is advantageous both in terms of electromagnetic compatibility and in terms of time-related and performance-related aspects of the device.

Even though it is possible to arrange the electronic circuit in only one of the layers 32a or 32b, subdividing the electronic circuit and arranging it in or at both layers 32a and 32b may offer advantages to the effect that adjacent electronic components are controlled by the electronic circuit 17 via as short paths as possible in each case. Subdividing the electronic circuit 17 further enables the electronic circuits 17a and 17b to implement different or complementary functions and/or to be realized in complementary technologies, e.g. MEMS and CMOS. The electronic circuits 17a and 17b may actually be electrically connected to each other and/or to the electromechanical transducer. The structure of the MEMS transducer 17 as a layered design enables manufacturing the individual layers separately from one another, e.g. in different semiconductor manufacturing processes. This enables implementing different functions, which are at least influenced by the semiconductor manufacturing process, in different layers and, therefore, in different electronic circuits, so that circuit structures 17a and 17b obtained on the basis of different semiconductor manufacturing processes may be arranged in a chip of the MEMS transducer 170.

This may also be understood to mean that a first electronic circuit 17a is arranged in a first lid layer of the layer stack and that a second electronic circuit 17b is arranged in a second lid layer of the layer stack of the substrate. Each of both electronic circuits 17a and 17b is arranged along a direction perpendicular to the in-plane movement plane. The deformable element may be at least partly arranged, during its deformation, between the first and second electronic circuits 17a and 17b. By means of through-connections and/or other circuit elements, the electronic circuit 17, or the layer in which it is arranged, may be at least electrically connected to or represent an outer side of the MEMS transducer. This enables contactibility of the MEMS transducer to a lead assembly, e.g. on a circuit board.

In other words, embodiments enable obtaining an overall structural element including different functionalities integrated within the MEMS transducer. These include, e.g., integrated electronic control of a MEMS loudspeaker and controlling/reading out of an integrated acceleration sensor. Manufacturing of individual functional elements may be employed or implemented in different manufacturing processes which are possibly not combinable or difficult to combine during manufacturing of a wafer. By subdividing said functionalities into two layers, e.g. the upper and lower wafers 32a and 32b, the manufacturing processes may be selected with increased flexibility and may be combined at the level of functionality, i.e. may be joined inside the MEMS transducer 170. For example, the upper wafer (lid) may contain electronic circuit elements or the low-voltage range, i.e. small electronic structures needing little space and enabling high speeds. The lower wafer (bottom) may include, e.g., the D/A conversion for high voltages for operating a loudspeaker, i.e. large transistor structures needing a large amount of space and operating slowly. Likewise, for storage elements, light sources or additionally integrated MEMS sensors/actuators, a corresponding advantage may be obtained. Integration of complementary functionalities may be subdivided as desired.

In yet other words, an integrated electronic circuit 17, or 17a and/or 17b, may be implemented in layers 32a and/or 32b. Said electronic circuit may serve, e.g., to control the actuators for sound generation and to set the respective electric voltage in accordance with the desired sound pressure, and to implement electric excitation at the desired frequency. Conversion, which may be needed, of a digital electric input signal to an analog control signal is also possible by using the integrated circuit, e.g. in the form of a D/A converter or via pulse width modulation (PWM). In the case of a microphone function, e.g. electric signal (pre)processing—while maintaining short signal paths—or A/D conversion may be implemented within said circuit. For electrically contacting the integrated electronic circuit 17 with the actuators/sensors inside the chip, through-connections 19 are conceivable which may be arranged within the layer 32a and/or 32b. Said through-connections may penetrate the layer 34a and/or 34b, so that individual continuous electric connections from the integrated circuit to the individual actuators (beams) may be implemented. For each beam, two electric contacts may be provided, for example. On one side of the stack, the through-connections 19 may be connected to the electronic circuit 17 via integrated conductor lines, which is not shown in the figures.

As far as manufacturing is concerned, a silicon CMOS wafer (CMOS=complementary metal-oxide semiconductor) is bonded onto the layer 34b. Said wafer forms, as far as the chip is concerned, the layer 32b and seals the chambers (cavity) toward the top. The through-connections within the silicon CMOS wafer may be manufactured prior to bonding already (case a). In this case it may be needed that also the through-connections of the layer 34b be present prior to bonding already. Alternatively, it is also possible (case b) for both through-connections to be manufactured after bonding. In simplified terms, etching up to those locations of the beams which are to be contacted electrically may be performed, with the aid of masking, at the corresponding locations after bonding, and the resulting blind hole may be filled up again with an electrically conducting material, e.g. a metal or a doped semiconductor material. Possibly, the sidewalls of the blind hole may be coated with an insulating layer such as silicon oxide and/or silicon nitride, for example, prior to filling with the electrically conductive material.

Even though FIGS. 17a to 17c are depicted such that the electronic circuit is arranged in two layers which encompass the cavity 14, the electronic circuit may also be arranged merely at one layer, e.g. at a layer configured to be connected to a circuit board or the like, i.e. a bottom layer. Alternatively or additionally, additional functional elements may be implemented in at least one of said layers, which layer may then comprise through-connections. Alternatively or additionally to arranging the through-connections by means of selective etching, it is also possible for one through-connection to be provided through the entire layer stack, e.g. by means of so-called TVS (through-silicon via), so that functional structures on the bottom layer and on the lid layer may be electrically connected. The spacing layer 34b may be manufactured on the rear side of the cover wafer, i.e. the layer 32b, and said common layers may then be bonded with the wafer. Alternatively or additionally, a spacing layer 34a may be manufactured on the layer 32a, and said composite layers may be joined by subsequently bonding them with other layers. The respective layers manufactured such that they touch each other may be contacted with other constituents prior to bonding. In principle, however, through-connections may be provided, at any point of the process flow, in layers 32a and 32b and/or in layers 34a and 34b arranged thereat.

Alternatively or additionally, provision may also be made for a MEMS transducer as described above to be arranged within the cavity such that the cavity is molded from a comparatively thick wafer, so that at least some of the steps for performing wafer bonding may be dispensed with.

Figure 18A:
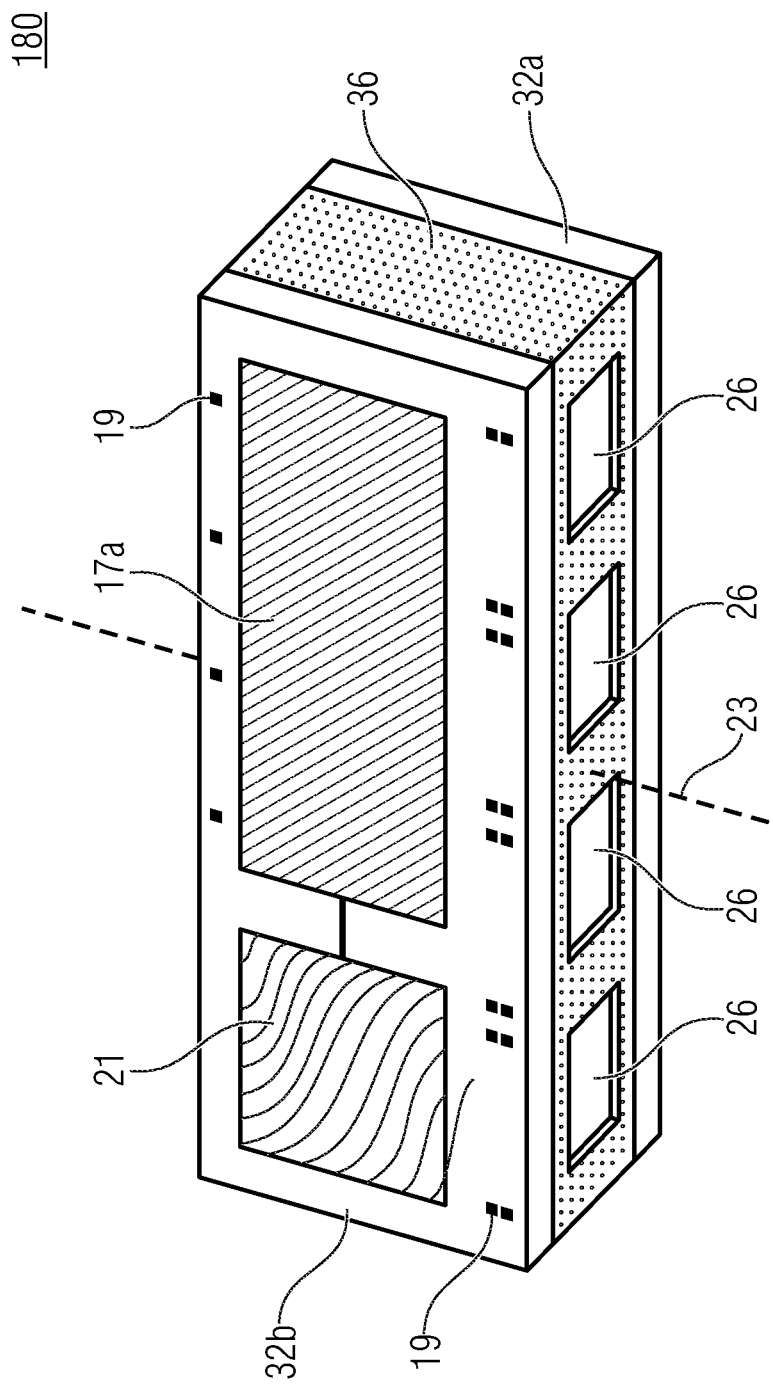
FIG. 18a shows a schematic perspective view of a MEMS transducer in accordance with an embodiment, wherein a functional element is arranged adjacently to an electronic circuit.

FIG. 18a shows a schematic perspective view of a MEMS transducer 180 wherein the layer 32b faces the observer, as is the case in FIG. 17a, for example.

Adjacently to the electronic circuit 17a, the layer 32b may comprise a functional element or MEMS structure 21, which may comprise one or more MEMS functions. For example, the MEMS structure 21 may include an inertial sensor, a magnetometer, a temperature and/or humidity sensor, a gas sensor or a combination thereof. Alternatively or additionally, the MEMS structure 21 may be any sensor, any actuator, a wireless communication interface, a light source, a memory component, a processor and/or a navigation receiver. The electronic circuit 17a may be configured to control and/or evaluate the MEMS structure 21.

This means that the layer 32, which has the electronic circuit 17a located therein, may include a functional element, i.e. the MEMS structure 21. The functional element may be connected to the electronic circuit, and said electronic circuit 17a may be configured to control or evaluate the functional element.

Rotating the MEMS transducer 180 about an axis 23 may result in a view of FIG. 17b; the circuit 17b arranged on the side 32a may be configured, for example, to evaluate and/or control the electromechanical transducers of the MEMS transducer 180 inside the cavity. Here, too, the electronic circuits 17a and 17b may perform complementary functions.

In other words, the bottom wafer may comprise an integrated electronic circuit 17b which takes on tasks which are complementary to those of circuit 17a. This means that the MEMS transducer 180 may be configured to be arranged on a circuit structure or circuit board such that the MEMS structure 21 is arranged to face away from said structure.

Figure 18B:
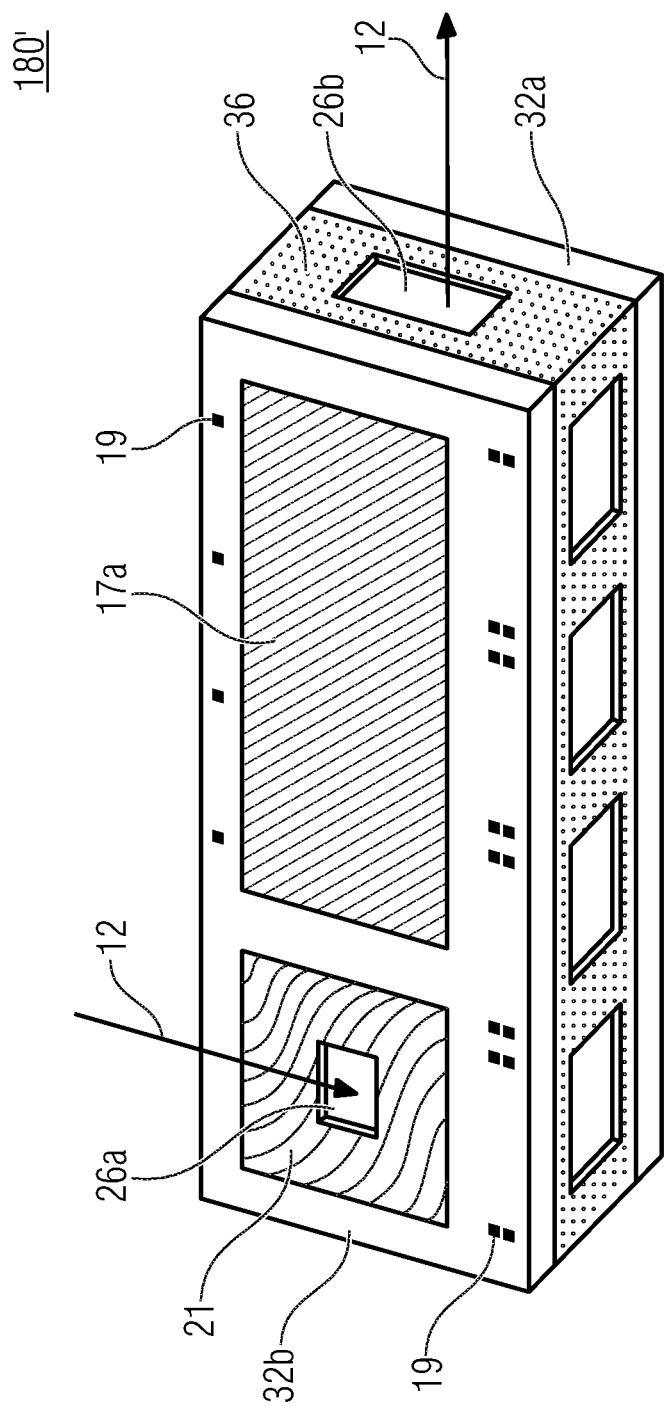
FIG. 18b shows a schematic perspective view of a MEMS transducer which is modified, as compared to the MEMS transducer of FIG. 18a, in that in accordance with an embodiment, an opening is arranged in a lid layer.

FIG. 18b shows a schematic perspective view of a MEMS transducer 180', which is modified, as compared to the MEMS transducer 180, in that an opening 26a is arranged within the layer 32b and is located, e.g., inside the MEMS block 21.

For example, this may be effected such that the electronic circuit 17a is configured both to control and/or read out the electromechanical transducers inside the cavity and is configured to control and/or evaluate the MEMS structure 21.

The MEMS transducer 180' may have a further opening 26b in the substrate. The opening 26b may be arranged, for example, such that the fluid flow 12 covers a larger distance across the MEMS transducer 180. For example, the opening 26b may be arranged at or in a sidewall of the MEMS transducer 180' which is at a maximum distance from the MEMS structure 21. The MEMS structure (functional element) 21 may be configured, e.g., as a gas-sensing functional element arranged in the lid layer 32b. The gas-sensing functional element 21 may be configured to interact with the fluid flow 12 when said fluid flow 12 passes through the opening 26a, and to sensorically detect the fluid flow 12. In other words, the functional element 21 may be configured to detect properties of the fluid flow 12.

The above-explained complementary functionalities of two parts of the electronic circuits may be related, e.g., to the gas sensor element on one side of the stack, e.g. the bottom side, and an electronic control on an opposite side of the stack. For example, it is possible for the manufacturing process of the gas sensor element, e.g. produced in MEMS technology, is not integrable, or is integrable with a large amount of expenditure, in the manufacturing process of the electronic circuit, e.g. produced in CMOS technology, on the front side, so that subdividing of the functionalities into complementary pairs enables utilization of standard manufacturing processes. This may be effected such that one of said standard processes is used for implementing the control function of the gas sensor on a wafer, and for implementing the control function for the electromechanical transducers in a different wafer, which wafers are connected to each other at a later point in time by means of wafer bonding in order to result in the MEMS transducer, e.g. the MEMS transducer 180.

For example, the gas-sensing functional element 21 may encompass the opening 26a so as to provide as large a contact as possible of a surface with the fluid flow 12. Alternatively or additionally, it is feasible for the gas-sensing functional element to at least partly project into the opening, e.g. when an element for measuring a flow rate or the like is arranged.

In other words, the layer 32b has an opening. An additional opening is located, within the layer stack, on the right-hand side, for example. The fluidically interacting elements within the layer 36, i.e. the deformable elements or the plate elements, are configured, in this example, to yield a micropump when combined with the lid layer and the bottom layer 32a and 32b. For example, ambient air might be sucked in and ejected toward the opening 26b via the opening 26a. Block 21 has a gas sensor located therein, for example, which is supplied with ambient air in a quasi-continuous manner due to its proximity to the opening. As a result, the sensor is able to react clearly faster to changes in the ambient air than in the case where gas exchange is effected on the basis of the fusion only.

Figure 19A:
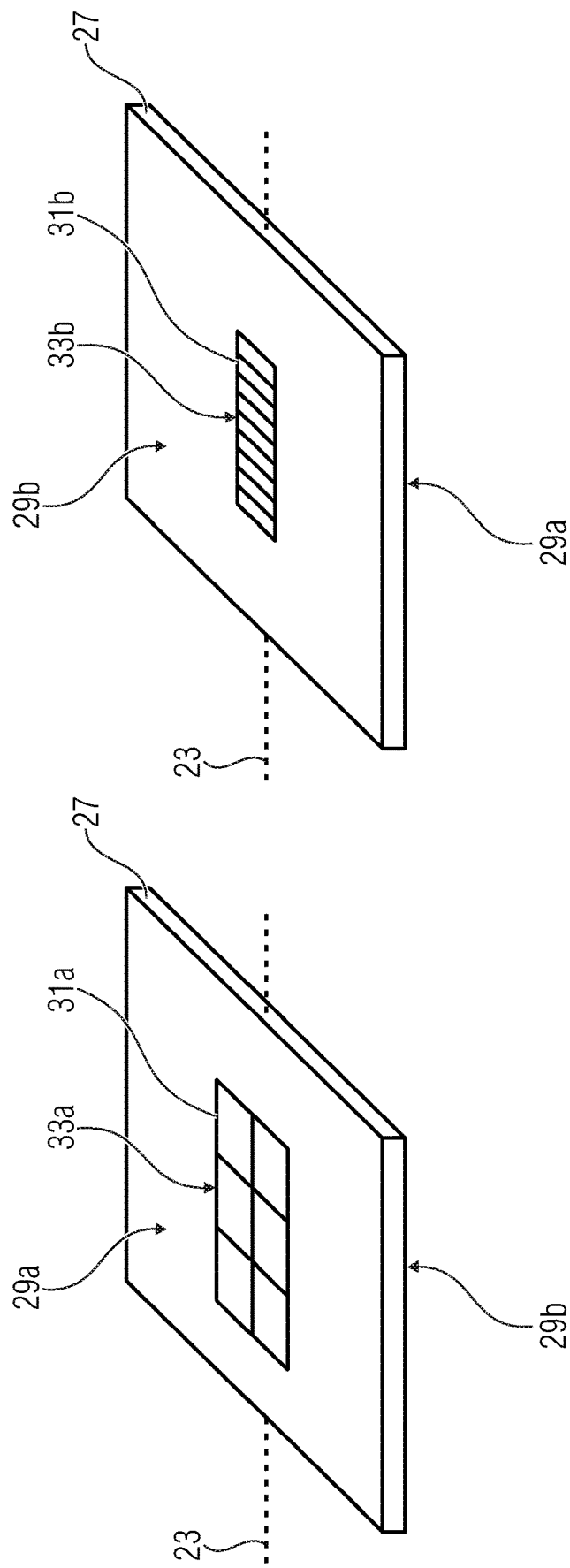
FIG. 19a shows a schematic view of a layer for adapting distance rasters in accordance with an embodiment.

FIG. 19a shows a schematic view of a layer 27, which may be part of a layer stack of a MEMS transducer in accordance with embodiments. The layer 27 includes a first main side 29a and a second main side 29b, the left-hand side of FIG. 19 being depicted such that the main side 29a is visible and that the side 29b is visible on the right-hand side of FIG. 19 by rotating the layer 27 about the axis 23. The side 29a comprises an electronic pattern 31a comprising a first distance raster 33a. The second side 29b also comprises an electronic pattern 31b which has a distance raster 33b different therefrom. The electronic patterns 31a and 31b may be electrically connected to each other within the adaptation layer 27, so that by means of the adaptation layer 27, adaptation or implementation of the first distance raster 33a to form the second distance raster 33b, or vice versa, is enabled. The distance rasters 33a and 33b may be adapted, e.g., to simplify or enable contacting of a respective side 29a or 29b with a specific type of electronic circuits. For example, one of the two distance rasters 33a or 33b may be configured to be compatible with a frequently used or standard rasterization of structural elements or circuit boards, whereas the other distance raster comprises a smaller pattern distance so as to enable compact design of circuit structures within the MEMS transducer. Alternatively, distances within the distance raster 33b may also be larger than those within the distance raster 33a.

The layer 27 may be any layer within the layer stack, e.g. a layer enabling contacting with other components, e.g. the layers 32a and/or 32b in FIG. 17a. This means that the layer 27 may be a lid layer of the stack.

Alternatively, it is also possible for the layer 27 to be configured exclusively as an adaptation layer for adapting the distance rasters, which means that it does not comprise the electronic circuit 17. Irrespectively thereof, the layer 27 may be a lid layer of the stack, e.g. in case the electronic circuit 17 is arranged on only one side of the stack.

The layer 27 may be arranged as a lid layer of a stack, which enables utilization of the same as an interposer. This means, the layer may also perform the function of an interposer. E.g. via soldering methods or other suitable connecting methods for producing the electric contacts, said layer may then have a further chip or circuit carrier applied thereon which has electronic and/or sensorical functionalities and comprises the corresponding distance raster. In embodiments, provision is made for some of or even the entire electronic functionality for controlling/reading out the transducer to be implemented, and/or for all additional sensorical functions to be made available, in this manner, i.e. by means of the additionally contacted chips.

By means of MEMS technology it is possible to place the gas-sensing element not only in the proximity of the opening 26a, but possibly also directly above the opening, i.e. the gas-sensing element may project into the opening. To this end, the sensory element may be suspended within the opening 26a. A pump having an above-described functionality may also utilize part of the available chip volume, for example. Thus, another part of the available chip volume, e.g. a region provided for a loudspeaker and/or a microphone, may be used for said purpose. Also, the chip volume or part of the chip volume may be employed as an ultrasonic transducer or for any other function described herein.

It is possible to employ the technology described also as a micro-dosage unit comprising integrated sensor technology and signal processing. For example, a glucose sensor may be integrated as a MEMS element with a micropump connected to an integrated reservoir realized within the layer 36. As soon as the glucose sensor indicates a critical blood sugar level, the pump may dispense the needed amount of insulin from the reservoir. Similar uses are feasible for other medication and/or active substances such as pain killers, for example, e.g. as a morphine or hydromorphone pump.

In other words, the novel approach is also based on the fact that sound sensing and/or sound reproduction is effected by means of a MEMS chip wherein the fluidically active elements are accommodated inside the chip rather than on the chip surface. As a result, the surfaces on the top and bottom sides of the chip remain fully or at least largely available for monolithically integrating further sensors, actuators and electronic circuits. The representations given herein essentially relate to utilization of said principle. However, the invention is not restricted thereto but may generally be used for all MEMS loudspeakers and MEMS microphones wherein sound generation and/or sound processing is effected inside a chip volume.

Figure 19B:
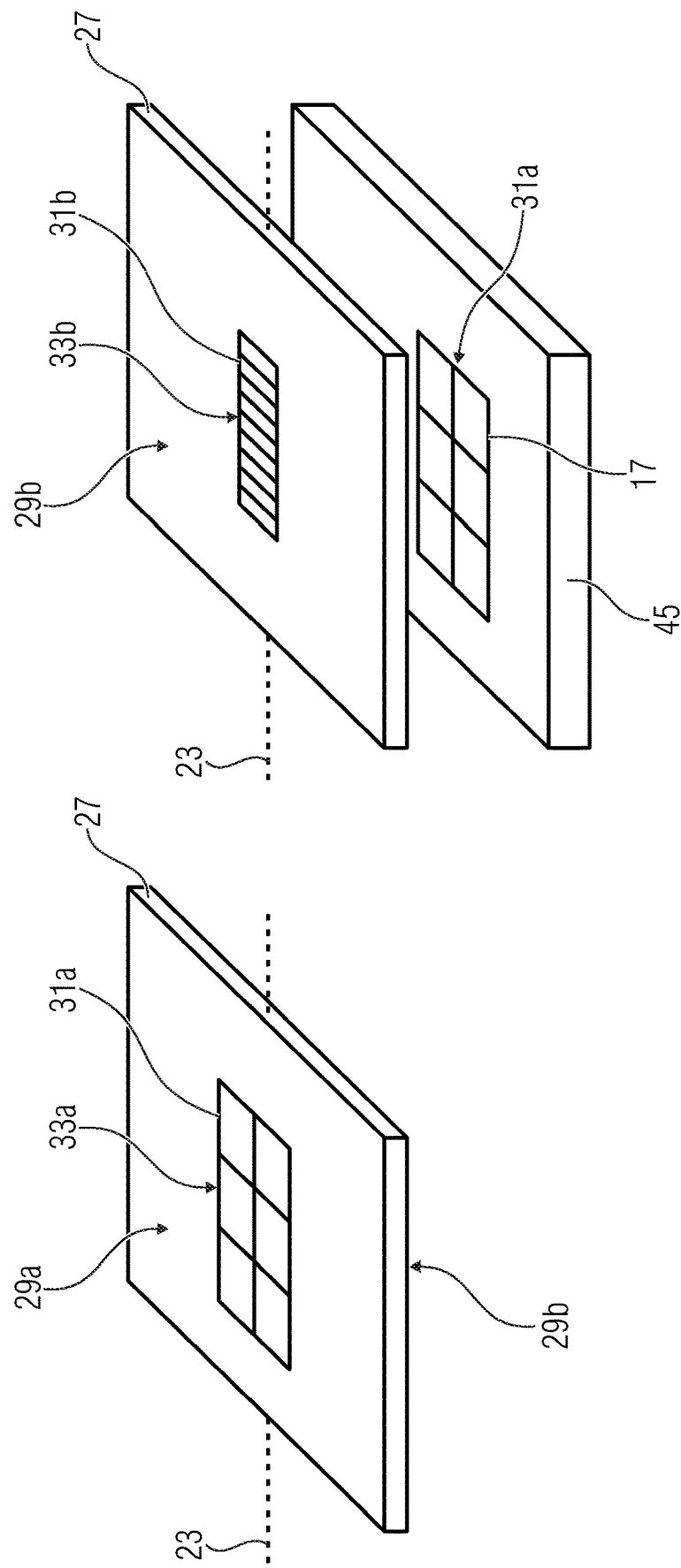
FIG. 19b shows a schematic view of using an adaptation layer in accordance with an embodiment.

FIG. 19b shows advantageous utilization of the adaptation layer of FIG. 19a. As was already mentioned, the adaptation layer may be configured as a semiconductor layer, i.e. may include semiconductor materials such as silicon or gallium arsenide, for example. At the first layer main side 29a, the adaptation layer 27 may comprise the first electronic pattern 31a comprising the first distance raster 33a. On the second, opposite layer main side 29b, the adaptation layer 27 may comprise the second electronic pattern 31b comprising a second distance raster 33b. The first and second electronic patterns 31a and 31b are electrically connected to each other, so that contacting of an electronic circuit, e.g. the circuit 17 on one of the sides 29a or 29b, enables adaptation of the distance raster 33a or 33b onto the other distance raster 33b or 33a.

The adaptation layer 27 may be arranged in a MEMS layer stack, e.g. in a MEMS transducer described herein. The MEMS layer stack may comprise a circuit layer 45 comprising an electronic circuit, e.g. the electronic circuit 17, which comprises one of the distance rasters 33a or 33b. The layer 45 may be, e.g., the layer 32b or another layer having an electronic circuit. The electronic circuit 17 may thus be electrically connected to the first or second electronic pattern 31a or 31b such that the electronic circuit 17 may be contacted via the other layer main side 29b and, consequently, with a different distance raster, which is why the layer 29 may also be used as an interposer. A layer stack connected to the adaptation layer 27 may be a layer stack described herein when the electronic circuit 17 is not there. The layer stack may be connected to the layer stack by means of the adaptation layer 27 so as to perform evaluation and/or controlling of the deformable elements. For example, looking at the MEMS transducer 20, it would also be possible to arrange, instead of the electronic circuit, the electronic structure for connecting to the electronic circuit, which means that the layer 32b might be configured as an adaptation layer.

A MEMS layer stack in accordance with embodiments described herein may form a MEMS transducer for interacting with the volume flow 12 of a fluid and include the following:

the substrate 14 which comprises a layer stack having a plurality of layers 32a-b, 34a-b, 36, which form a plurality of substrate planes, and which comprises a cavity 16 within the layer stack;

an electronic transducer 18; 18a-f connected to the substrate 14 within the cavity (16) and comprising an element 22; 22a-f; 30; 40; 150; 160 which is deformable at least within a plane of movement of the plurality of substrate planes, deformation of the deformable element 22; 22a-f; 30; 40; 150; 160 within the plane of movement and the volume flow 12 of the fluid being causally correlated;

The electronic circuit 17 is connected to the electromechanical transducer 18; 18a-f via the semiconductor layer.

The electronic circuit 17 is configured to provide a conversion between a deformation of the deformable element 22; 22a-f; 30; 40; 150; 160 and an electric signal.

A method of providing a semiconductor layer 27 includes arranging a first electronic pattern 31a at a first layer main side 29a of the semiconductor layer 27, so that the first electronic pattern 31a comprises a first distance raster 33a. The method further includes arranging a second electronic pattern 31b at a second, oppositely located layer main side 29b of the semiconductor layer 27, so that same comprises a second distance raster 33b. The method includes connecting the first and second electronic patterns 31a, 31b to each other.

Figure 20:
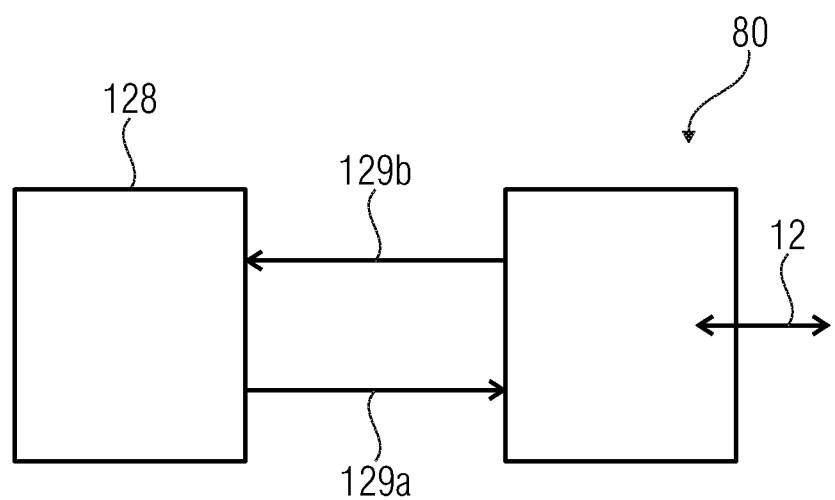
FIG. 20 shows a schematic block diagram of a MEMS system in accordance with an embodiment.

FIG. 20 shows a schematic block diagram of a MEMS system 200 comprising the MEMS transducer 80 connected to a control device 128 configured to perform processing of the signals to be provided to the MEMS transducer 80 and/or of the signals received from the MEMS transducer. For example, the electronic circuit may control the electrodynamic transducer of the MEMS device 80 and/or may receive electric signals from the electrodynamic transducers of the MEMS device 80. Information about how corresponding controlling is to be effected and/or an evaluation may be performed within the control device 128.

For example, if the MEMS transducer 80 comprises a multitude of electromechanical transducers 18, the control device 128 may be configured to provide information for the multitude of electromechanical transducers, e.g. for a shared electronic circuit and/or for individual electronic circuits, so that a first and an adjacent second electromechanical transducer move toward each other at least locally during a first time interval. The control device 128 may be configured to control the at least one electronic circuit among a multitude of electromechanical transducers in such a manner that the first electromechanical transducer and a third electromechanical transducer, which is arranged adjacently to the first electromechanical transducer, move toward each other during a second interval; the first electromechanical transducer may be arranged between the second and third electromechanical transducers. For example, said electromechanical transducers may be the electromechanical transducers 18a-c; the electromechanical transducer 18b may be the first electromechanical transducer.

Alternatively or additionally, the control device 128 may be configured to receive an electric signal, which is based on a deformation of the deformed element, from the electronic circuit and to evaluate same. For example, the control device 128 may be configured to determine a frequency or an amplitude of the deformation. This means that the system 200 may be operated as a sensor and/or actuator.

The system 200 may be operated as a MEMS loudspeaker, for example; the volume flow 12 may be an acoustic soundwave or an ultrasonic wave.

Alternatively, the system 200 may be configured as a MEMS pump. A cavity of the substrate may comprise a first opening 26 and a second opening 26 in the substrate 14. The electromechanical transducer 18 may be configured to provide the volume flow 12 on the basis of the fluid. The electromechanical transducer may be configured to convey the fluid through the first opening 26 toward the cavity on the basis of actuation of the electromechanical transducer 18, or to convey the fluid through the second opening away from the cavity on the basis of said actuation.

Alternatively, the system 200 may be operated as a MEMS microphone; on the basis of the deformation of the deformable element, an electric signal is obtainable at a port of the electromechanical transducer 80 or of a different electromechanical transducer connected. Deformation of the deformable element may be caused on the basis of the volume flow 12.

Alternatively or additionally, MEMS transducers described herein may be configured as MEMS valves or MEMS dosage systems. A MEMS dosage system may be employable, e.g., for implantable medication and/or insulin pumps.

Even though the system 200 is described such that the control device 128 is connected to the MEMS transducer 80, it is also possible for a different MEMS transducer to be arranged, e.g. the MEMS transducer 10, 20, 50, 100, 110, 170, 180, 180', 230 and/or 240. Alternatively or additionally, several MEMS transducers in accordance with above-described embodiments may be arranged. Alternatively or additionally, a stack of MEMS transducers may be arranged, e.g. the stack 90 or 140. Alternatively or additionally, at least two MEMS transducers may be arranged. At least a first MEMS transducer and a second MEMS transducer may comprise cavities or partial cavities and/or electromechanical transducers with different resonant frequencies, e.g. a chamber comprising 500 Hz actuators, a further chamber or a further (partial) cavity comprising 2 kHz actuators, etc.

Figure 21A:
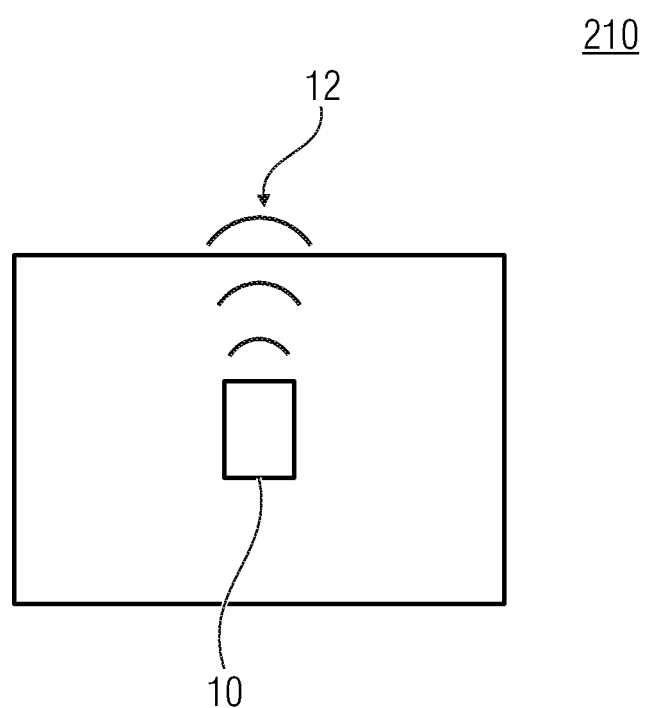
FIG. 21a shows a device in accordance with an embodiment.

The above-explained MEMS transducers may be employed in devices. An example of such a device 210 in accordance with an embodiment is shown in FIG. 21a. The device 210 includes, e.g., the MEMS transducer 10; however, alternatively or additionally, it may also include a different MEMS transducer 20, 50, 100, 110, 170, 180, 180', 230 and/or 240 described herein. The MEMS transducer is configured, e.g., as a MEMS loudspeaker for generating an acoustic fluid flow 12 in the form of soundwaves, the device 210 being configured as a mobile music reproduction device or as headphones.

Figure 21B:
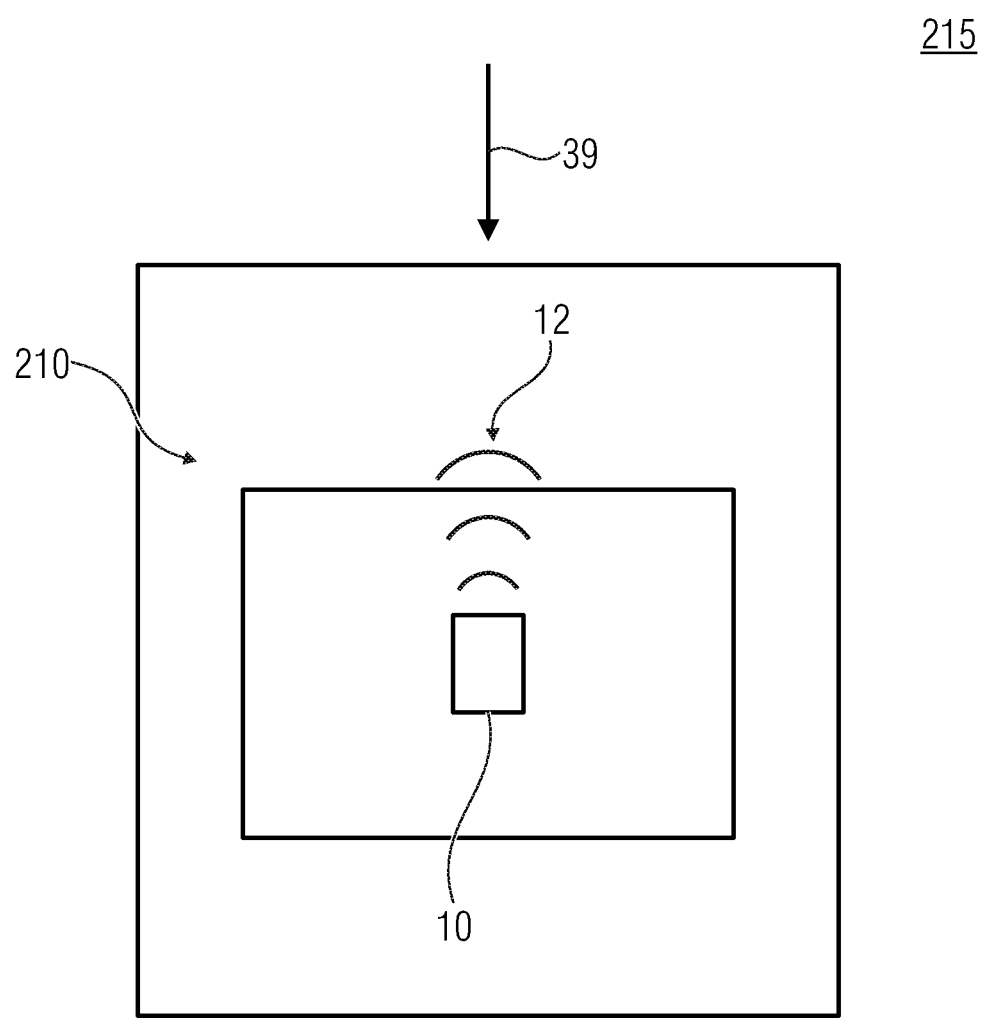
FIG. 21b shows a schematic block diagram of a further system in accordance with an embodiment, which system may be configured as a universal translator and/or as a navigation assistance system.

FIG. 21b shows a schematic block diagram of a system 215 in accordance with an embodiment, which may include the device 210, for example. The MEMS transducer 10 and/or a different MEMS transducer arranged may be configured as a loudspeaker and be implemented to reproduce, on the basis of an output signal 39, an acoustic signal in the form of a fluid flow 12. The output signal may be an analog or a digital signal comprising acoustic information, e.g. including voice information. The signal 215 may be configured, e.g., as a universal translator and/or as a navigation assistance system both for indoor (within buildings) and outdoor (outside buildings) applications. To this end, the system 215 may comprise further components, e.g. a microphone and/or a device for position determination as well as a calculating unit, e.g. a CPU. The microphone may also be configured as a MEMS transducer described herein. The calculating unit may be configured to convert voice content in a first language, which is picked up by means of the microphone, to a second language so as to provide the output signal 39 with the second language. Alternatively, the calculating unit may be configured to provide, on the basis of a determined position, the output signal 39 such that it comprises voice information with regard to the position determined, which may then be reproduced by the MEMS transducer 10.

Figure 22:
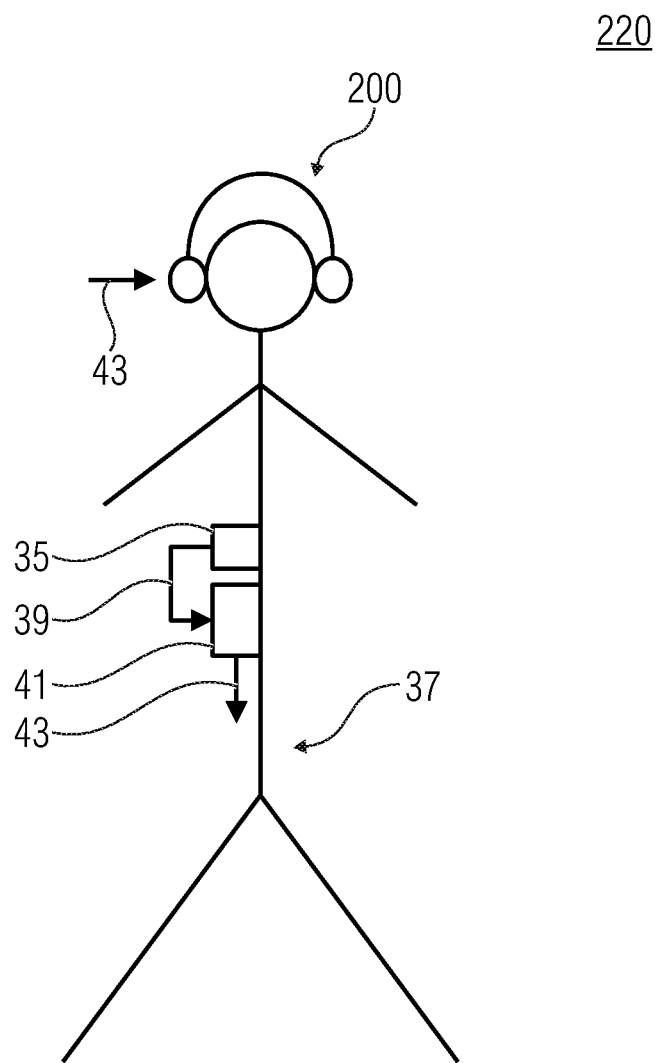
FIG. 22 shows a schematic representation of a health assistance system in accordance with an embodiment.

FIG. 22 shows a schematic representation of a health assistance system 220 in accordance with an embodiment. The health assistance system 220 includes a sensor means 35 for sensing a vital function of a body 37 and for outputting a sensor signal 39 on the basis of said sensed vital function. The health assistance system 220 includes a processing means 41 for processing the sensor signal 39 and for providing an output signal on the basis of said processing. The health assistance system 220 includes headphones, e.g. the device 200 including a MEMS transducer in accordance with the embodiments described herein. The MEMS transducer is configured as a loudspeaker and includes a wireless communication interface for receiving the output signal 43. The loudspeaker 200 is configured to reproduce an acoustic signal on the basis of the output signal 43. Implementation of the loudspeaker as headphones, in particular as in-ear headphones, offers advantages. For example, the monitored vital function may be announced to the user, e.g. the pulse rate during sports. It is also possible to output a quantity derived from the vital function, e.g. a threshold value being exceeded or fallen below or the like.

FIG. 23 shows a schematic top view of a MEMS transducer 230 comprising a multitude of electromechanical transducers 18a to 18i, the electromechanical transducers 18a to 18f being arranged next to one another within a first cavity 16a in a laterally offset manner, and the electromechanical transducers 18g to 18i being arranged next to one another within a second cavity 16b in a laterally offset manner. The cavities 16a and 16b may comprise openings in non-depicted bottom and/or lid faces of the substrate 14. The MEMS transducer 230 may be employable as a loudspeaker and/or microphone, which is true both for individual electromechanical transducers 18a to 18i and to electromechanical transducers 18a to 18f or 18g to 18i of a respective cavity 16a and 16b. The loudspeakers and/or microphones may also be implemented to be optimized for emitting and/or receiving sound waves via vibrations. For example, they may be placed with the human body, ideally close to a bone, so as to transmit and/or receive information via solid-borne sound. In this case, a variant is one wherein all of the actuators move in the same direction, respectively, i.e. irrespectively of an approach stating that a chamber comprises two movable walls. The electromechanical transducers 18a to 18i include beam elements clamped on one side. The MEMS transducer 230 includes the non-depicted electronic circuit 17.

In other words, the left-hand chamber, cavity 16a, contains laterally or vertically movable bending actuators which vibrate in phase and thus cause the chip to vibrate so as to transmit sound in this manner. The right-hand chamber, cavity 16b, contains three lateral or vertical bending actuators, which also vibrate in phase but cover a different frequency range than the left-hand chamber due to their dimensioning (thickness, length or width).

FIG. 24 shows a schematic top view of a MEMS transducer 240 comprising a multitude of electromechanical transducers 18a to 18i, the electromechanical transducers 18a to 18f being arranged next to one another in a laterally offset manner and mutually space apart respectively adjacent cavities 16a to 16k or partial cavities. The electromechanical transducers 18a to 18i include beam elements clamped on both sides. The MEMS transducer 240 includes the non-depicted electronic circuit 17.

Even though the embodiments of FIGS. 23 and 24 are depicted such that the MEMS transducer 230 comprises exclusively such beam elements which are clamped on one side, and since the MEMS transducer 240 comprises exclusively such beam elements which are clamped on both sides, the embodiments are also combinable with one another as desired, so that depending on the cavity 16a or 16b, electromechanical transducers of the same type may be arranged independently of one another, or electromechanical transducers of different types may be arranged within a cavity.

In other words, FIG. 24 shows a same principle as FIG. 23, but in this case, bending actuators which are clamped on both sides are used.

Further embodiments relate to a method of producing a MEMS transducer. The method includes providing a substrate which comprises a layer stack having a plurality of layers which form a plurality of substrate planes, and which comprises a cavity within the layer stack. The method includes producing an electromechanical transducer within the substrate, so that the former is connected to the substrate within the cavity and comprises an element which is deformable within at least one plane of movement of the plurality of substrate planes, deformation of the deformable element within the plane of movement and the volume flow of the fluid being causally correlated. The method includes arranging an electronic circuit within a layer of the layer stack, so that the electronic circuit is connected to the electromechanical transducer and is configured to provide a conversion between a deformation of the deformable element and an electric signal.

Even though the above-described embodiments relate to the fact that the volume flow may be generated in that two electromechanical transducers move toward each other, the volume flow may also be obtained on the basis of, or in causal interaction with, a movement of an electromechanical transducer in relation to a rigid structure, e.g. the substrate. This means that a volume of a partial cavity or of a partial cavity portion may be influenced by an individual electromechanical transducer.

Above-described embodiments comprising a deformable element that is configured to perform multiple curvatures, and/or that is connected to a plate element may be usable, as compared to the configuration as described in connection with FIG. 1, for generating a clearly larger volume flow or for reacting clearly more sensitively to a volume flow.

Embodiments enable rendering the frequency-dependent curve of the sound pressure to be set in a flexible manner so as to enable, in particular, also the case of as flat a frequency response as possible, which is often strived for.

In order to design a frequency-dependent sound pressure curve—with as few chambers of the MEMS transducer as possible—in as flat a manner as possible, it is advantageous for the Q factor of the vibratory bending beams to be low, i.e. the bending beams have a broad resonance curve. To this end, clamping of the beams may be configured such that the beam vibration is additionally attenuated by means of an attenuating material. Clamping of the beam is manufactured from a non-crystalline material. This includes silicon oxide, polymers such as SU8 or other resists, for example. Attenuation of the beam vibration may also be achieved electrically. For example, due to the change in capacitance, a periodically alternating current flows during free beam vibration in an electrostatic or piezoelectric actuator when voltage is applied. Due to suitably provided electric resistors, power dissipation arises which results in attenuation of the vibration. A complete electric resonant circuit (i.e., an integrated or external coil is additionally provided) is also possible. Attenuation may also be achieved in that additional structures are implemented at the bending beams which represent a significant flow resistance to the fluid as it flows into and out of the chamber.

Specifically for representing low resonant frequencies—for generating and/or detecting low frequencies—it may be advantageous to increase the mass of the bending beams. In order not to considerably increase stiffness, additional structures are mounted for this purpose in the region of the largest vibration amplitudes. In the event of a beam clamped on one side, the ideal location, or the region of the largest vibration amplitudes, is the end of the bending beam. In the event of a beam clamped on two sides, said ideal location will be the center of the beam.

In other words, a finding of the present invention is based on the fact that by compressing and/or expanding chambers, i.e. partial cavities or partial cavity portions which may be formed within a silicon chip, a volume flow is generated or becomes detectable. Each chamber may be provided with an inlet or an outlet through which a fluid, e.g. air, may flow in and out. The chambers may be closed by a fixed lid along a direction perpendicular to the lateral direction of movement (e.g. at the top and at the bottom). At least one of the sidewalls of each chamber is designed to be movable or deformable and may be displaced, by an actuator, such that the volume of said chamber decreases or increases.

Above-described embodiments of MEMS transducers may comprise electric connections, bondpads or the like, which are not shown in the figures for clarity's sake.

Above-described embodiments relate to multipath loudspeakers or N-way loudspeakers, which may be obtained on the basis of different resonant frequencies of at least two cavities or partial cavities. The electromechanical transducers and the cavities or partial cavities may be tuned to one another such that a sound pressure level (SPL) is, at least in sections, a function of the resonant frequency, i.e. several actuator chambers may comprise different frequency responses (SPL=f(frequency)). This means that values of sound pressure levels which are obtained on the basis of the deformation of the deformable elements and on the basis of the partial cavities exhibit a correlation with a frequency of the volume flow flowing out of or into the respective partial cavity. The correlation may be presentable as a function, it being possible for the function to be linear, for example, e.g. SPL=x*frequency+b, wherein x and b are variables. Alternatively, the function may be non-linear, i.e. square, exponential or based on a root function. The functional correlation may be readily transferred to different partial cavities or cavities arranged within different MEMS transducers. Thus, the frequency of the volume flow may describe a frequency-dependent curve of a pressure within the fluid.

The silicon chips of the MEMS transducers may be designed and be removed from the wafer array, which is obtained during manufacturing at the wafer level, such that they have a shape adapted to the respective application. For example, the chip may be designed to be round for application as a loudspeaker in hearing aids or in in-ear headphones, or it may be designed to be hexagonal, which is more suitable in terms of consumption of silicon surface area on the wafer.

The technical implementation of monolithic integration of microelectronic components and/or microsystems on the surface and undersurface of a MEMS loudspeaker using the chip volume for sound generation may be supplemented by several aspects. The microelectronic components such as the MEMS structures, for example, may be integrated into one or more layers. The electronic control and/or evaluation circuit, i.e. the electronic circuit 17, may comprise a digital-to-analog converter and/or a PWM generator. Signal conditioning may be effected, e.g., by means of digital signal processing, which may be part of the electronic circuit 17. The electronic circuit 17 may further include clock generators and/or oscillators, may comprise high-voltage generation, i.e. a DC/DC converter, a charge pump or a boost chopper, may comprise a decoder, e.g. for digital audio signals such as the "sound wire" standard, or an MP3 decoder. In addition, the electronic circuit may include an amplifier or a power bank. The electronic circuit 17 may comprise a processor such as a CPU, for example, which may be used, for example, for text-to-speech or speech-to-text algorithms. Moreover, the electronic circuit 17 may comprise a semiconductor memory such as a RAM memory or a flash memory, for example. The MEMS transducers may include MEMS sensors such as acceleration sensors, temperature sensors, rotation-rate sensors, position sensors or magnetic fields sensors, which are controlled or read out by parts of the electronic circuit 17 or further circuit components. In addition, temperature or moisture sensors or gas sensors may be provided. Alternatively or additionally, it is possible to provide radio interfaces, or wireless interfaces, for near-field communication, e.g. a Bluetooth interface. It is also possible for a mobile radio interface such as for LTE and/or eSIM (embedded SIM), a machine/machine interface such as iBeacon or physical Web, for example, to be provided. Alternatively or additionally, a receiver for global navigation satellite systems such as GPS may be integrated. The MEMS transducers may be configured as MEMS microphones and/or MEMS loudspeakers or the like.

The MEMS transducers enable a system function, i.e. a combination with further functions or applications. They include, e.g., MP3 players, entertainment technology, streaming, headsets, walkie-talkies and the like. Application in hearing aids is also possible. Health assistance systems such as fitness trackers, which enable recording, comparison, optimization and/or announcement of vital data, including counting of steps, body temperature, respiratory rate and/or energy consumption, are also feasible. Systems may also relate to navigation assistance systems enabling support, e.g. in public spaces and/or within buildings, via speech-to-text and/or text-to-speech technologies or algorithms. This may relate to a specific group of persons, such as blind persons, and/or to specific buildings, such as public buildings, military buildings, police buildings and fire brigade buildings. In control systems, embodiments described herein may be employed, e.g., for controlling communication and devices via gestures and speech. In this context, for example, a human/machine interface may be provided via speech-to-text and/or text-to-speech technologies and/or algorithms. Also, applications in universal translation are conceivable, e.g. for simultaneous translation in the field of languages. Applications in virtual reality may also be implemented, for example purely acoustic virtual reality, e.g. for blind people, supporting visual virtual reality, which is also referred to as "augmented reality", an audible internet, audible social networks or the like. Alternatively or additionally, an audio signature may be implemented which enables personalization of the speech commands. These include, e.g., security-relevant logins, e.g. for an audible internet and human/machine communication. Recognition of safety-critical acoustic events, e.g. a call for help, may also be implemented. Without limitation, said same illustrations also apply to MEMS microphones for receiving acoustic signals.

In the following, additional embodiments and aspects of the invention will be described which can be used individually or in combination with any of the features and functionalities and details described herein.

According to a first aspect, an MEMS transducer for interacting with a volume flow 12 of a fluid comprises: a substrate 14 which comprises a layer stack having a plurality of layers 32a-b, 34a-b, 36 which form a plurality of substrate planes, and which comprises a cavity 16 within the layer stack; an electromechanical transducer 18; 18a-f connected to the substrate 14 within the cavity 16 and comprising an element 22; 22a-f; 30; 40; 150; 160 which is deformable within at least one plane of movement of the plurality of substrate planes, deformation of the deformable element 22; 22a-f; 30; 40; 150; 160 within the plane of movement and the volume flow 12 of the fluid being causally correlated; an electronic circuit 17; 17a-b arranged within a layer 32a-b of the layer stack, the electronic circuit 17; 17a-b being connected to the electromechanical transducer 18; 18a-f and being configured to provide a conversion between a deformation of the deformable element 22; 22a-f; 30; 40; 150; 160 and an electric signal.

According to a second aspect with reference to the first aspect, the electronic circuit 17; 17a-b is configured to convert an electric control signal In$_1$ to a deflection of the deformable element 22; 22a-f; 30; 40; 150; 160 or to convert a deformation of the deformable element 22; 22a-f; 30; 40; 150; 160 to an electric output signal Out$_2$.

According to a third aspect with reference to the second aspect, the electronic circuit 17; 17a-b includes at least one of a digital-to-analog converter for converting a digital version of the control signal In$_1$ to an analog version of the control signal Out$_1$, an analog-to-digital converter for converting an analog version of the electric output signal In$_1$ to a digital version of the electric output signal Out$_1$, a signal decoder, a processor, a semiconductor memory, a wireless communication interface for near-field communication, and a mobile radio interface.

According to a fourth aspect with reference to any of the second to third aspects, the electronic circuit 17; 17a-b is configured to convert the electric control signal In to a deflection of the deformable element 22; 22a-f; 30; 40; 150; 160, and includes a switching amplifier configured to provide a digital pulse-width modulated control signal for the deformable element 22; 22a-f; 30; 40; 150; 160.

According to a fifth aspect with reference to any of the second to fourth aspects, the deformable element 22; 22a-f; 30; 40; 150; 160 is a first deformable element 22; 22a-f; 30; 40; 150; 160, the MEMS transducer including at least a second deformable element 22; 22a-f; 30; 40; 150; 160, the electronic circuit 17; 17a-b being configured to convert the electric control signal In to a deflection of the first and second deformable elements 22; 22a-f; 30; 40; 150; 160 or to convert deformations of the first and second deformable elements 22; 22a-f; 30; 40; 150; 160 to the electric output signal Out$_2$.

According to a sixth aspect with reference to any of the first to fifth aspects, the deformable element 22; 22a-f; 30; 40; 150; 160 is actively formed and is configured to interact with the volume flow 12; or a plate element 62; 62a-c connected to the deformable element 22; 22a-f; 30; 40; 150; 160 is configured to be rigid and to interact with the volume flow 12.

According to a seventh aspect with reference to any of the first to sixth aspects, the layer 32a-b which has the electronic circuit 17; 17a-b arranged therein is arranged along a direction perpendicular to the plane of movement.

According to an eighth aspect with reference to any of the first to seventh aspects, the layer 32a-b which has the electronic circuit 17; 17a-b arranged therein is electrically connected to an outer side of the MEMS transducer, or is the outer side of the MEMS transducer and may be contacted to a lead assembly.

According to a ninth aspect with reference to any of the first to eighth aspects, the layer 32a-b which has the electronic circuit 17; 17a-b arranged therein is a first lid layer, the electronic circuit 17; 17a-b being a first electronic circuit 17a, and wherein a second electronic circuit 17b is arranged in a second lid layer of the substrate 14.

According to a tenth aspect with reference to the ninth aspect, the deformable element 22; 22a-f; 30; 40; 150; 160 is arranged, at least some of the time, between the first and second electronic circuits 17a, 17b during deformation.

According to an eleventh aspect with reference to any of the ninth or tenth aspects, the second electronic circuit 17b is connected to the electromechanical transducer 18; 18a-f or to the first electronic circuit 17a and is configured to provide a function, complementary to the first electronic circuit 17a, in connection with the deformable element 22; 22a-f; 30; 40; 150; 160.

According to a twelfth aspect with reference to any of the first to eleventh aspects, the layer stack comprises an adaptation layer 27 comprising, at a first layer main side 29a, a first electronic pattern 311a having a first distance raster 33a and comprising, at a second, oppositely located layer main side 29b, a second electronic pattern 31b having a second distance raster 33b, the first electronic structure and the second electronic structure being connected to each other in the adaptation layer.

According to a thirteenth aspect with reference to the twelfth aspect, the adaptation layer 27 is a lid layer of the stack and has the electronic circuit 17; 17a-b at least partly arranged therein, or is a lid layer of the stack which is electrically configured as an adaptation layer exclusively.

According to a fourteenth aspect with reference to any of the first to thirteenth aspects, the layer 32a-b which has the electronic circuit 17; 17a-b arranged therein includes a functional element 21 connected to the electronic circuit 17; 17a-b, the electronic circuit 17; 17a-b being configured to control or evaluate the functional element 21.

According to a fifteenth aspect with reference to any of the first to fourteenth aspects, the layer 32a-b which has the electronic circuit 17; 17a-b arranged therein is a first lid layer, the electronic circuit 17; 17a-b being a first electronic circuit 17a, and wherein a second electronic circuit 17b and a functional element 21 are arranged in a second lid layer of the substrate 14, the second electronic circuit 17b being connected to the functional element 21 and configured to control or evaluate the functional element 21.

According to a sixteenth aspect with reference to any of the fourteenth to fifteenth aspects, the functional element 21 includes at least one of a sensor, an actuator, a wireless communication interface, a light source, a memory component, a processor, and a navigation receiver.

According to a seventeenth aspect with reference to the sixteenth aspect, the functional element 21 includes at least one of a MEMS sensor and a MEMS actuator.

According to an eighteenth aspect with reference to any of the first to seventeenth aspects, the electronic circuit 17; 17a-b is arranged in a lid layer of the substrate 14, and wherein, in addition, a gas-sensing functional element is arranged in the lid layer, the lid layer comprising an opening 26a configured to allow the fluid flow 12 to pass, the gas-sensing functional element being configured to sensorically interact with the fluid flow 12.

According to a nineteenth aspect with reference to the eighteenth aspect, the opening is encompassed by the gas-sensing functional element 21 in the lid layer.

According to a twentieth aspect with reference to the eighteenth aspect, the gas-sensing functional element 21 at least partly projects into the opening 26a.

According to a twenty-first aspect with reference to any of the first to twentieth aspects, the layer 32a-b which has the electronic circuit 17; 17a-b arranged therein is a first substrate layer, and wherein the electronic circuit 17; 17a-b is at least partly arranged in an adjacent second substrate layer.

According to a twenty-second aspect with reference to any of the first to twenty-first aspects, the electronic circuit 17; 17a-b is arranged along a direction perpendicular to the plane of movement, and a location of the electronic circuit 17; 17a-b, when said said location is projected into the plane of movement, corresponds to a location where the deformable element 22; 22a-f; 30; 40; 150; 160 is at least partly located during deformation.

According to a twenty-third aspect with reference to any of the first to twenty-second aspects, the electromechanical transducer 18; 18a-f is configured to cause a movement of the fluid within the cavity 16 in response to electrical controlling Out, $Out_1$ of the electronic circuit 17; 17a-b, and/or to causally provide an electric signal $Out_2$ to the electronic circuit 17; 17a-b in response to the movement of the fluid within the cavity 16.

According to a twenty-fourth aspect with reference to any of the first to twenty-third aspects, the MEMS transducer includes a plurality of electromechanical transducers 18; 18a-f, first and second deformable elements 22; 22a-f; 30; 40; 150; 160 including a beam structure 30 configured to curve along an axial direction of the beam structure 30; a first partial cavity 42a, 42b adjoining an opening 26 of the substrate 14 being arranged between the beam structures 30 of the first electromechanical transducer 18b, 18d and the second electromechanical transducer 18c, 18e.

According to a twenty-fifth aspect with reference to any of the first to twenty-fourth aspects, the MEMS transducer comprises a multitude of electromechanical transducers 18; 18a-f connected to the substrate 14 and each comprising an element 22; 22a-f; 30; 40; 150; 160 deformable along the lateral direction of movement 24; a first partial cavity 42a, 42b being arranged between a first electromechanical transducer 18b, 18d and a second electromechanical transducer 18c, 18e, and a second partial cavity 38a, 38b being arranged between the second electromechanical transducer 18b, 18d and a third electromechanical transducer 18a, 18c.

According to a twenty-sixth aspect with reference to the twenty-fifth aspect, the first and second electromechanical transducers 18b, 18d are configured to change a volume of the first partial cavity at a first frequency, the first 18b, 18d and the third 18a, 18c electromechanical transducers being configured to change a volume of the second partial cavity at a second frequency.

According to a twenty-seventh aspect with reference to any of the twenty-fifth to twenty-sixth aspects, the substrate 14 comprises a multitude of openings connected to a multitude of partial cavities of the cavity 16, a volume of each partial cavity being influenced by a deflection state of at least one element deformable along the lateral direction of movement, two adjacent partial volumes of partial cavities being able to be increased or decreased in a complementary manner during the first or second time interval.

According to a twenty-eighth aspect with reference to any of the twenty-fifth to twenty-seventh aspects, the deformable elements 22; 22a-f; 30; 40; 150; 160 of the first electromechanical transducer 18b, 18d, of the second electromechanical transducer 18c, 18e and of the third electromechanical transducer 18a, 18c each include a beam actuator 30 comprising a first and a second end in each case, the beam actuator 30 of the first electromechanical transducer 18b, 18d being connected to the substrate 14 at the first end and at the second end, the beam actuator of the second electromechanical transducer 18c, 18e or of the third electromechanical transducer 18a, 18c being connected to the substrate 14 in a central region of the beam actuator.

According to a twenty-ninth aspect with reference to any of the twenty-fifth to twenty-eighth aspects, the substrate 14 comprises a multitude of openings 26 connected to a multitude of partial cavities 42a-b, 38a-c of the cavity 16, a volume of each partial cavity 42a-b, 38a-c being influenced by a deflection state of at least one element 22; 22a-f; 30; 40; 150; 160 deformable along the lateral direction of movement 24, wherein values of sound pressure levels obtained on the basis of deformation of the deformable elements 22; 22a-f; 30; 40; 150; 160 and on the basis of the partial cavities 42a-b, 38a-c exhibit a correlation with a frequency of the volume flow 12 flowing out from or into the respective partial cavity 42a-b, 38a-c, which correlation may be depicted as a function; the frequency of the volume flow 12 describes a frequency-dependent progress of a pressure within the fluid.

According to a thirtieth aspect with reference to any of the first to twenty-ninth aspects, the electromechanical transducer 18; 18a-f includes a plurality of deformable elements 22; 22a-f; 30; 40; 150; 160 at least indirectly connected in the axial direction y of the electromechanical transducer 18;

18a-f, said elements being configured to influence a volume of first and second partial cavity portions 96a, 96b, respectively.

According to a thirty-first aspect with reference to the thirtieth aspect, the electromechanical transducer 18; 18a-f is configured to cause a movement of the fluid within the first 96a and second 96b partial cavity portions in response to electrical controlling 129a, the deformable elements 22; 22a-f; 30; 40; 150; 160 being configured to change the volumes of the first 96a and second 96b partial cavity portions at different frequencies.

According to a thirty-second aspect with reference to any of the first to thirty-first aspects, the deformable element 22; 22a-f; 30; 40; 150; 160 is arranged in a non-contact manner with a layer 32a-b of the substrate 14 which defines the cavity 16 in parallel with the plane of movement, or wherein a low-friction layer is arranged between the deformable element 22; 22a-f; 30; 40; 150; 160 and the layer 32a-b defining the cavity 16 in parallel with the plane of movement.

According to a thirty-third aspect with reference to any of the first to thirty-second aspects, the deformable element 22; 22a-f; 30; 40; 150; 160 is configured as a bimorph which comprises an actuation direction 59, 59' along which the deformable element 22; 22a-f; 30; 40; 150; 160 is deflectable by applying an electric voltage.

According to a thirty-fourth aspect with reference to the thirty-third aspect, the deformable element 22; 22a-f; 30; 40; 150; 160 comprises first 30a, second 30b and third 30c beam segments arranged along the axial direction y in this order and each comprising opposite actuation directions 59a-c.

According to a thirty-fifth aspect with reference to the thirty-fourth aspect, the electromechanical transducer 18; 18a-f includes first and second deformable elements 22; 22a-f; 30; 40; 150; 160, an outer beam segment 30a, 30c of the first deformable element 22; 22a-f; 30; 40; 150; 160 and an outer beam segment 30a, 30c of the second deformable element 22; 22a-f; 30; 40; 150; 160 being at least indirectly connected to each other.

According to a thirty-sixth aspect with reference to any of the first to thirty-fifth aspects, the substrate 14 comprises an anchor element 84; wherein the deformable element 22; 22a-f; 30; 40; 150; 160 is connected to the anchor element 84 in a central region 30b of an axial extension direction y of the deformable element 22; 22a-f; 30; 40; 150; 160; or wherein the deformable element 22; 22a-f; 30; 40; 150; 160 is connected to a further deformable element at an outer beam segment 30a, 30c via the anchor element 84.

According to a thirty-seventh aspect with reference to any of the first to thirty-sixth aspects, the deformable element 22; 22a-f; 30; 40; 150; 160 comprises a beam structure, the beam structure being fixedly clamped at first and second ends.

According to a thirty-eighth aspect with reference to any of the first to thirty-seventh aspects, the cavity 16 comprises an opening 26 in the substrate 14 which is arranged perpendicularly to the lateral direction of movement 24, so that the volume flow 12 flows out of or into the cavity 16 on the basis of the deformation of the deformable element 22; 22a-f; 30; 40; 150; 160 in a manner that is perpendicular to the lateral direction of movement 24.

According to a thirty-ninth aspect with reference to any of the first to thirty-eighth aspects, the deformable element is arranged adjacently to the opening 26.

According to a fortieth aspect with reference to any of the first to thirty-ninth aspects, the MEMS transducer is configured as one of a MEMS pump, a MEMS loudspeaker, a MEMS microphone, a MEMS valve, and a MEMS dosage system.

A forty-first aspect relates to a device comprising a MEMS transducer of any of the first to fortieth aspects, wherein the MEMS transducer is configured as a MEMS loudspeaker, the device being configured as a mobile music reproduction device or as headphones.

A forty-second aspect relates to a system comprising a MEMS transducer of any of the first to forty-first aspects, wherein the MEMS transducer is configured as a loudspeaker and is designed to reproduce an acoustic signal on the basis of an output signal.

According to a forty-third aspect, the system of the forty-second aspect is configured as a universal translator or as a navigation assistance system.

A forty-fourth aspect relates to a semiconductor layer comprising, at a first layer main side 29a, a first electronic pattern 31a having the first distance raster 33a, and comprising, at a second, oppositely located layer main side 29b, a second electronic pattern 31b having a second distance raster 33b, the first and second electronic patterns 31a, 31b being electrically connected to each other.

A forty-fifth aspect relates to an MEMS layer stack comprising a semiconductor layer of the forty-fourth aspect and comprising a circuit layer which has an electronic circuit 17 including a first distance raster 33a; wherein the electronic circuit 17 is connected to the first electronic structure, so that the electronic circuit 17 may be contacted via the second layer main side 29b.

According to a forty-sixth aspect, the MEMS layer stack of the forty-fifth aspect forms a MEMS transducer for interacting with a volume flow 12 of a fluid, and comprises: a substrate 14 which comprises a layer stack having a plurality of layers 32a-b, 34a-b, 36 which form a plurality of substrate planes, and which comprises a cavity 16 within the layer stack; an electromechanical transducer 18; 18a-f connected to the substrate 14 within the cavity 16 and comprising an element 22; 22a-f; 30; 40; 150; 160 which is deformable within at least one plane of movement of the plurality of substrate planes, deformation of the deformable element 22; 22a-f; 30; 40; 150; 160 within the plane of movement and the volume flow 12 of the fluid being causally correlated; wherein the electronic circuit 17 is connected to the electromechanical transducer 18; 18a-f via the semiconductor layer; wherein the electronic circuit 17; 17a-b is configured to provide conversion between deformation of the deformable element 22; 22a-f; 30; 40; 150; 160 and an electric signal.

A forty-seventh aspect relates to a health assistance system 220 comprising: a sensor means 35 for sensing a vital function of a body 37 and for outputting a sensor signal 39 on the basis of the sensed vital function; processing means 41 for processing the sensor signal 39 and for providing an output signal 43 on the basis of said processing; and headphones 200 including a MEMS transducer as claimed in any of claims 1 to 38, the MEMS transducer being configured as a loudspeaker and including a wireless communication interface for receiving the output signal 43, and being configured to reproduce an acoustic signal on the basis thereof.

According to a forty-eighth aspect with reference to the forty-seventh aspect, the headphones are formed as in-ear headphones.

According to a forty-ninth aspect, a method of providing a MEMS transducer for interacting with a volume flow 12 of a fluid comprises the steps of: providing a substrate 14 which comprises a layer stack having a plurality of layers 32a-b, 34a-b, 36 which form a plurality of substrate planes, and which comprises a cavity 16 within the layer stack; producing an electromechanical transducer 18; 18a-f within the substrate 14, so that the former is connected to the substrate 14 within the cavity 16 and comprises an element 22; 22a-f; 30; 40; 150; 160 which is deformable within at least one plane of movement of the plurality of substrate planes, deformation of the deformable element 22; 22a-f; 30; 40; 150; 160 within the plane of movement and the volume flow 12 of the fluid being causally correlated; arranging an electronic circuit 17; 17a-b within a layer 32a-b of the layer stack, so that the electronic circuit 17; 17a-b is connected to the electromechanical transducer 18; 18a-f and is configured to provide a conversion between a deformation of the deformable element 22; 22a-f; 30; 40; 150; 160 and an electric signal.

According to a fiftieth aspect, a method of providing a semiconductor layer comprises the steps of: arranging a first electronic pattern 31a at a first layer main side 29a, so that the first electronic structure comprises a first distance raster 33a; arranging a second electronic pattern 31b at a second, oppositely located layer main side 29b, so that same comprises a second distance raster 33b; and connecting the first and second electronic patterns 31a, 31b to each other.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described in connection with or as a method step also represent a description of a corresponding block or detail or feature of a corresponding device.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

LITERATURE

[1] Albach, Thorsten Sven: Magnetostriktive Mikroaktoren und deren Anwendung als Mikrolautsprecher, Dissertation, Universität Erlangen-Nürnberg (2013).
[2] Roberts, Robert C. et al.: Electrostatically Controlled Touch-Mode Poly-SiC Micro-speaker, Sensors, IEEE 2007 (2007), p. 284-287.
[3] Kim, H. et al.: Bi-directional Electrostatic Microspeaker with Two Large-Deflection Flexible Membranes Actuated by Single/Dual Electrodes, Sensors, IEEE 2005 (2005), p. 89-92.
[4] Rehder, J.; Rombach, P.; Hansen, O.: Magnetic flux generator for balanced mem-brane loudspeaker. In: Sensors and Actuators A: Physical 97 (2002), No. 8, p. 61-67.
[5] Neri, F.; Di Fazio, F.; Crescenzi, R.; Balucani, M.: A novel micromachined loud-speaker topology. In: 61 st Conf. on Electronic Components and Technology, ECTC, IEEE 2011 (2011), p. 1221-1227.
[6] Neumann, J. J., Gabriel, K. J.: CMOS-MEMS Acoustic Devices, in: Advanced Micro and Nanosystems, Vol. 2. CMOS-MEMS. Edited by H. Baltes et al., Wiley-VCH Verlag, Weinheim (2005).
[7] Lerch R.; Sessler, G.; Wolf, D.: Technische Akustik, Springer Verlag (2009).
[8] Schenk, H. et al.: A resonantly excited 2D-micro-scanning-mirror with large deflec-tion, Sensors and Actuators A 89 (2001), p. 104-111.
[9] Rosa, M. A. et al.: A novel external electrode configuration for the electrostatic actu-ation of MEMS based devices, J. Micromech. Microeng. (2004), p. 446-451.
[10] Kumar, V.; Sharma, N. N.: Design and Validation of Silicon-on-Insulator Based U Shaped thermal Microactuator, Int. J. Materials, Mechanics and Manufacturing, Vol. 2, No. 1 (2014), p. 86-91.
[11] Cheng, Ming-Cheng et al.: A lilicon microspeaker for hearing instruments, J. Micro-mech. Microeng. 14 (2004), p. 859-866

The invention claimed is:

1. A MEMS transducer for interacting with a volume flow of a fluid, comprising:
a substrate which comprises a layer stack comprising a plurality of layers which form a plurality of substrate planes, the substrate comprising a cavity within the layer stack;
an electromechanical transducer connected to the substrate within the cavity and comprising an element which is deformable within at least one plane of movement of the plurality of substrate planes, deformation of the deformable element within the at least one plane of movement and the volume flow of the fluid being causally correlated;
an electronic circuit arranged within at least one layer of the layer stack, the electronic circuit being connected to the electromechanical transducer and being configured to provide a conversion between the deformation of the deformable element and an electric signal.

2. The MEMS transducer as claimed in claim 1, wherein the electronic circuit is configured to convert an electric control signal to a deflection of the deformable element or to convert the deformation of the deformable element to an electric output signal.

3. The MEMS transducer as claimed in claim 2, wherein the electronic circuit comprises at least one of a digital-to-analog converter for converting a digital version of the control signal to an analog version of the control signal, an analog-to-digital converter for converting an analog version of the electric output signal to a digital version of the electric output signal, a signal decoder, a processor, a semiconductor memory, a wireless communication interface for near-field communication, and a mobile radio interface.

4. The MEMS transducer as claimed in claim 2, wherein the electronic circuit is configured to convert the electric control signal to the deflection of the deformable element, and comprises a switching amplifier configured to provide a digital pulse-width modulated control signal for the deformable element.

5. The MEMS transducer as claimed in claim 2, wherein the deformable element is a first deformable element, the MEMS transducer comprising at least a second deformable element, the electronic circuit being configured to convert the electric control signal to a deflection of the first and second deformable elements or to convert deformations of the first and second deformable elements to the electric output signal.

6. The MEMS transducer as claimed in claim 1, wherein the deformable element is actively formed and is configured to interact with the volume flow; or a plate element connected to the deformable element is configured to be rigid and to interact with the volume flow.

7. The MEMS transducer as claimed in claim 1, wherein the layer which has the electronic circuit arranged therein is arranged along a direction perpendicular to the at least one plane of movement, wherein the layer is a lid layer and the cavity is closed partly or completely by the layer.

8. The MEMS transducer as claimed in claim 1, wherein the layer which has the electronic circuit arranged therein is electrically connected to an outer side of the MEMS transducer, or is the outer side of the MEMS transducer and may bois contacted to a lead assembly.

9. The MEMS transducer as claimed in claim 1, wherein the layer which has the electronic circuit arranged therein is a first lid layer, the electronic circuit being a first electronic circuit, and wherein a second electronic circuit is arranged in a second lid layer of the substrate.

10. The MEMS transducer as claimed in claim 9, wherein the deformable element is arranged between the first and second electronic circuits during deformation.

11. The MEMS transducer as claimed in claim 9, wherein the second electronic circuit is connected to the electromechanical transducer or to the first electronic circuit and is realized in complementary technology with respect to the electronic circuit, such that the first circuit or the second circuit is realized in MEMS technology and the other circuit is realized in CMOS technology.

12. The MEMS transducer as claimed in claim 1, wherein the layer stack comprises an adaptation layer comprising, at a first layer main side, a first electronic pattern comprising a first distance raster and comprising, at a second, oppositely located layer main side, a second electronic pattern comprising a second distance raster, the first electronic pattern and the second electronic pattern being connected to each other in the adaptation layer, wherein the adaptation layer is a layer of the layer stack enabling contacting with another component.

13. The MEMS transducer as claimed in claim 12, wherein the adaptation layer is a lid layer of the layer stack and has the electronic circuit at least partly arranged therein, or is a lid layer of the layer stack which is electrically configured as an adaptation layer exclusively.

14. The MEMS transducer as claimed in claim 1, wherein the layer which has the electronic circuit arranged therein comprises a functional element connected to the electronic circuit, the electronic circuit being configured to control or evaluate the functional element, wherein the functional element comprises at least one of a sensor, an actuator, a wireless communication interface, a light source, a memory component and a navigation receiver.

15. The MEMS transducer as claimed in claim 1, wherein the layer which has the electronic circuit arranged therein is a first lid layer, the electronic circuit being a first electronic circuit, and wherein a second electronic circuit and a functional element are arranged in a second lid layer of the substrate, the second electronic circuit being connected to the functional element and configured to control or evaluate the functional element, wherein the functional element comprises at least one of a sensor, an actuator, a wireless communication interface, a light source, a memory component, a processor and a navigation receiver.

16. The MEMS transducer as claimed in claim 14, wherein the functional element comprises at least an inertial sensor, a magnetometer, a temperature sensor, a humidity sensor, a gas sensor or a combination thereof.

17. The MEMS transducer as claimed in claim 16, wherein the functional element comprises at least one of a MEMS sensor and a MEMS actuator.

18. The MEMS transducer as claimed in claim 17, wherein the electronic circuit is arranged in a lid layer of the substrate, and wherein, in addition, a gas-sensing functional element is arranged in the lid layer, the lid layer comprising an opening configured to allow the fluid flow to pass, the gas-sensing functional element being configured to sensorically interact with the fluid flow.

19. The MEMS transducer as claimed in claim 18, wherein the opening is encompassed by the gas-sensing functional element in the lid layer.

20. The MEMS transducer as claimed in claim 18, wherein the gas-sensing functional element at least partly projects into the opening.

21. The MEMS transducer as claimed in claim 1, wherein a first layer which has the electronic circuit arranged therein is a first substrate layer, and wherein the electronic circuit is partly arranged in an adjacent second substrate layer.

22. The MEMS transducer as claimed in claim 1, wherein the electronic circuit is arranged along a direction perpendicular to the at least one plane of movement, and a location of the electronic circuit, when said location is projected into the at least one plane of movement, corresponds to a location where the deformable element is at least partly located during deformation.

23. The MEMS transducer as claimed in claim 1, wherein the electromechanical transducer is configured to cause a movement of the fluid within the cavity in response to electrical controlling of the electronic circuit, and/or to causally provide an electric signal to the electronic circuit in response to the movement of the fluid within the cavity.

24. The MEMS transducer as claimed in claim 1, comprising a plurality of electromechanical transducers, which include first and second deformable elements each comprising a beam structure configured to curve along an axial direction of the beam structure wherein a first partial cavity adjoining an opening of the substrate is arranged between the beam structures of the first deformable element and the second deformable element.

25. The MEMS transducer as claimed in claim 1, comprising a multitude of electromechanical transducers connected to the substrate and each comprising an element deformable along a lateral direction of movement,
wherein a first partial cavity being is arranged between a first electromechanical transducer and a second electromechanical transducer of the multitude of electromechanical transducers, and a second partial cavity is arranged between the second electromechanical transducer and a third electromechanical transducer of the multitude of electromechanical transducers.

26. The MEMS transducer as claimed in claim 25, wherein the first and the second electromechanical transducers are configured to change a volume of the first partial cavity at a first frequency, the first and the third electromechanical transducers being configured to change a volume of the second partial cavity at a second frequency.

27. The MEMS transducer as claimed in claim 25, wherein the substrate comprises a multitude of openings connected to a multitude of partial cavities of the cavity, a volume of each partial cavity being influenced by a deflection state of at least one element deformable along the lateral direction of movement, two adjacent partial volumes of partial cavities being able to be increased or decreased in a complementary manner during a first or second time interval.

28. The MEMS transducer as claimed in claim 25, wherein the deformable elements of the first electromechanical transducer, of the second electromechanical transducer and of the third electromechanical transducer each comprise a beam actuator comprising a first and a second end in each case, the beam actuator of the first electromechanical transducer being connected to the substrate at the first end and at the second end, the beam actuator of the second electromechanical transducer or of the third electromechanical transducer being connected to the substrate in a central region of the beam actuator.

29. The MEMS transducer as claimed in claim 25, wherein the substrate comprises a multitude of openings connected to a multitude of partial cavities of the cavity, a volume of each partial cavity being influenced by a deflection state of at least one element deformable along the lateral direction of movement, wherein values of sound pressure levels acquired on a basis of deformation of the deformable elements and on a basis of the partial cavities exhibit a correlation with a frequency of the volume flow flowing out from or into the respective partial cavity, which correlation is depicted as a function the frequency of the volume flow describing a frequency-dependent progress of a pressure within the fluid.

30. The MEMS transducer as claimed in claim 1, wherein the electromechanical transducer comprises a plurality of deformable elements at least indirectly connected in an axial direction of the electromechanical transducer, said deformable elements being configured to influence a volume of first and second partial cavity portions, respectively.

31. The MEMS transducer as claimed in claim 30, wherein the electromechanical transducer is configured to cause a movement of the fluid within the first and second partial cavity portions in response to electrical controlling, the deformable elements being configured to change the volumes of the first and second partial cavity portions at different frequencies.

32. The MEMS transducer as claimed in claim 1, wherein the deformable element is arranged in a non-contact manner with a layer of the substrate which defines the cavity in parallel with the at least one plane of movement, or wherein a low-friction layer is arranged between the deformable element and the layer defining the cavity in parallel with the at least one plane of movement.

33. The MEMS transducer as claimed in claim 1, wherein the deformable element is configured as a bimorph which comprises an actuation direction along which the deformable element is deflectable by applying an electric voltage.

34. The MEMS transducer as claimed in claim 33, wherein the deformable element comprises first, second and third beam segments arranged along the axial direction in this order and each comprising opposite actuation directions.

35. The MEMS transducer as claimed in claim 34, wherein the electromechanical transducer comprises first and second deformable elements, an outer beam segment of the first deformable element and an outer beam segment of the second deformable element being at least indirectly connected to each other.

36. The MEMS transducer as claimed in claim 1, wherein the substrate comprises an anchor element;
wherein the deformable element is connected to the anchor element in a central region of an axial extension direction of the deformable element; or
wherein the deformable element is connected to a further deformable element at an outer beam segment via the anchor element.

37. The MEMS transducer as claimed in claim 1, wherein the deformable element comprises a beam structure, the beam structure being fixedly clamped at first and second ends.

38. The MEMS transducer as claimed in claim 1, wherein the cavity comprises an opening in the substrate which is arranged perpendicularly to a lateral direction of movement, so that the volume flow flows out of or into the cavity on a basis of the deformation of the deformable element in a manner that is perpendicular to the lateral direction of movement.

39. The MEMS transducer as claimed in claim 1, wherein the deformable element is arranged adjacently to an opening.

40. The MEMS transducer as claimed in claim 1, wherein the MEMS transducer is configured as one of a MEMS pump, a MEMS loudspeaker, a MEMS microphone, a MEMS valve, and a MEMS dosage system.

41. A device comprising a MEMS transducer as claimed in claim 1, wherein the MEMS transducer is configured as a MEMS loudspeaker, the device being configured as a mobile music reproduction device or as headphones.

42. A system comprising a MEMS transducer as claimed in claim 1, wherein the MEMS transducer is configured as a loudspeaker and is designed to reproduce an acoustic signal on a basis of an output signal.

43. The system as claimed in claim 42, wherein the system is configured as a universal translator or as a navigation assistance system.

44. A health assistance system comprising:
a sensor for sensing a vital function of a body and for outputting a sensor signal on a basis of the sensed vital function;
a processor for processing the sensor signal and for providing an output signal on a basis of said processing; and
headphones comprising the MEMS transducer as claimed in claim 1, the MEMS transducer being configured as a loudspeaker and comprising a wireless communication interface for receiving the output signal, and being configured to reproduce an acoustic signal on a basis thereof.

45. The health assistance system as claimed in claim 44, wherein the headphones are formed as in-ear headphones.

46. A method of providing a MEMS transducer for interacting with a volume flow of a fluid, comprising:
providing a substrate which comprises a layer stack comprising a plurality of layers which form a plurality of substrate planes;
producing a cavity in the layer stack and an electromechanical transducer within the substrate, so that the electromechanical transducer is connected to the substrate within the cavity and comprises an element which is deformable within at least one plane of movement of the plurality of substrate planes, deformation of the deformable element within the at least one plane of movement and the volume flow of the fluid being causally correlated; and
arranging an electronic circuit within at least one layer of the layer stack, so that the electronic circuit is connected to the electromechanical transducer and is configured to provide a conversion between the deformation of the deformable element and an electric signal.

* * * * *

UNITED STATES PATENT AND TRADEMARK OFFICE
CERTIFICATE OF CORRECTION

PATENT NO. : 11,554,950 B2  
APPLICATION NO. : 16/658461  
DATED : January 17, 2023  
INVENTOR(S) : Harald Schenk Page 1 of 1

It is certified that error appears in the above-identified patent and that said Letters Patent is hereby corrected as shown below:

In the Claims

Claim 8, Column 67, Lines 9 - 10:  
… MEMS transducer and may bois contacted to a…  
Should be:  
… MEMS transducer and is contacted to a…

Signed and Sealed this  
Fourth Day of July, 2023

Katherine Kelly Vidal  
*Director of the United States Patent and Trademark Office*